(12) United States Patent
Kanakamedala et al.

(10) Patent No.: US 10,461,163 B2
(45) Date of Patent: Oct. 29, 2019

(54) THREE-DIMENSIONAL MEMORY DEVICE WITH THICKENED WORD LINES IN TERRACE REGION AND METHOD OF MAKING THEREOF

(71) Applicant: SANDISK TECHNOLOGIES LLC, Plano, TX (US)

(72) Inventors: Senaka Krishna Kanakamedala, San Jose, CA (US); Yoshihiro Kanno, Yokkaichi (JP); Raghuveer S. Makala, Campbell, CA (US); Yanli Zhang, San Jose, CA (US); Jin Liu, San Jose, CA (US); Murshed Chowdhury, Fremont, CA (US); Yao-Sheng Lee, Tampa, FL (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/813,579

(22) Filed: Nov. 15, 2017

(65) Prior Publication Data
US 2019/0148506 A1 May 16, 2019

(51) Int. Cl.
*H01L 29/423* (2006.01)
*H01L 27/11556* (2017.01)
(Continued)

(52) U.S. Cl.
CPC .... *H01L 29/42372* (2013.01); *H01L 23/5226* (2013.01); *H01L 27/11556* (2013.01);
(Continued)

(58) Field of Classification Search
CPC ........... H01L 29/42372; H01L 23/5226; H01L 29/6656; H01L 29/66833; H01L 29/4958;
(Continued)

(56) References Cited

U.S. PATENT DOCUMENTS

| 5,915,167 A | 6/1999 | Leedy | |
| 8,245,962 B2 * | 8/2012 | Didion | B02C 17/002 241/74 |

(Continued)

FOREIGN PATENT DOCUMENTS

| KR | 20170083948 A | 7/2017 |
| WO | WO2014130413 A1 | 8/2014 |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — John P. Dulka
(74) *Attorney, Agent, or Firm* — The Marbury Law Group PLLC

(57) ABSTRACT

A three-dimensional memory device includes an alternating stack of insulating layers and electrically conductive layers located over a substrate. Memory stack structures are located in a memory array region, each of which includes a memory film and a vertical semiconductor channel. Contact via structures located in the terrace region and contact a respective one of the electrically conductive layers. Each of the electrically conductive layers has a respective first thickness throughout the memory array region and includes a contact portion having a respective second thickness that is greater than the respective first thickness within a terrace region. The greater thickness of the contact portion prevents an etch-through during formation of contact via cavities for forming the contact via structures.

21 Claims, 59 Drawing Sheets

(51) Int. Cl.

| | | |
|---|---|---|
| *H01L 27/11582* | (2017.01) | |
| *H01L 29/49* | (2006.01) | |
| *H01L 29/66* | (2006.01) | |
| *H01L 23/522* | (2006.01) | |

(52) U.S. Cl.
CPC .... *H01L 27/11582* (2013.01); *H01L 29/4958* (2013.01); *H01L 29/6656* (2013.01); *H01L 29/66825* (2013.01); *H01L 29/66833* (2013.01)

(58) Field of Classification Search
CPC ......... H01L 27/11582; H01L 27/11556; H01L 29/66825
See application file for complete search history.

(56) References Cited

U.S. PATENT DOCUMENTS

| | | | |
|---|---|---|---|
| 8,349,681 | B2 | 1/2013 | Alsmeier et al. |
| 8,709,894 | B2 | 4/2014 | Lee et al. |
| 8,987,805 | B2 | 3/2015 | Nam et al. |
| 9,023,719 | B2 | 5/2015 | Pachamuthu et al. |
| 9,136,130 | B1 | 9/2015 | Wada et al. |
| 9,230,974 | B1 | 1/2016 | Pachamuthu et al. |
| 9,230,979 | B1 | 1/2016 | Pachamuthu et al. |
| 9,236,396 | B1 | 1/2016 | Koka et al. |
| 9,305,849 | B1 | 4/2016 | Tsutsumi et al. |
| 9,305,932 | B2 | 4/2016 | Kanakamedala et al. |
| 9,305,937 | B1 | 4/2016 | Tsutsumi et al. |
| 9,356,031 | B2 | 5/2016 | Lee et al. |
| 9,379,132 | B2 | 6/2016 | Koka et al. |
| 9,530,785 | B1 | 12/2016 | Koka et al. |
| 9,530,790 | B1* | 12/2016 | Lu ................... H01L 27/11582 |
| 9,601,508 | B2 | 3/2017 | Sel et al. |
| 9,685,452 | B2* | 6/2017 | Lee ................... H01L 27/11582 |
| 9,716,105 | B1 | 7/2017 | Tsutsumi |
| 10,115,730 | B1* | 10/2018 | Baraskar ........... H01L 27/11582 |
| 2011/0001178 | A1 | 1/2011 | Iwase et al. |
| 2012/0001252 | A1 | 1/2012 | Alsmeier et al. |
| 2012/0001264 | A1 | 1/2012 | Kim et al. |
| 2012/0299076 | A1 | 11/2012 | Yoo et al. |
| 2013/0065386 | A1* | 3/2013 | Kim ................... H01L 29/7926 438/591 |
| 2014/0054676 | A1 | 2/2014 | Nam et al. |
| 2014/0284695 | A1 | 9/2014 | Won et al. |
| 2014/0353738 | A1 | 12/2014 | Makala et al. |
| 2015/0008505 | A1 | 1/2015 | Chien et al. |
| 2015/0076584 | A1 | 3/2015 | Pachamuthu et al. |
| 2015/0179660 | A1 | 6/2015 | Yada et al. |
| 2015/0179662 | A1 | 6/2015 | Makala et al. |
| 2016/0035742 | A1 | 2/2016 | Kanakamedala et al. |
| 2016/0064532 | A1 | 3/2016 | Makala et al. |
| 2016/0071861 | A1 | 3/2016 | Serov et al. |
| 2016/0086972 | A1 | 3/2016 | Zhang et al. |
| 2016/0093626 | A1 | 3/2016 | Izumi et al. |
| 2016/0111438 | A1 | 4/2016 | Tsutsumi et al. |
| 2016/0172366 | A1* | 6/2016 | Koka ................... H01L 29/7883 257/314 |
| 2016/0172370 | A1 | 6/2016 | Makala et al. |
| 2016/0211272 | A1 | 7/2016 | Koka et al. |
| 2016/0365351 | A1 | 12/2016 | Nishikawa et al. |
| 2017/0243650 | A1 | 8/2017 | Ogawa et al. |
| 2017/0278860 | A1* | 9/2017 | Aoyama ........... H01L 27/11582 |
| 2018/0108671 | A1* | 4/2018 | Yu ................... H01L 27/11575 |
| 2018/0130812 | A1* | 5/2018 | Hosoda ............. H01L 27/11556 |
| 2018/0197876 | A1* | 7/2018 | Ge ................... H01L 27/11582 |

FOREIGN PATENT DOCUMENTS

| | | |
|---|---|---|
| WO | WO2016170759 A1 | 10/2016 |
| WO | WO2017-034709 A1 | 3/2017 |

OTHER PUBLICATIONS

Chen, R. et al., "Chemistry for Positive Pattern Transfer Using Area-Selective Atomic Layer Deposition," Advanced Materials, vol. 18, pp. 1086-1090, (2006).
Moshe, H. et al., "Atomic Layer Deposition on Self-Assembled Monolayers," Materials Science—Advanced Topics, Chapter 3, pp. 63-84, (2013).
Spencer, D. F., NNUN Workshop on Electron Beam Lithography for Nanostructure Fabrication, Presentation Titles, "Resist & Resist Processing," Cornell Nanofabrication Facility, Cornell University, Ithaca, NY, 15 pages, (Jan. 14-15, 2002).
Dumas, P. et al., "Electron-Energy-Loss Characterization of the H-Terminated Si(111) and Si(100) Surfaces Obtained by Etching in $NH_4F$," Chemical Physics Letters, vol. 181, No. 6, pp. 537-543, (1991).
Kobayashi, N. P. et al., "Two-Stage Atomic Layer Deposition of Smooth Aluminum Oxide on Hydrophobic Self-Assembled Monolayers," Engineering Letters, vol. 16, No. 2, 6 pages, (2008).
Wang, M. et al., "Self-Assembled Silane Monolayers: Fabrication with Nanoscale Uniformity," Langmuir, vol. 21, pp. 1848-4857, (2005).
Dong, W. et al., "Application of Three-Dimensionally Area-Selective Atomic Layer Deposition for Selective Coating the Vertical Surfaces of Standing Nanopillars," Scientific Reports, vol. 4, pp. 1-4, (2014).
Sung, M. M. et al., "Formation of Alkylsiloxane Self-Assembled Monolayers on $Si_3N_4$," J. Vac. Sci. Technol. A, vol. 17, No. 2, pp. 540-544, (1999).
Knez, M. et al., "Synthesis and Surface Engineering of Complex Nanostructures by Atomic Layer Deposition," Adv. Mater., vol. 19, pp. 3425-3438, (2007).
Li, M., "Modification of Silicon by Self-Assembled Monolayers for Application in Nano-Electronics and Biology," Dissertation Submitted to the Graduate School—New Brunswick, Rutgers, The State University of New Jersey for Degree of Doctor of Philosophy, 195 pages, (2007).
Invitation to Pay Additional Fees and Communication Relating to the Results of the Partial International Search for PCT/US2015/053841, 9 pages, dated Dec. 21, 2015.
International Search Report and Written Opinion of International Searching Authority for PCT/US2015/053841, 19 pages, dated Feb. 24, 2016.
International Search Report and Written Opinion from the International Search Authority for International Patent Application No. PCT/US2017/034172; dated Aug. 14, 2017, 15 pages.
Yokoyama, S. et al., "Low-Temperature Selective Deposition of Silicon on Silicon Nitride by Time-Modulated Disilane Flow and Formation of Silicon Narrow Wires," Applied Physics Letters, vol. 79, No. 4, pp. 494-496, (2001).
Yokoyama, S. et al., "Atomic-Layer Selective Deposition of Silicon Nitride on Hydrogen-Terminated Si surfaces," Applied Surface Science, vols. 130-132, pp. 352-356, (Abstract Only) (1998).
U.S. Appl. No. 15/354,795, filed Nov. 17, 2016, SanDisk Technologies LLC.
U.S. Appl. No. 15/496,359, filed Apr. 25, 2017, SanDisk Technologies LLC.
U.S. Appl. No. 15/813,625, filed Nov. 15, 2017, SanDisk Technologies LLC.
International Search Report and Written Opinion of the International Searching Authority for International Patent Application No. PCT/US2018/052227, dated Feb. 18, 2019, 10 pages.
USPTO Office Communication, Non-Final Office Action for U.S. Appl. No. 15/813,625, dated Apr. 8, 2019, 26 pages.

* cited by examiner

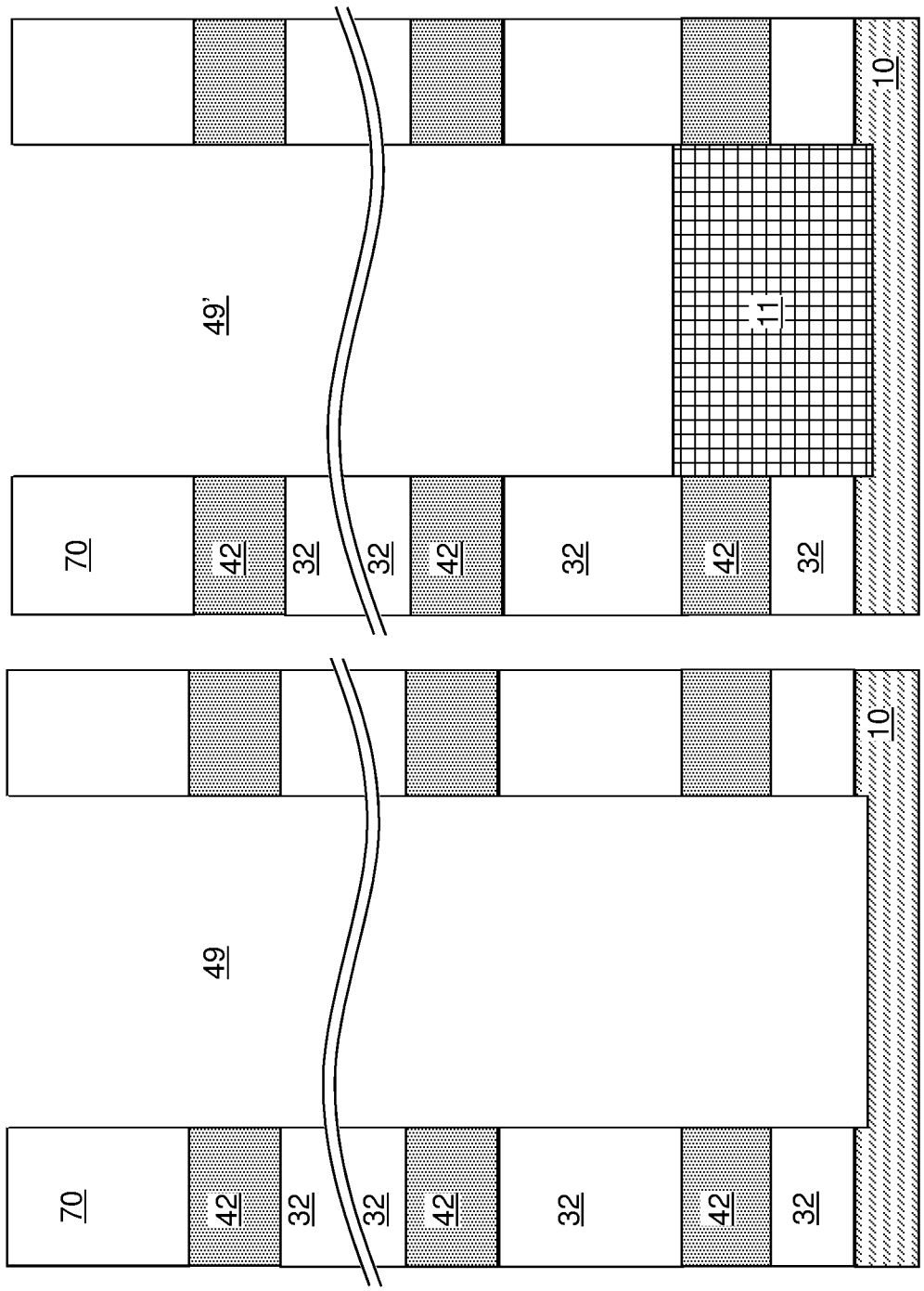

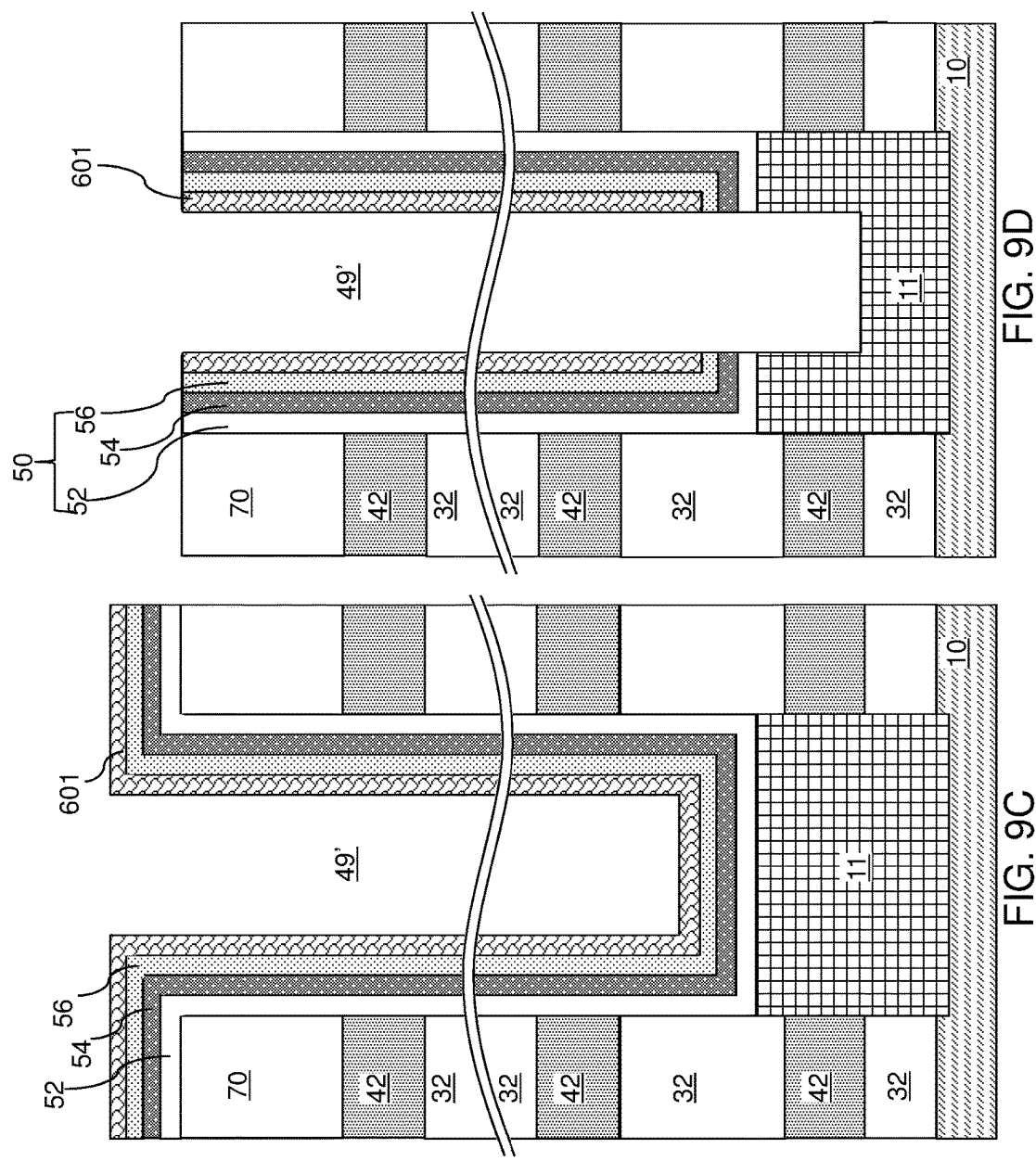

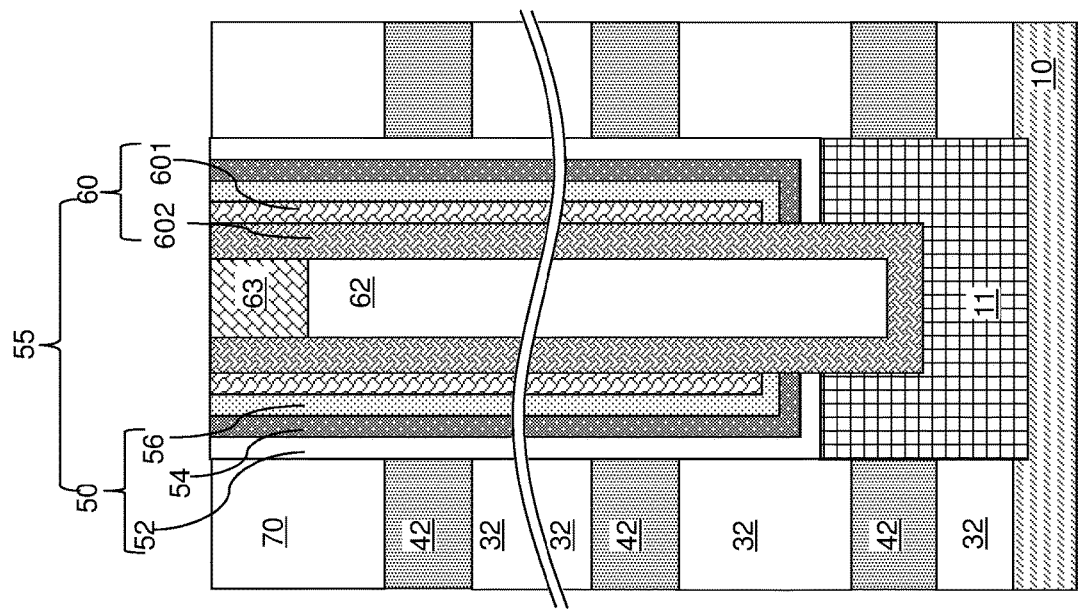
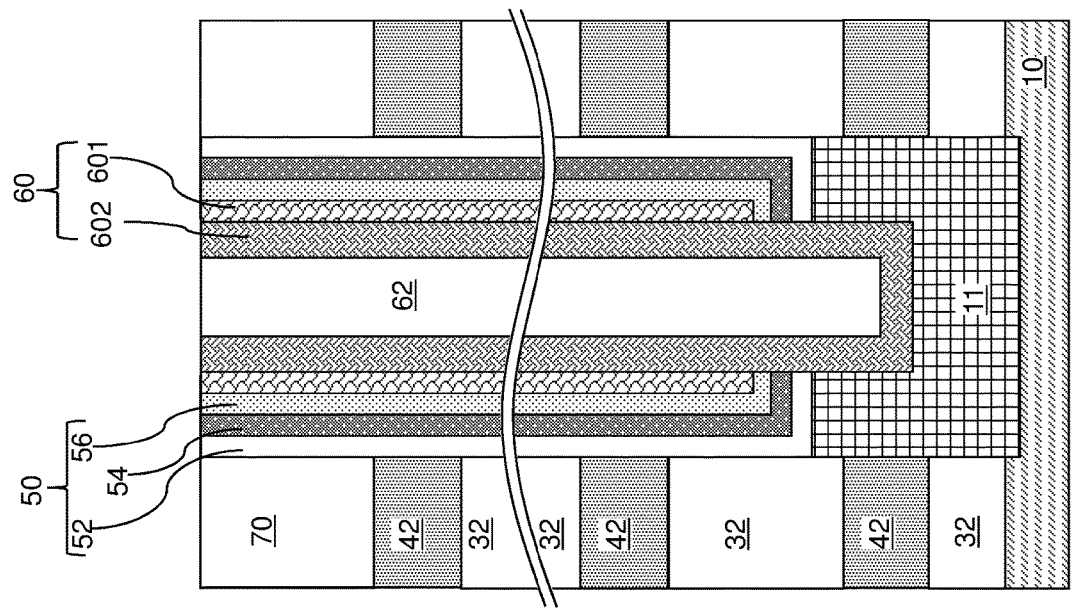

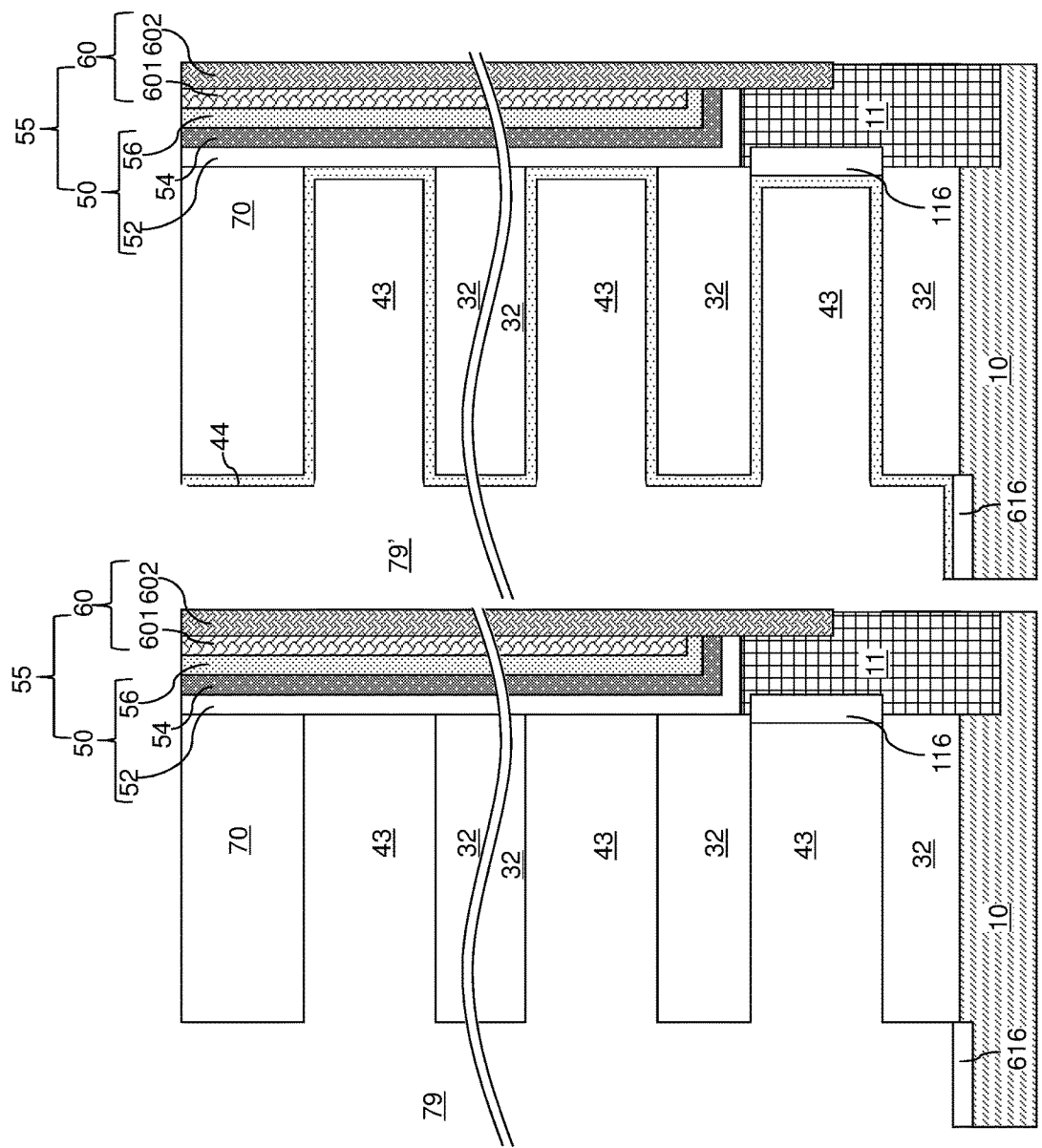

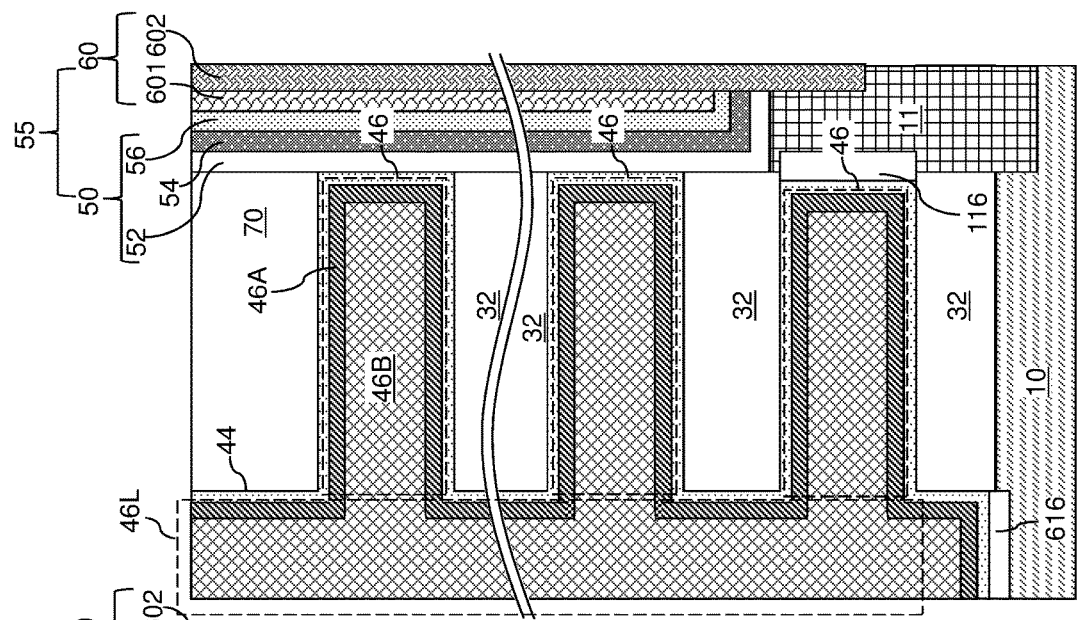
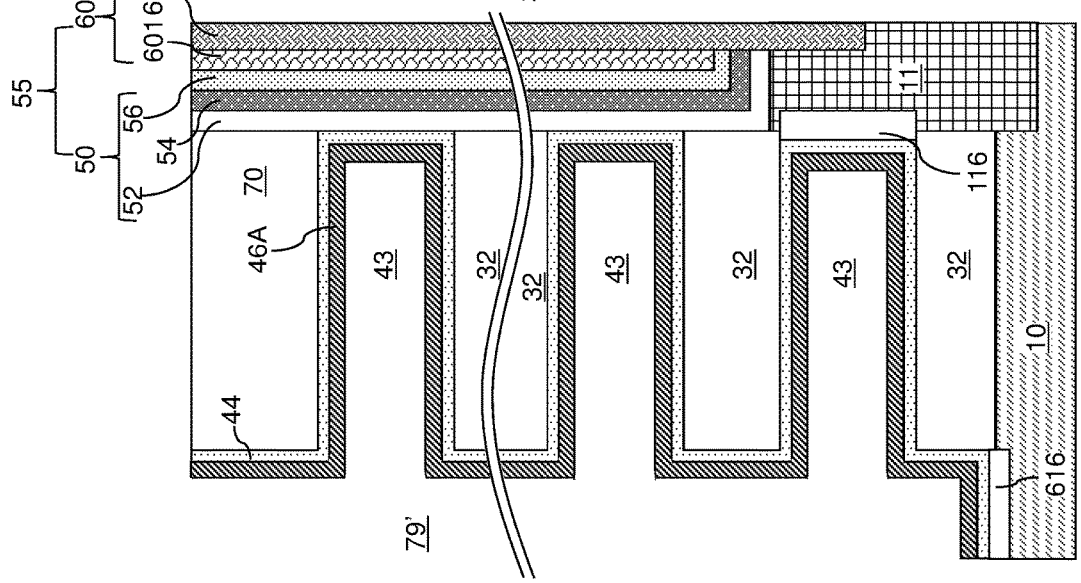
FIG. 13D
FIG. 13C

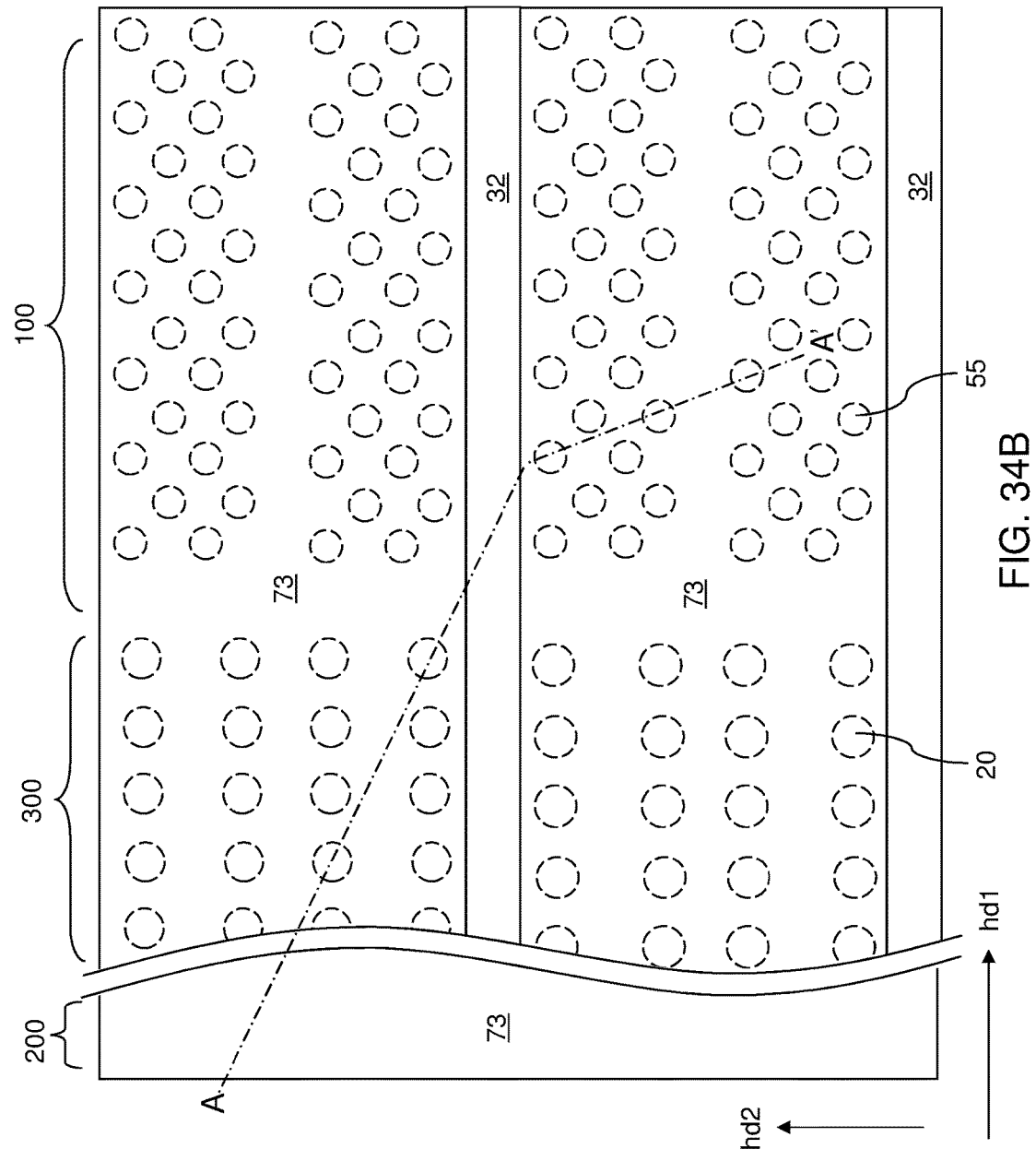

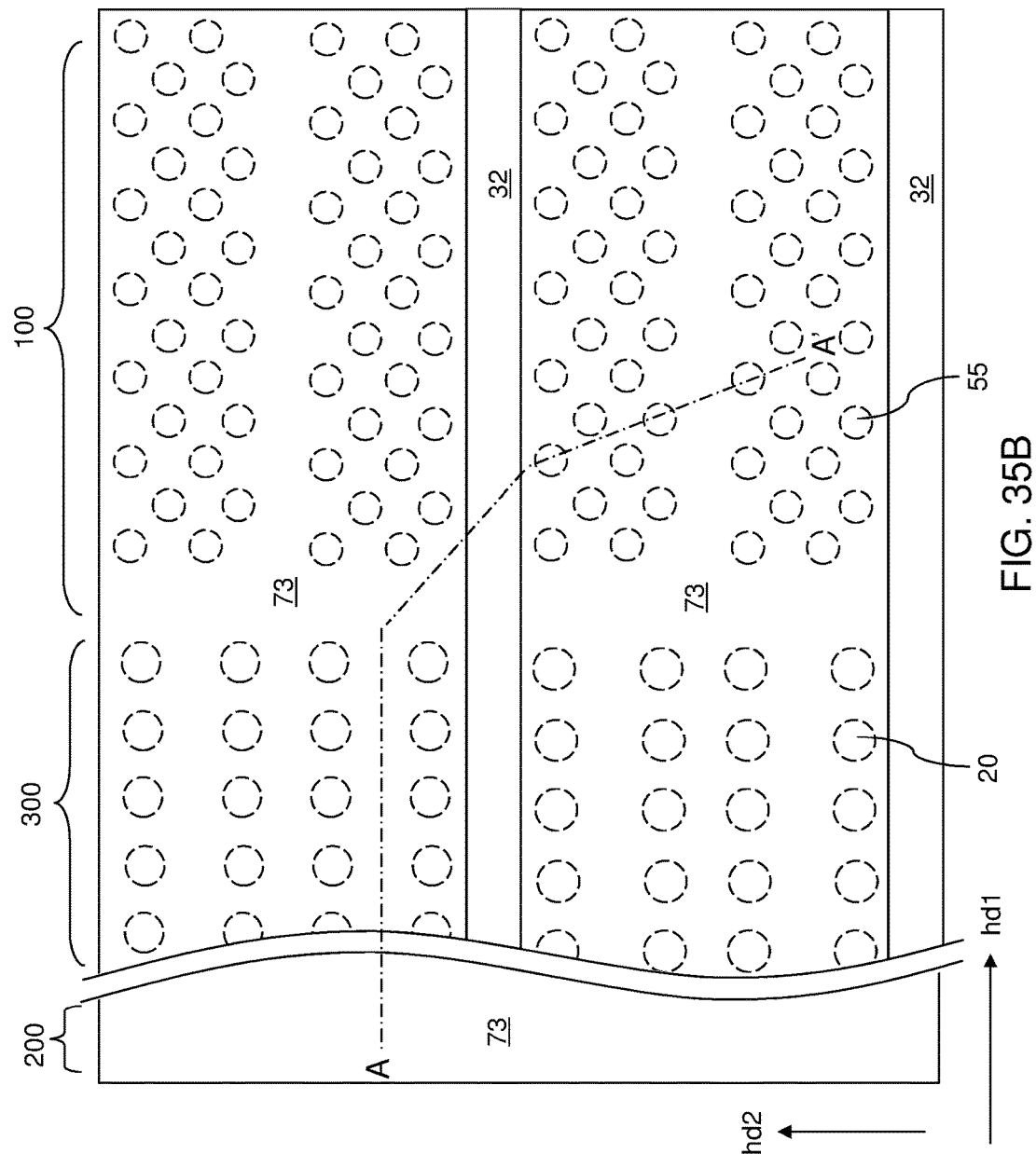

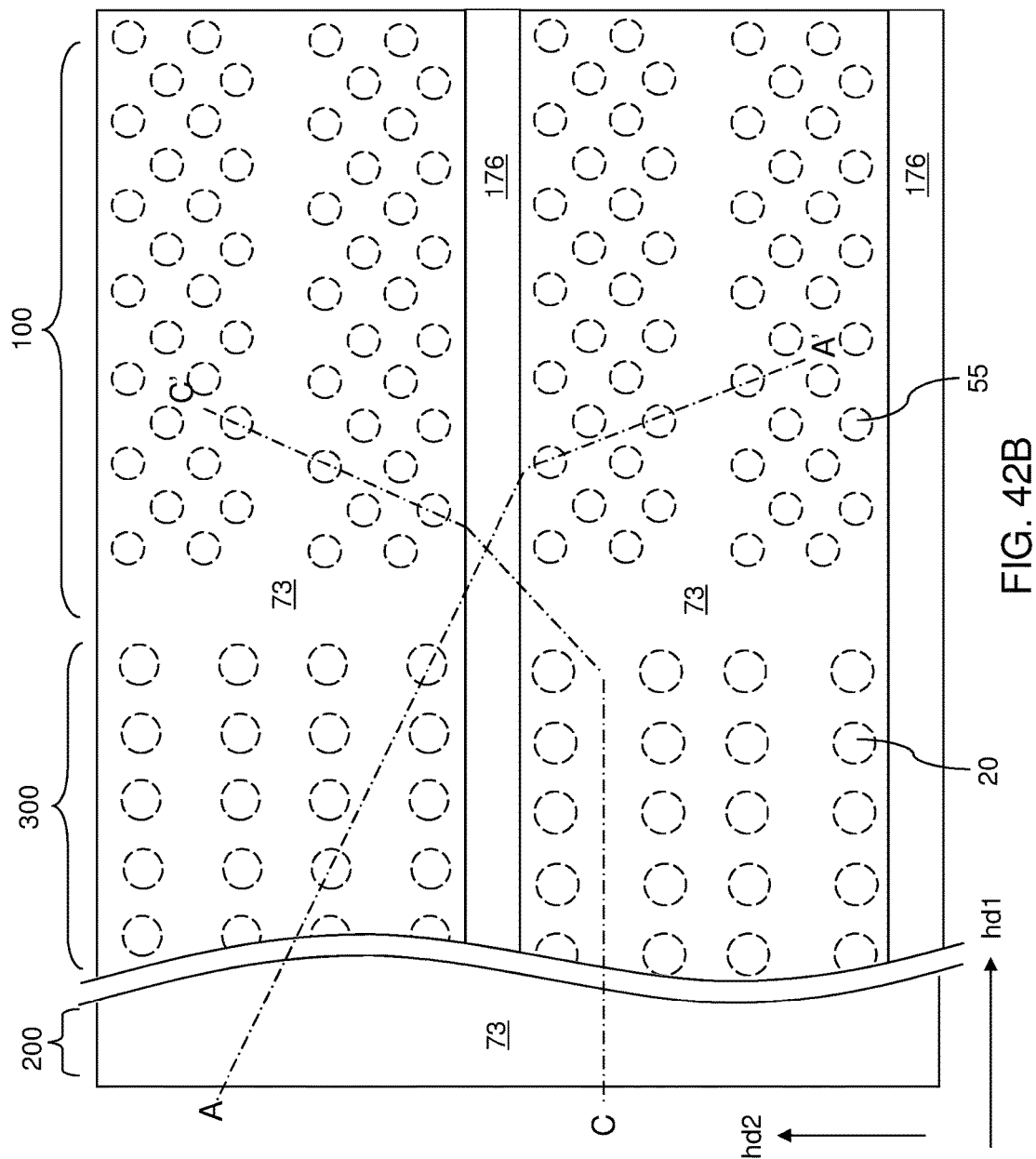

THREE-DIMENSIONAL MEMORY DEVICE WITH THICKENED WORD LINES IN TERRACE REGION AND METHOD OF MAKING THEREOF

RELATED APPLICATIONS

The instant application is related to application Ser. No. 15/813,625, which is assigned to a same assignee and filed on the same day as the instant application, and the entire contents of which are incorporated herein by reference.

FIELD

The present disclosure relates generally to the field of semiconductor devices, and particular to a three-dimensional memory device employing thickened word line in a terrace region and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises an alternating stack of insulating layers and electrically conductive layers located over a substrate, wherein each of the electrically conductive layers has a respective first thickness in a memory array region and a respective second thickness that is greater than the respective first thickness in a stepped terrace region, memory stack structures located in the memory array region and vertically extending through the alternating stack, wherein each of the memory stack structures comprises a memory film and a vertical semiconductor channel, and contact via structures located in the terrace region and contacting a respective one of the electrically conductive layers.

According to another aspect of the present disclosure, a method of forming a three-dimensional memory device is provided, which comprises forming an alternating stack of insulating layers and sacrificial material layers over a substrate, wherein the alternating stack includes a memory array region in which each of the sacrificial material layers is present and a terrace region in which the sacrificial material layers have a respective lateral extent that decreases as a function of a vertical distance from the substrate, forming self-aligned material portions on physically exposed surfaces of the sacrificial material layers in the terrace region employing a selective deposition process in which a material selectively grows from the physically exposed surfaces of the sacrificial material layers, forming memory stack structures through the alternating stack in the memory array region, wherein each of the memory stack structures comprises a memory film and a vertical semiconductor channel, replacing at least the sacrificial material layers with conductive material layers, and forming contact via structures that contact a respective one of the conductive material layers.

According to yet another aspect of the present disclosure, a three-dimensional memory device is provided, which comprises: an alternating stack of insulating layers and electrically conductive layers comprising a doped semiconductor material located over a substrate, wherein the alternating stack includes a memory array region in which each of the electrically conductive layers is present and a terrace region in which the electrically conductive layers have a respective lateral extent that decreases as a function of a vertical distance from the substrate; memory stack structures located in the memory array region and vertically extending through the alternating stack, wherein each of the memory stack structures comprises a memory film and a vertical semiconductor channel; and contact via structures located in the terrace region and contacting a respective one of the electrically conductive layers. Each of the electrically conductive layers has a respective first thickness throughout the memory array region and includes a contact portion having a respective second thickness that is greater than the respective first thickness within the terrace region.

According to still another aspect of the present disclosure, a method of forming a three-dimensional memory device is provided, which comprises the steps of: forming an alternating stack of insulating layers and semiconductor material layers over a substrate, wherein the alternating stack includes a memory array region in which each of the semiconductor material layers is present and a terrace region in which the semiconductor material layers have a respective lateral extent that decreases as a function of a vertical distance from the substrate; forming self-aligned semiconductor material portions on physically exposed surfaces of the semiconductor material layers in the terrace region employing a selective semiconductor deposition process in which a semiconductor material grows from the physically exposed surfaces of the semiconductor material layers and does not grow from surfaces of the insulating layers; forming a retro-stepped dielectric material portion including a stepped bottom surface on the self-aligned semiconductor material portions; forming memory stack structures through the alternating stack in the memory array region, wherein each of the memory stack structures comprises a memory film and a vertical semiconductor channel; and forming contact via structures through the retro-stepped dielectric material portion.

BRIEF DESCRIPTION OF THE DRAWINGS

FIGS. 9A-9H are sequential schematic vertical cross-sectional views of a memory opening within the first exemplary structure up to the processing step of deposition of a second semiconductor channel layer according to the first embodiment of the present disclosure.

FIGS. 13A-13D are sequential vertical cross-sectional views of a region of the first exemplary structure during formation of electrically conductive layers according to the first embodiment of the present disclosure.

FIG. 34B is a top-down view of the fifth exemplary structure of FIG. 34A. The vertical plane A-A' is the plane of the schematic vertical cross-sectional view of FIG. 34A.

FIG. 35B is a top-down view of the fifth exemplary structure of FIG. 35A. The vertical plane A-A' is the plane of the schematic vertical cross-sectional view of FIG. 35A.

FIG. 42B is a top-down view of the sixth exemplary structure of FIG. 42A. The vertical plane A-A' is the plane of the schematic vertical cross-sectional view of FIG. 42A.

DETAILED DESCRIPTION

Figure 1:
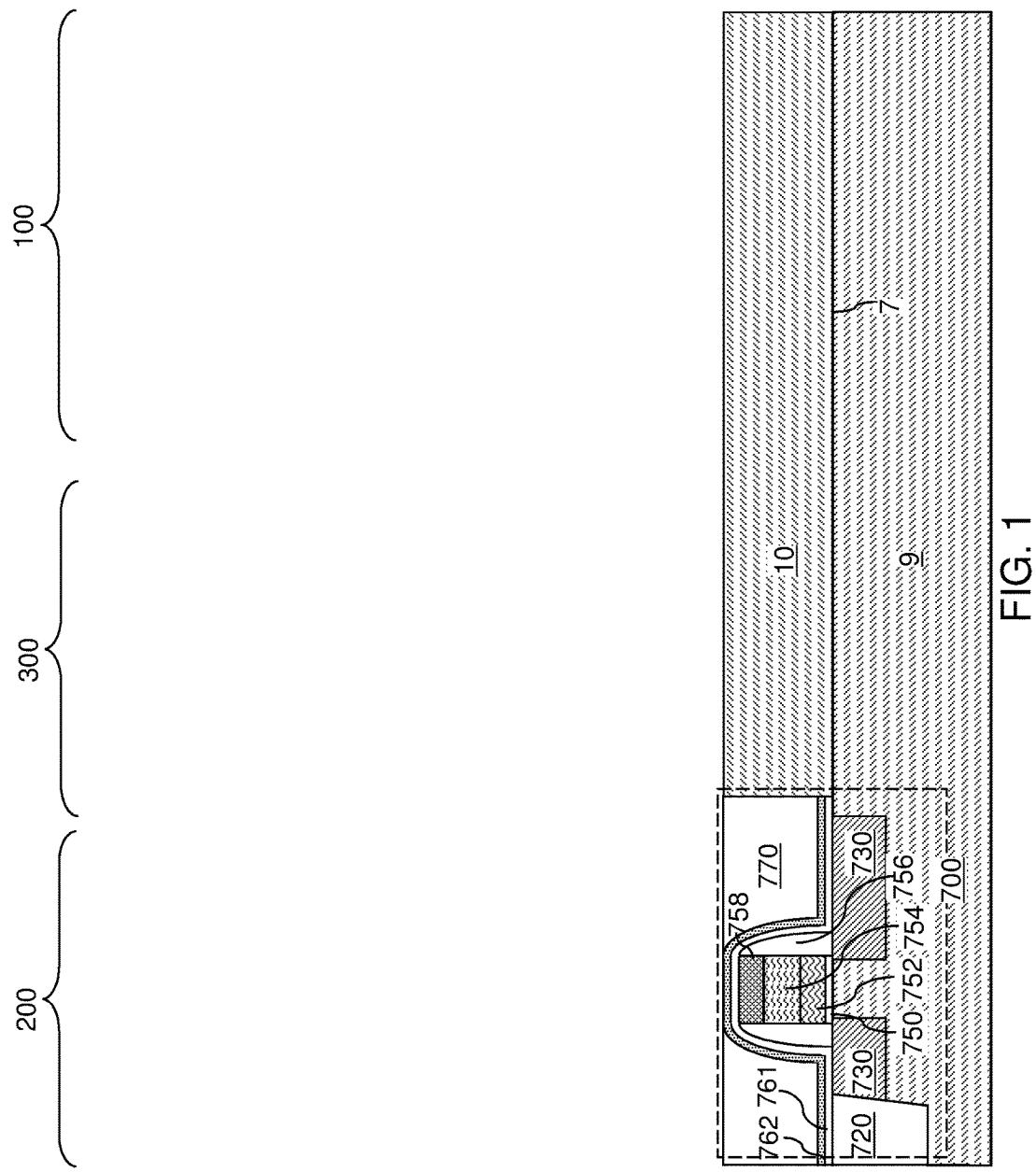
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to a three-dimensional memory device employing thickened word lines in a terrace region and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment, the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
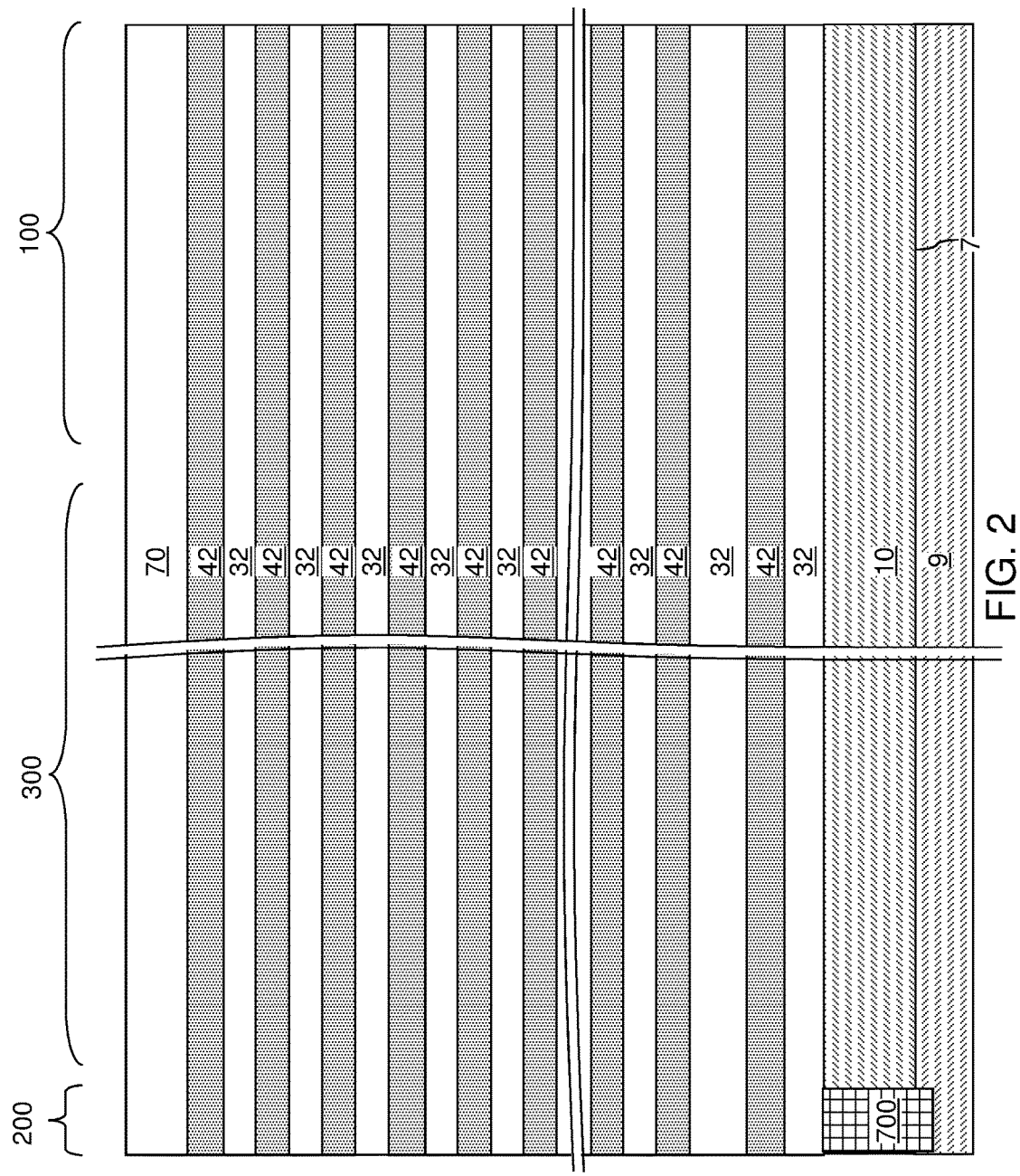
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In the first embodiment, the sacrificial material layers 42 can be spacer material layers that comprise silicon nitride, and can consist essentially of silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
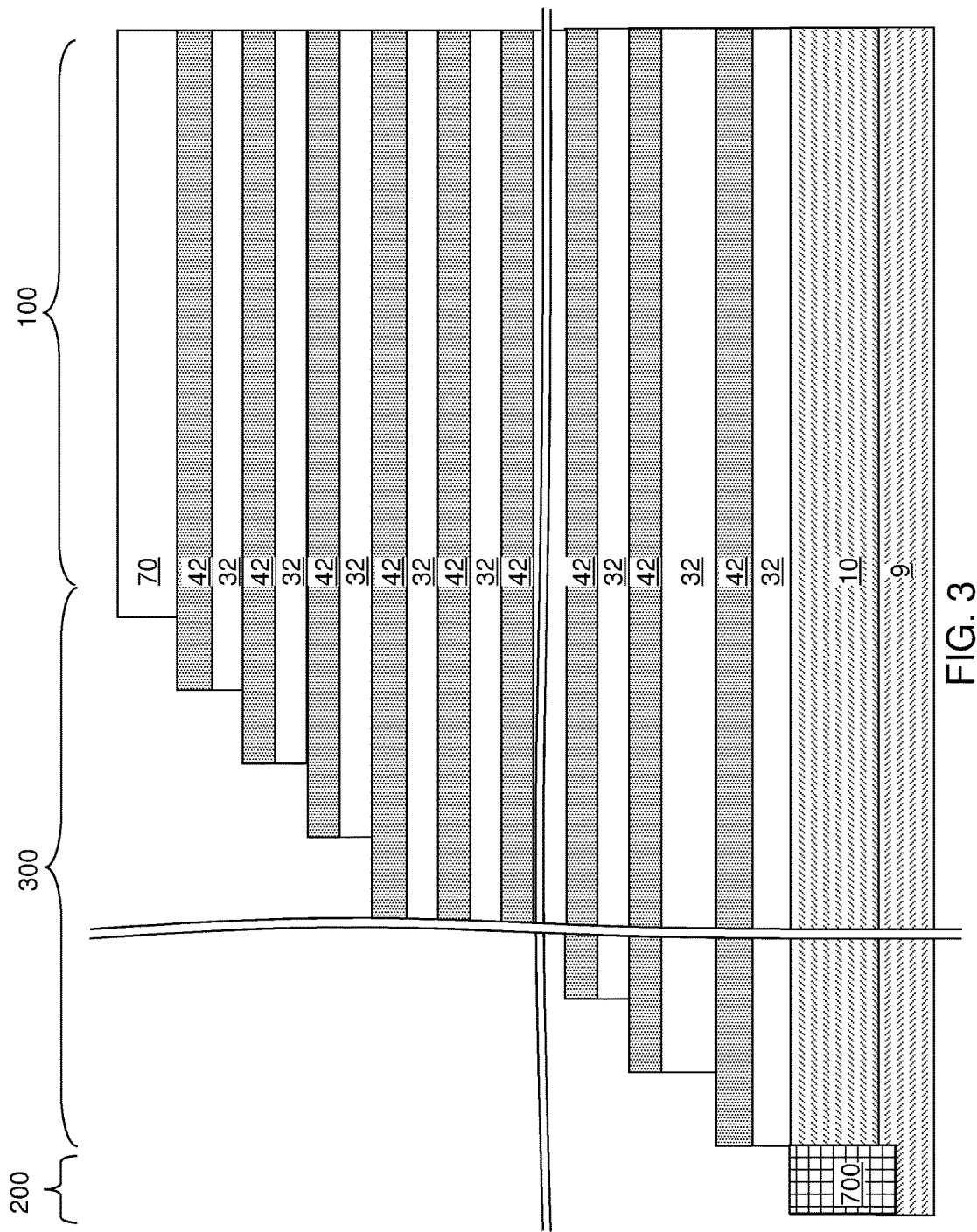
FIG. 3 is a schematic vertical cross-sectional view of the first exemplary structure after formation of stepped terraces according to the first embodiment of the present disclosure.

Referring to FIG. 3, a stepped cavity can be formed within the contact region 300 which is located between the memory array region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed within the contact region 300 by formation of the stepped cavity. Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42). The sacrificial material layers 42 have a respective lateral extent that decreases as a function of a vertical distance from the substrate (9, 10) in the terrace region.

Figure 4:
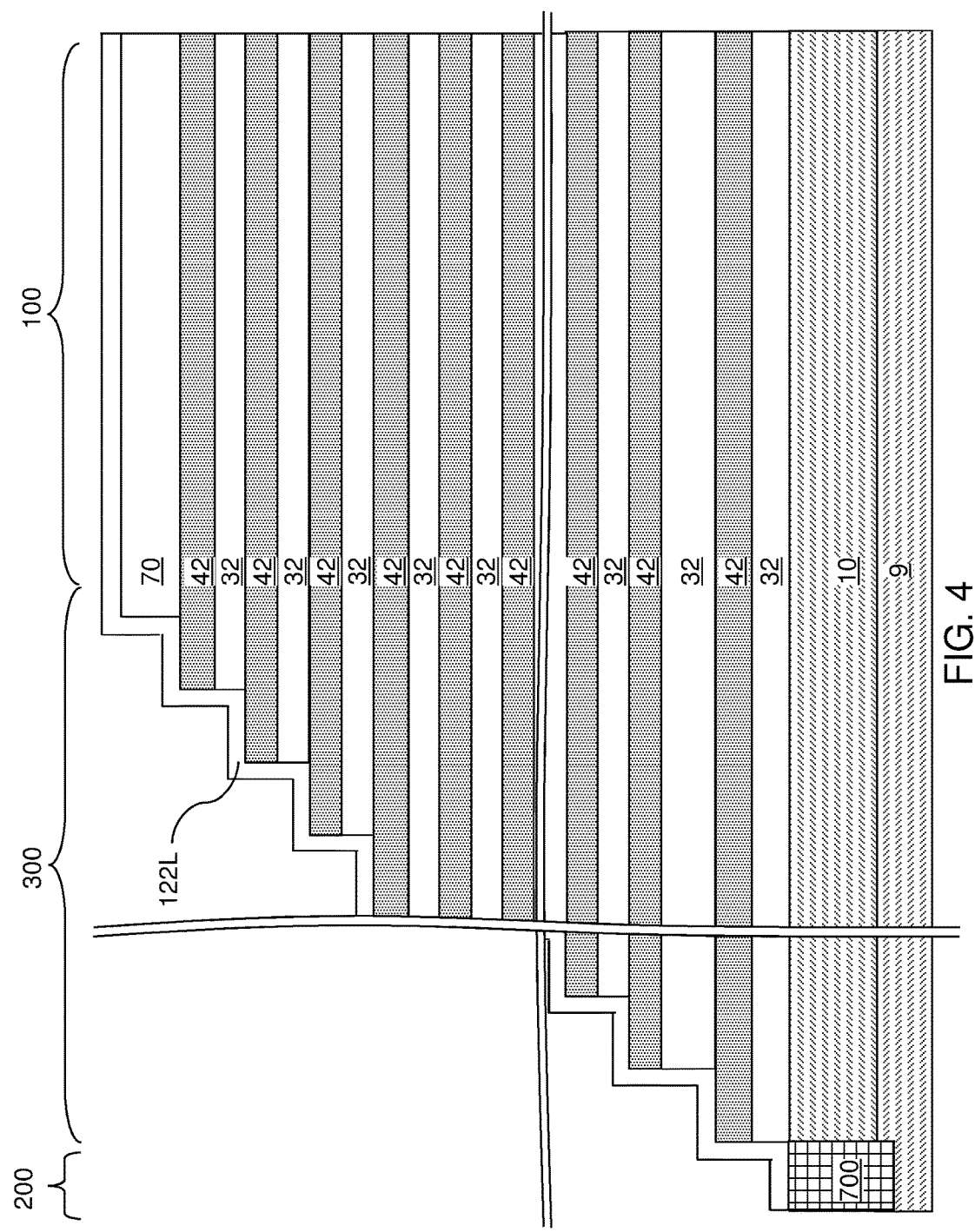
FIG. 4 is a schematic vertical cross-sectional view of the first exemplary structure after formation of a conformal dielectric layer according to the first embodiment of the present disclosure.

Referring to FIG. 4, a conformal dielectric layer 122L is formed on the stepped surfaces of the alternating stack (32, 42) in the terrace region, over the insulating cap layer 70, and over physically exposed surfaces in the peripheral device region 200. The conformal dielectric layer 122L includes a dielectric material that is different from the material of the sacrificial material layers 42. In the first embodiment, the conformal dielectric layer 122L includes a dielectric material that is different from silicon nitride. For example, the conformal dielectric layer 122L can include silicon oxide or a dielectric metal oxide such as aluminum oxide. The conformal dielectric layer 122L can be deposited by a conformal deposition process such as chemical vapor deposition or atomic layer deposition. The thickness of the conformal dielectric layer 122L can have a thickness in a range from 3 nm to 30 nm, such as from 5 nm to 10 nm, although lesser and greater thicknesses can also be employed.

Figure 5:
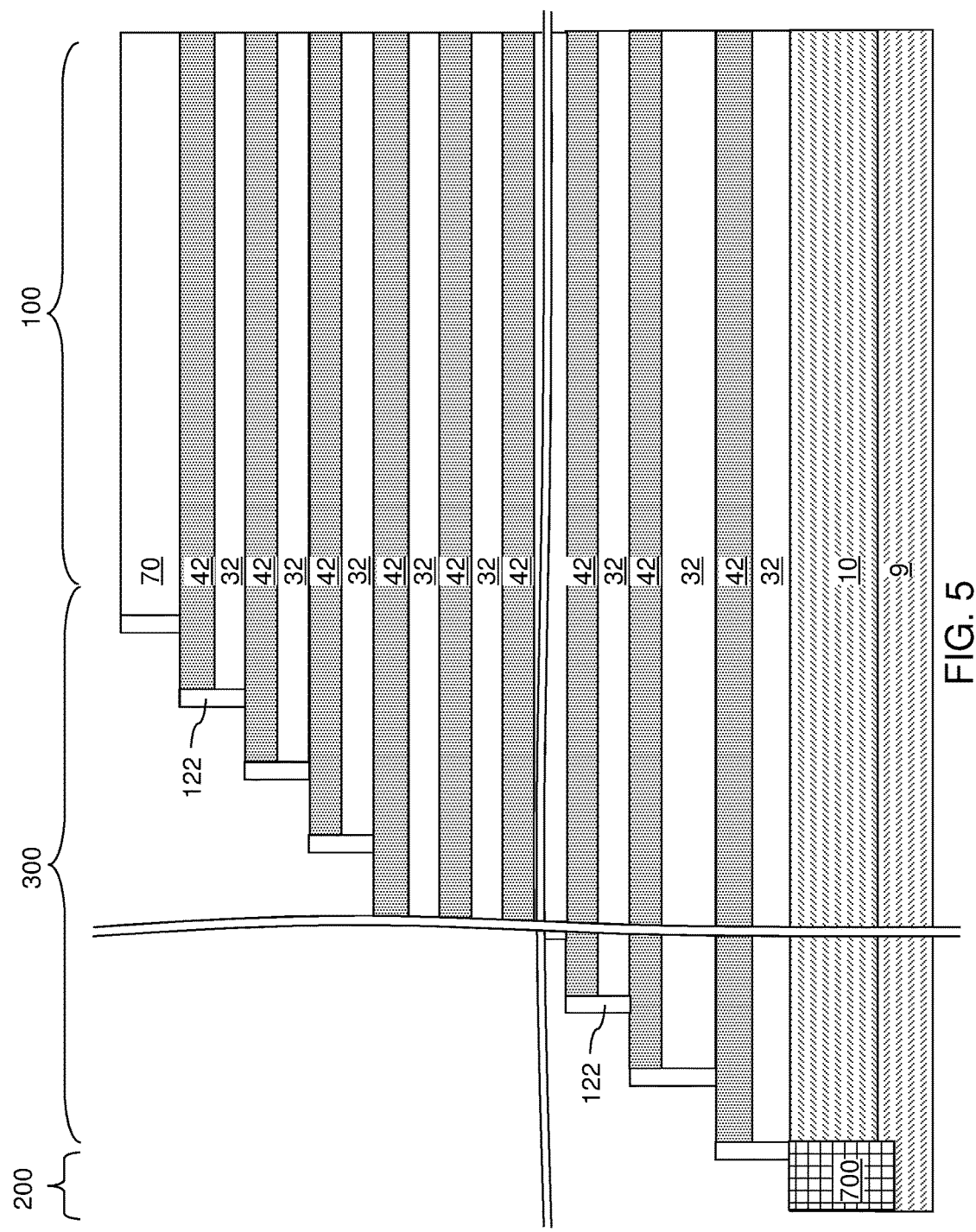
FIG. 5 is a schematic vertical cross-sectional view of the first exemplary structure after formation of dielectric spacers according to the first embodiment of the present disclosure.

Referring to FIG. 5, an anisotropic etch process can be performed to remove horizontal portions of the conformal dielectric layer 122L. Horizontal surfaces of the sacrificial material layers 42 can be employed as stopping surfaces for the anisotropic etch process. Each remaining vertical portion of the conformal dielectric layer 122L constitutes a dielectric spacer 122. The dielectric spacers 122 are formed on sidewalls of vertically neighboring pairs of an insulating layer 32 and an overlying sacrificial material layer 42 (i.e., on a sidewall of each step). As such, each dielectric spacer 122 contacts vertically coincident sidewalls of a neighboring pair of an underlying insulating layer 32 and an overlying sacrificial material layer 42. In one embodiment, more than 90% of the area of each sidewall of the sacrificial material layers in the terrace region may be contacted by a respective one of the dielectric spacers 122. 100% of the area of each sidewall of the insulating layers 32 in the terrace region can be contacted by a respective one of the dielectric spacers 122.

Figure 6:
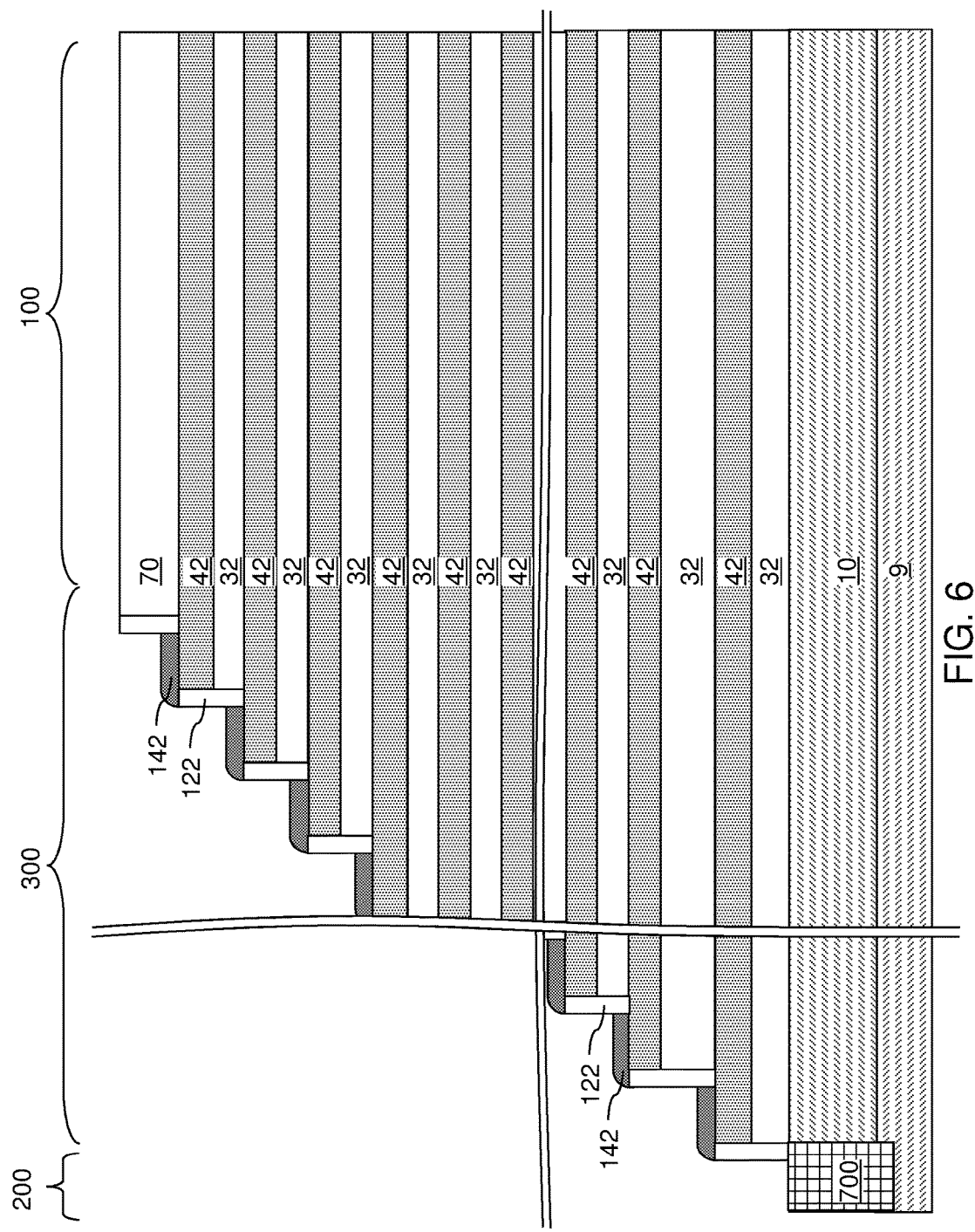
FIG. 6 is a schematic vertical cross-sectional view of the first exemplary structure after formation of self-aligned dielectric material portions according to the first embodiment of the present disclosure.

Referring to FIG. 6, self-aligned material portions 142 are formed on physically exposed surfaces of the sacrificial material layers 42 in the terrace region employing a selective deposition process. In the selective deposition process, a material grows from the physically exposed surfaces of the sacrificial material layers 42 and does not grow from surfaces of the dielectric spacers 122. The self-aligned material portions 142 can include sacrificial material portions that are subsequently removed. In the first embodiment, the sacrificial material layers 42 can comprise silicon nitride, the insulating layers 32 can comprise silicon oxide or a dielectric metal oxide, and the selective deposition process deposits self-aligned silicon nitride portions from silicon nitride surfaces of the sacrificial material layers 42 as the self-aligned material portions 142 without growing silicon nitride from the surfaces of the insulating layers 32 which are covered by the dielectric spacers 122 and the sacrificial material layers 42. In this case, an incubation time difference for deposition of silicon nitride between the silicon nitride surfaces of the sacrificial material layers 42 and the silicon oxide surfaces or the dielectric metal oxide surfaces of the dielectric spacers 122 can be employed to induce deposition of the self-aligned silicon nitride portions from silicon nitride surfaces of the sacrificial material layers 42 without growing silicon nitride from surfaces of the dielectric spacers 122. Optionally, the end parts of the self-aligned material portions 142 can also be formed over top surfaces of the dielectric spacers 122 as the silicon nitride material laterally grows over the top surface of the dielectric spacers 122. The optional end parts can have a curved surface and a thickness that is smaller than the remaining parts of the self-aligned material portions 142.

The incubation time for nucleation of silicon nitride on silicon nitride surfaces is essentially zero, while the incubation time for nucleation of silicon nitride on silicon oxide surfaces or dielectric metal oxides is non-zero. In one embodiment, the species of the reactants, the deposition temperature, and the partial pressure of the reactants can be selected to increase the incubation time on the surfaces of the dielectric spacers 122. For example, a plasma enhanced atomic layer deposition (PEALD) process employing ammonia and at least one of silane and dichlorosilane can be employed for the selective deposition process that deposits silicon nitride only on the physically exposed surfaces of the sacrificial material layers 42. Alternatively, silicon nitride can be selectively deposited by selective low pressure chemical vapor deposition (LPCVD). The duration of the selective deposition process can be selected to be less than the incubation time for silicon nitride on the surfaces of the dielectric spacers 122, thereby avoiding growth of silicon nitride from the surfaces of the dielectric spacers 122. Optionally, a silicon nitride etch back process may be performed to remove any nucleation on the surfaces of the dielectric spacers 122. Optionally, a deposition step and an etch back step may be repeated multiple times to deposit the self-aligned material portions 142. The thickness of the self-aligned material portions 142 may be in a range from 1 nm to 20 nm, such as from 2 nm to 15 nm and/or from 5 nm to 10 nm, although lesser and greater thicknesses can also be employed.

Figure 7:
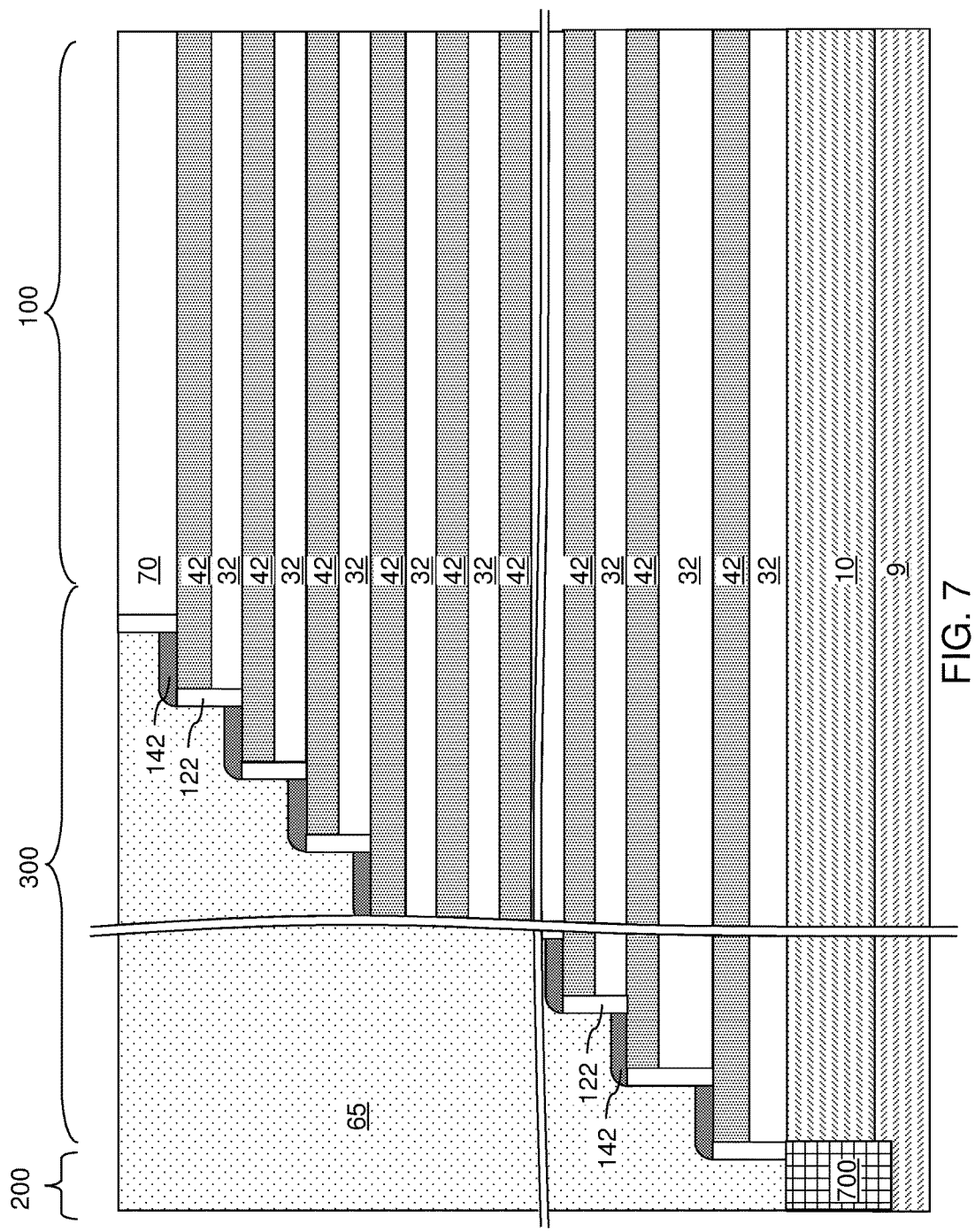
FIG. 7 is a schematic vertical cross-sectional view of the first exemplary structure after formation of a retro-stepped dielectric material portion according to the first embodiment of the present disclosure.

Referring to FIG. 7, a retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures (not shown) can be formed through the insulating cap layer 70 and a subset of the sacrificial material layers 42 located at drain select levels. The drain select level isolation structures can be formed, for example, by forming drain select level isolation trenches and filling the drain select level isolation trenches with a dielectric material such as silicon oxide. Excess portions of the dielectric material can be removed from above the top surface of the insulating cap layer 70.

The retro-stepped dielectric material portion 65 can be formed on the sidewalls of the dielectric spacers 122. Each dielectric spacer 122 can contact a respective sidewall of the retro-stepped dielectric material portion 65. Further, the retro-stepped dielectric material portion 65 can contact each of the self-aligned material portions 142. Each of the self-aligned material portions 142 can include a horizontal surface and a tapered or curved surface that contact a respective bottom surface of the retro-stepped dielectric material portion 65. The sacrificial material layers 42 are laterally and vertically spaced from the retro-stepped dielectric material portion 65 by the self-aligned material portions 142 and the dielectric spacers 122.

Figure 8A:
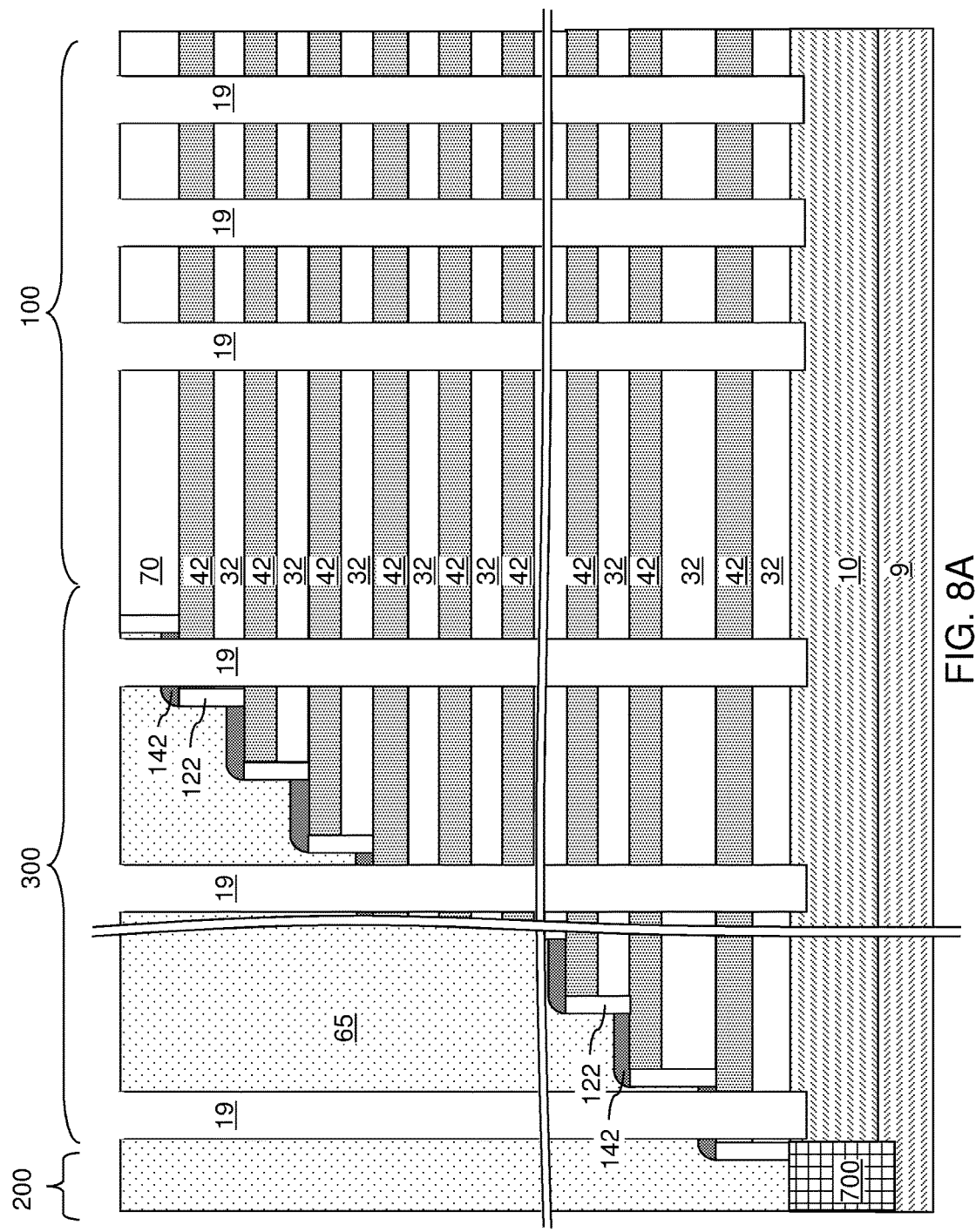
FIG. 8A is a schematic vertical cross-sectional view of the first exemplary structure after formation of memory openings and support openings according to the first embodiment of the present disclosure.
Figure 8B:
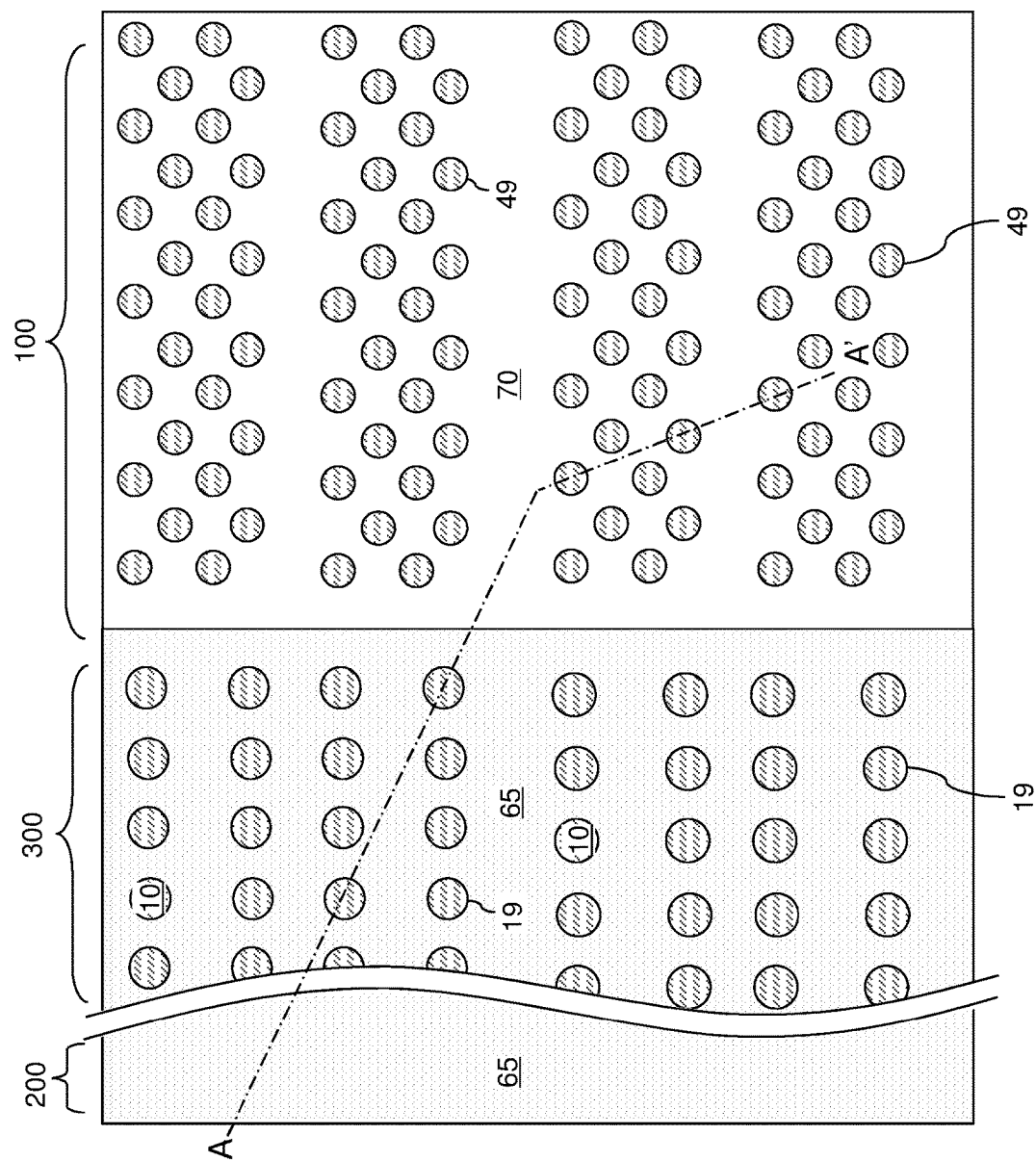
FIG. 8B is a top-down view of the first exemplary structure of FIG. 8A. The vertical plane A-A' is the plane of the cross-section for FIG. 8A.

Referring to FIGS. 8A and 8B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. In one embodiment, each of the support openings 19 can vertically extend through at least one self-aligned material portion 142. In one embodiment, at least one of the support openings 19 can vertically extend through only one of the self-aligned material portions 142. Alternatively or additionally, at least one of the support openings 19 can vertically extend through a respective pair of the self-aligned material portions 142. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 9A-9H illustrate structural changes in a memory opening 49, which is one of the memory openings 49 in the exemplary structure of FIGS. 8A and 8B. The same structural change occurs simultaneously in each of the other memory openings 49 and in each support opening 19.

Referring to FIG. 9A, a memory opening 49 in the exemplary device structure of FIGS. 8A and 8B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 9B, an optional pedestal channel portion 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 9C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 9D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor substrate layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 9F:
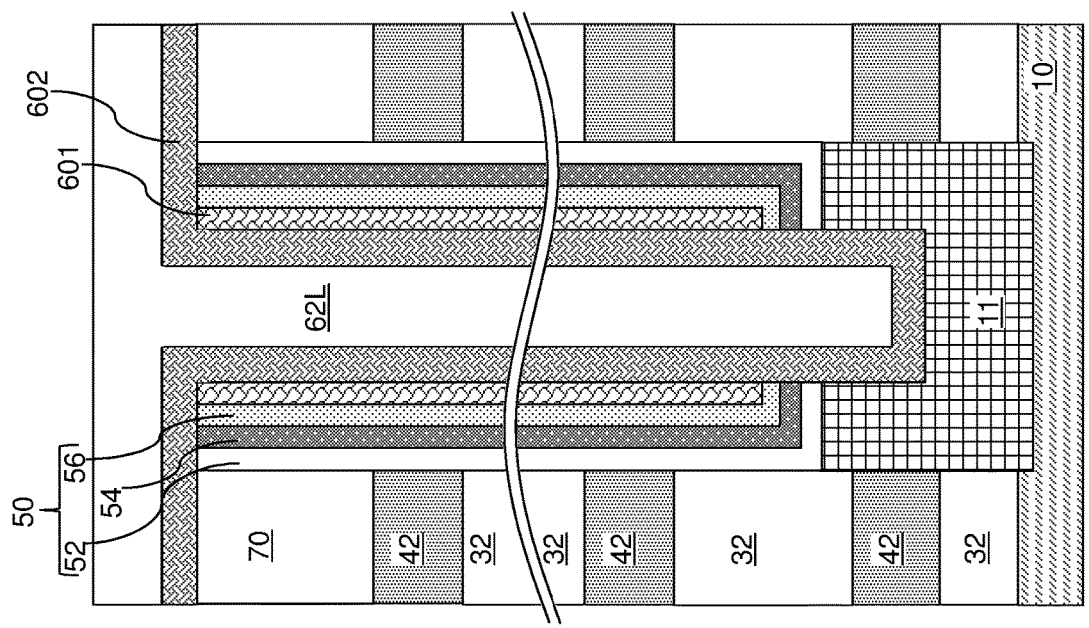
Figure 9E:
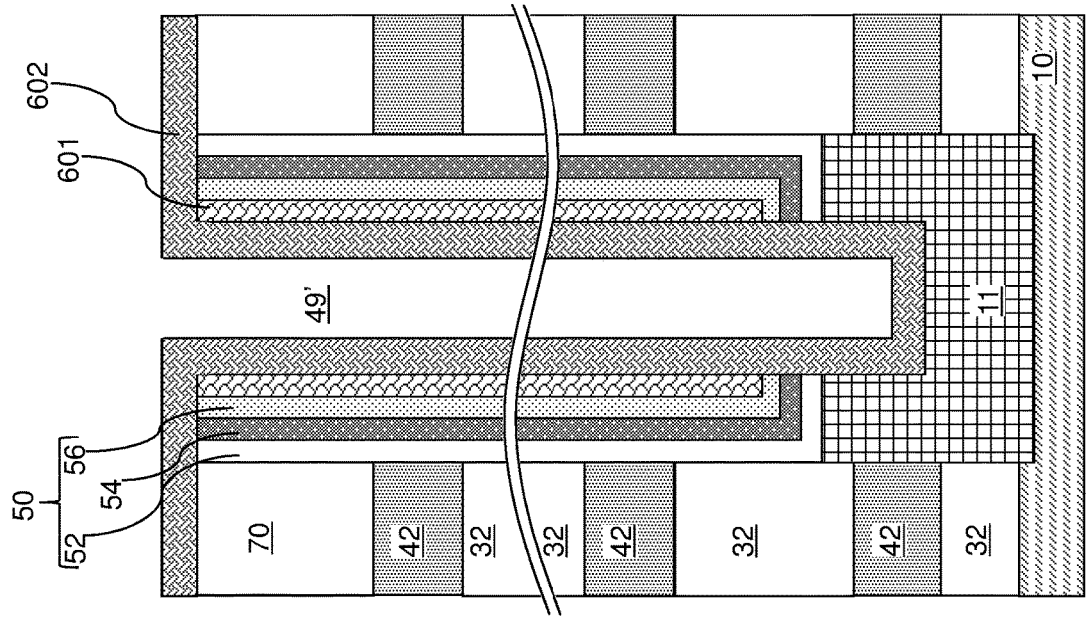

Referring to FIG. 9E, a second semiconductor channel layer 602 can be deposited directly on the semiconductor surface of the pedestal channel portion 11 or the semiconductor substrate layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 9F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 9G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 9H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52.

Figure 10:
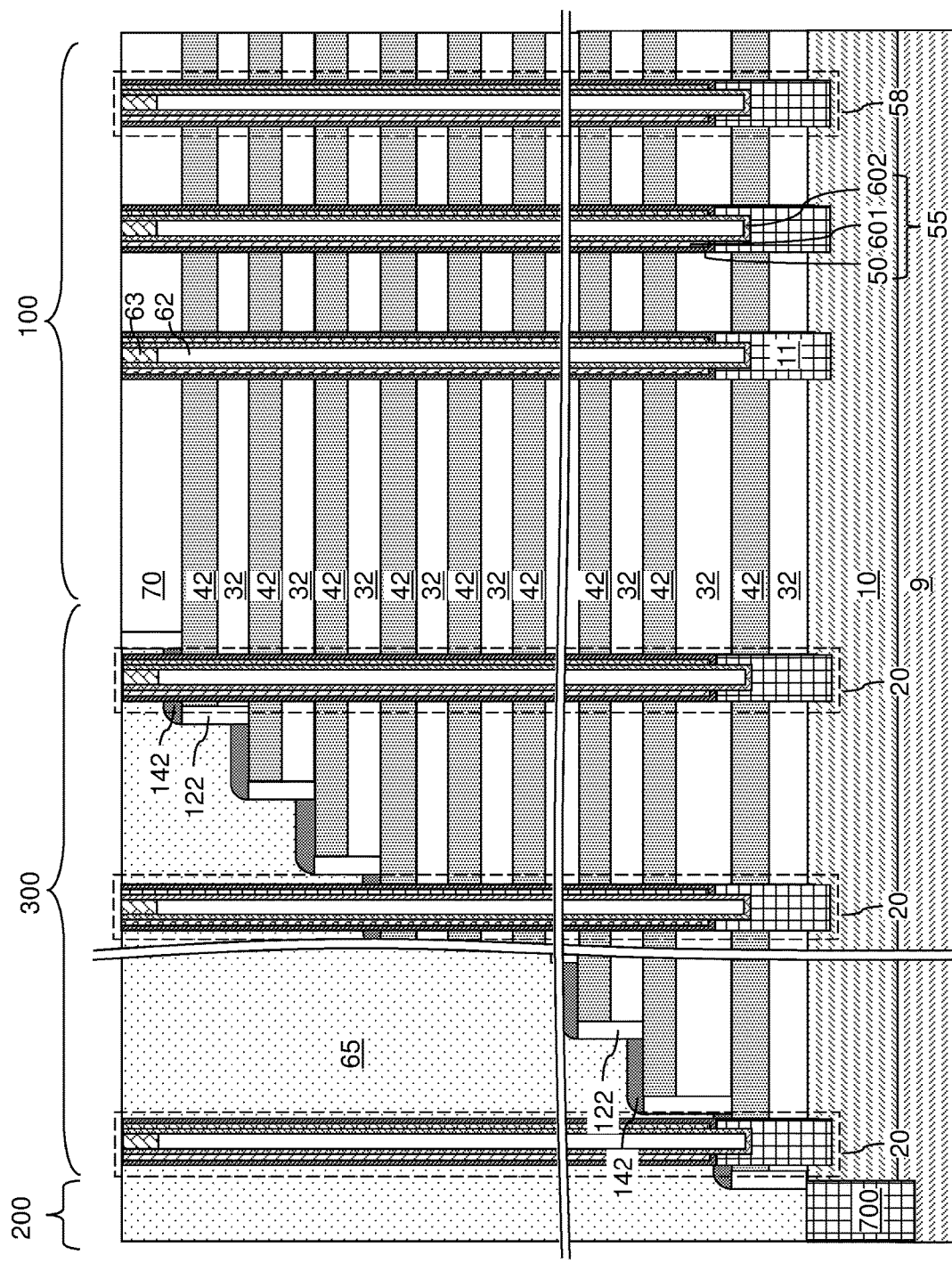
FIG. 10 is a schematic vertical cross-sectional view of the first exemplary structure after formation of memory stack structures and support pillar structures according to the first embodiment of the present disclosure.

Referring to FIG. 10, the exemplary structure is illustrated after formation of memory opening fill structures 58 and support pillar structure 20 within the memory openings 49 and the support openings 19, respectively. Each combination of a pedestal channel portion 11 (if present), a memory stack structure 55, a dielectric core 62, and a drain region 63 within a memory opening 49 is herein referred to as a memory opening fill structure 58. An instance of a memory opening fill structure 58 can be formed within each memory opening 49 of the structure of FIGS. 8A and 8B. An instance of the support pillar structure 20 can be formed within each support opening 19 of the structure of FIGS. 8A and 8B. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

A two-dimensional array of support pillar structures 20 can be formed in the contact region 300. In one embodiment, each of the support pillar structures 20 can vertically extend through at least one self-aligned material portion 142. In one embodiment, at least one of the support pillar structures 20 can vertically extend through only one of the self-aligned material portions 142. Alternatively or additionally, at least one of the support pillar structures 20 can vertically extend through a respective pair of the self-aligned material portions 142. A support pillar structure 20 may, or may not, directly contact a dielectric spacer 122.

Figure 11A:
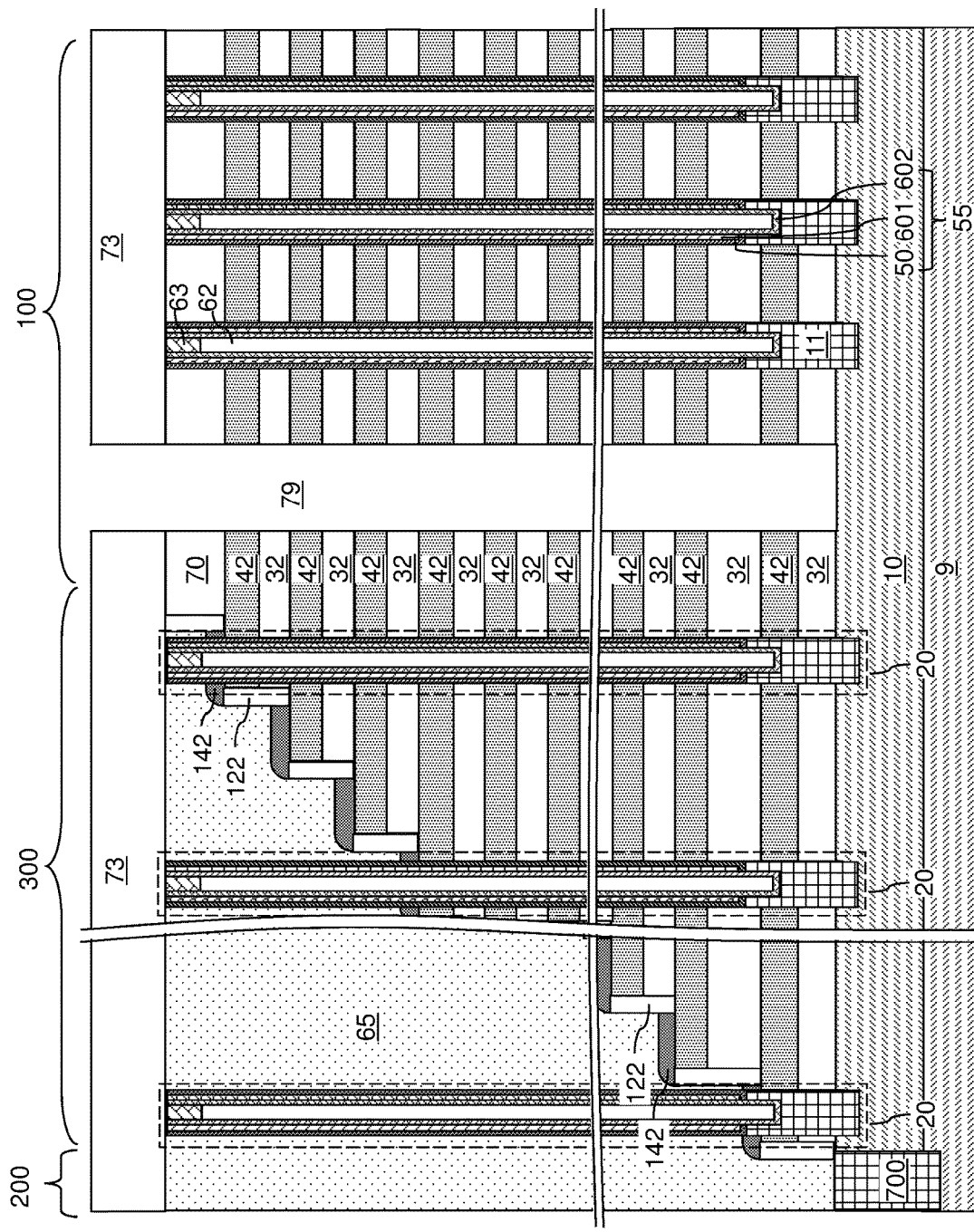
FIG. 11A is a schematic vertical cross-sectional view of the first exemplary structure after formation of backside trenches according to the first embodiment of the present disclosure.
Figure 11B:
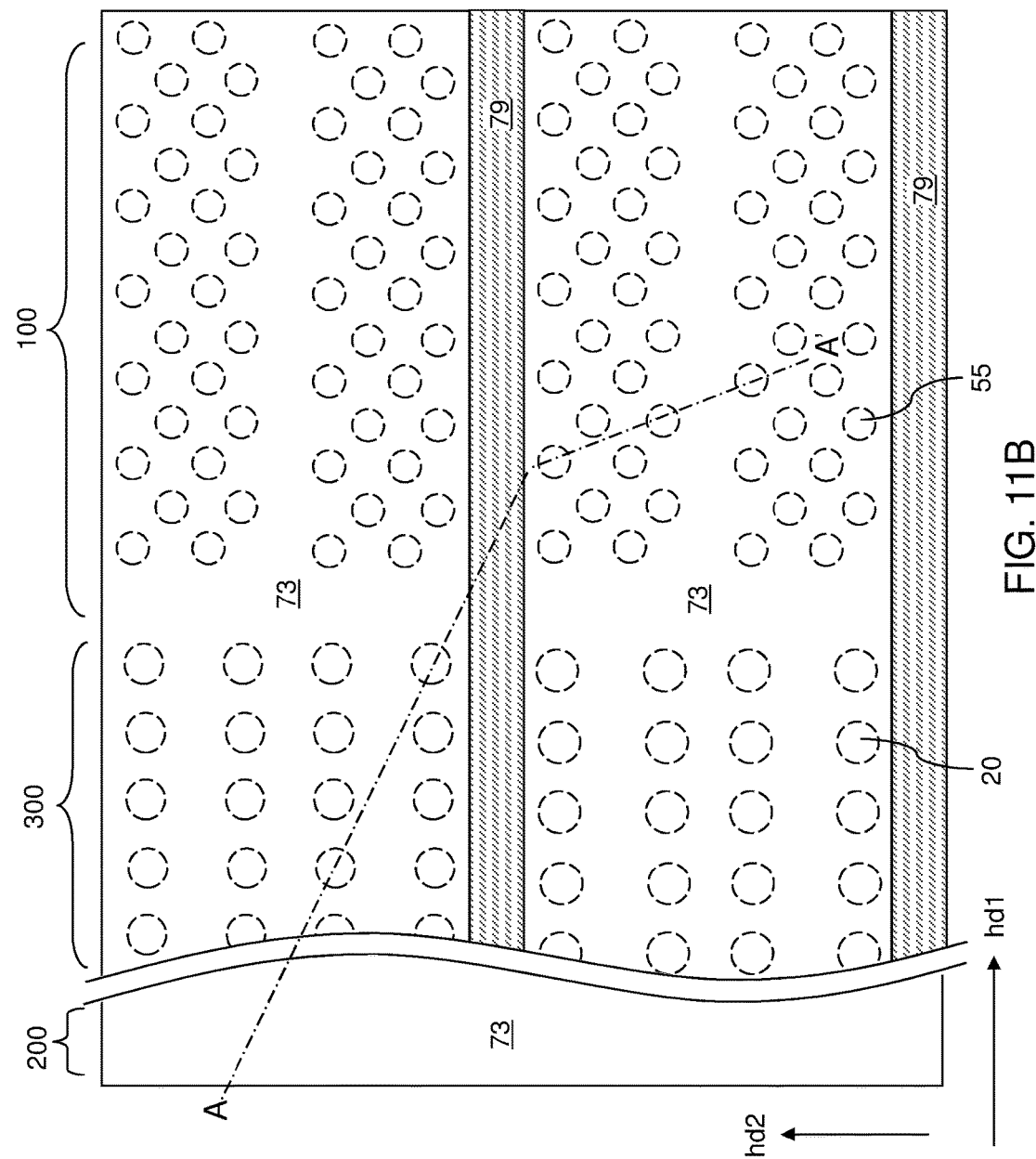
FIG. 11B is a top-down view of the first exemplary structure of FIG. 11A. The vertical plane A-A' is the plane of the schematic vertical cross-sectional view of FIG. 11A.

Referring to FIGS. 11A and 11B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. In one embodiment, the backside trenches 79 can laterally extend along a first horizontal direction hd1, and can be laterally spaced among one another along a second horizontal direction hd2. In one embodiment, each backside trench 79 can be a line trench having a uniform width that is invariant with translation with the lengthwise direction, i.e., the first horizontal direction hd1. The photoresist layer can be removed, for example, by ashing.

Figure 12:
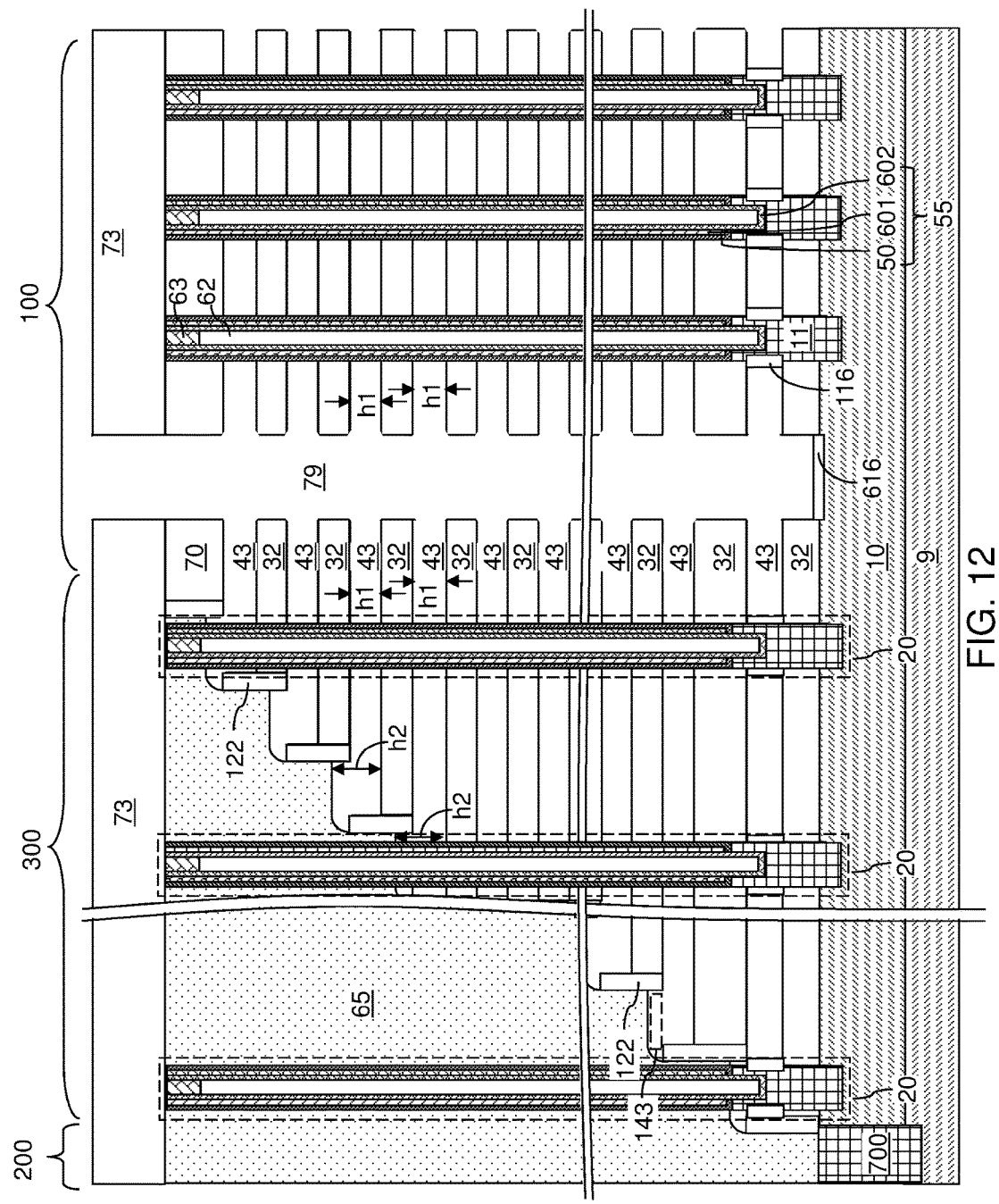
FIG. 12 is a schematic vertical cross-sectional view of the first exemplary structure after formation of backside recesses according to the first embodiment of the present disclosure.

Referring to FIGS. 12 and 13A, an etchant that selectively etches the second material of the sacrificial material layers 42 and the self-aligned material portions 142 with respect to the first material of the insulating layers 32 can be introduced into the backside trenches 79, for example, employing a wet etch process. Backside recesses 43 are formed in volumes from which the sacrificial material layers 42 and the self-aligned material portions 142 are removed. The removal of the second material of the sacrificial material layers 42 and the self-aligned material portions 142 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 and the self-aligned material portions 142 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 and the self-aligned material portions 142 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42 and the self-aligned material portions 142.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 and the material of the self-aligned material portions 142 are removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. Each backside recess 43 can include a protruding cavity portion 143, which is a volume from which a self-aligned material portion 142 is removed. Each protruding cavity portion 143 includes a volume of a respective backside recess 43 that is above a horizontal plane including the interface between the backside recess 43 and the horizontal plane of an overlying one of the insulating layers 32. In one embodiment, each backside recess 43 can have a first portion having a first height h1 throughout, and a second portion having a second height h2. The first portion corresponds to the volume of each backside recess 43 that does not underlie the protruding cavity portion 143 of the backside recess 43. The second portion corresponds to the volume of each backside recess 43 that includes the protruding cavity portion 143 and the underlying segment of the backside recess 43. The second height h2 can be greater than the first height h1 by the thickness of the horizontal portion of a self-aligned material portion 142, which is the height of the corresponding protruding cavity portion 143.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 13B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed on all physically exposed surfaces in the backside recesses 43. The backside blocking dielectric layer 44 can be formed directly on inner sidewalls of the dielectric spacers 122 and the bottom surfaces of the retro-stepped dielectric material portion 65 overlying the protruding cavity portions 143. Further, the backside blocking dielectric layer 44 can be formed on a bottom portion of lower sidewalls of each dielectric spacer 122 other than the bottommost one of the dielectric spacers 122. The backside blocking dielectric layer 44 is formed on horizontal bottom surfaces of the insulating layers 32 other than the bottommost one of the insulating layers 32, and on horizontal top surfaces of each of the insulating layers 32. The backside blocking dielectric layer 44 is formed on physically exposed portions of the sidewalls of the memory opening fill structures 58 and the support pillar structures 20. The backside blocking dielectric layer 44 can be formed and on a sidewall of the backside trench 79.

The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 13C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 14A:
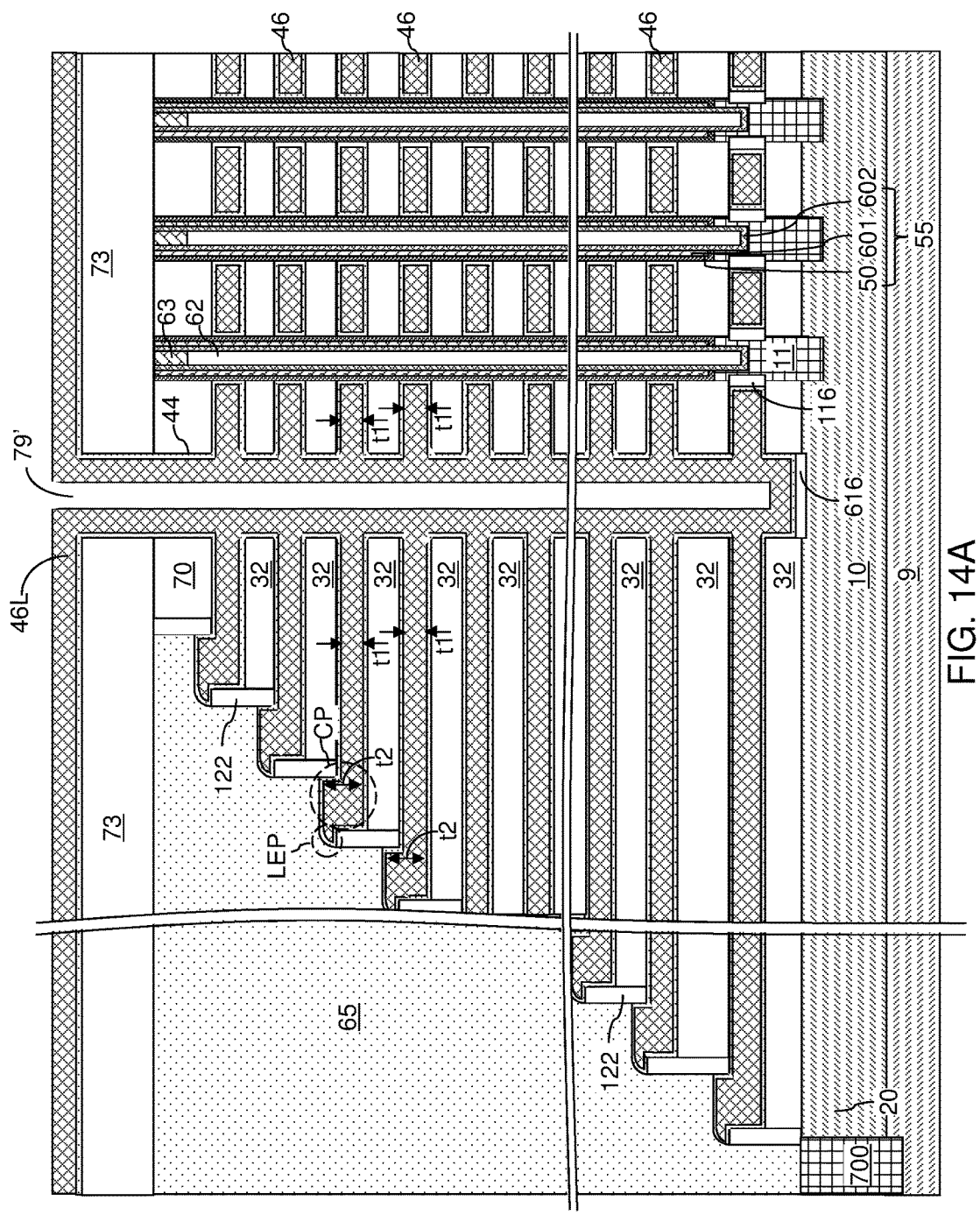
FIG. 14A is a schematic vertical cross-sectional view of the first exemplary structure at the processing step of FIG. 13D.
Figure 14B:
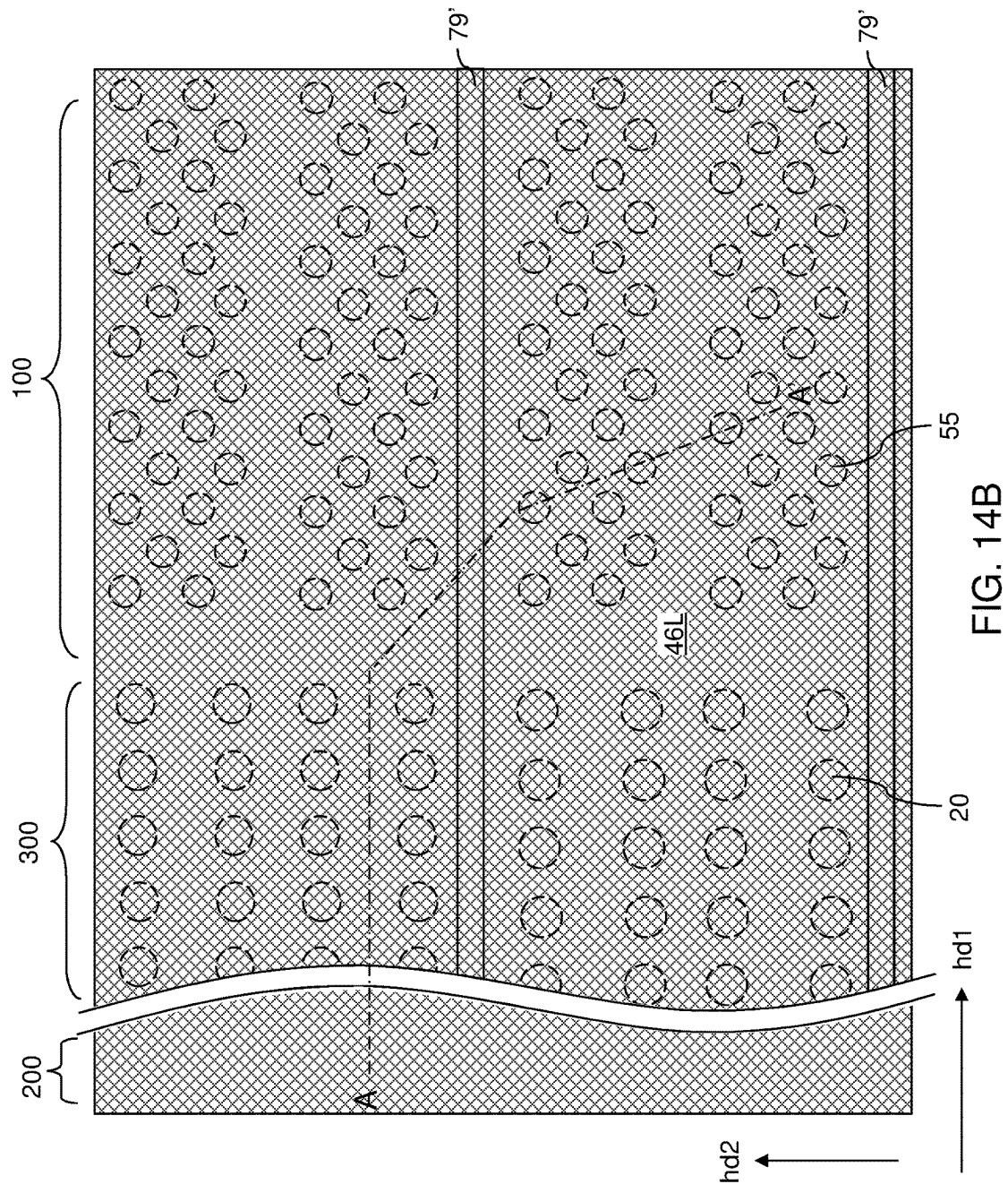
FIG. 14B is a top-down view of the first exemplary structure of FIG. 14A. The vertical plane A-A' is the plane of the schematic vertical cross-sectional view of FIG. 14A.

Referring to FIGS. 13D, 14A, and 14B, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of conductive material layers 46 can be formed in the plurality of backside recesses 43, and a continuous metallic material layer 46L can be formed on the sidewalls of each backside trench 79 and over the contact level dielectric layer 73. Each conductive material layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with a conductive material layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost conductive material layer 46 laterally surrounds each tubular dielectric spacer 116 upon formation of the conductive material layers 46. According to an aspect of the present disclosure, each of the conductive material layers 46 can have a respective first thickness t1 throughout the memory array region 100 and a respective segment of the contact region 300 and includes a contact portion CP having a respective second thickness t2 that is greater than the respective first thickness t1 within the terrace region. If the optional curved end parts of the self-aligned material portions 142 are formed over top surfaces of the dielectric spacers 122, then each of the electrically conductive layers 46 can optionally also include a laterally extending portion LEP adjoined to the contact portion and having a lesser thickness than the respective first thickness t1 and overlying a respective one of the dielectric spacers 122 in the space that was previously occupied by the curved end part of the respective self-aligned material portion 142.

Figure 15A:
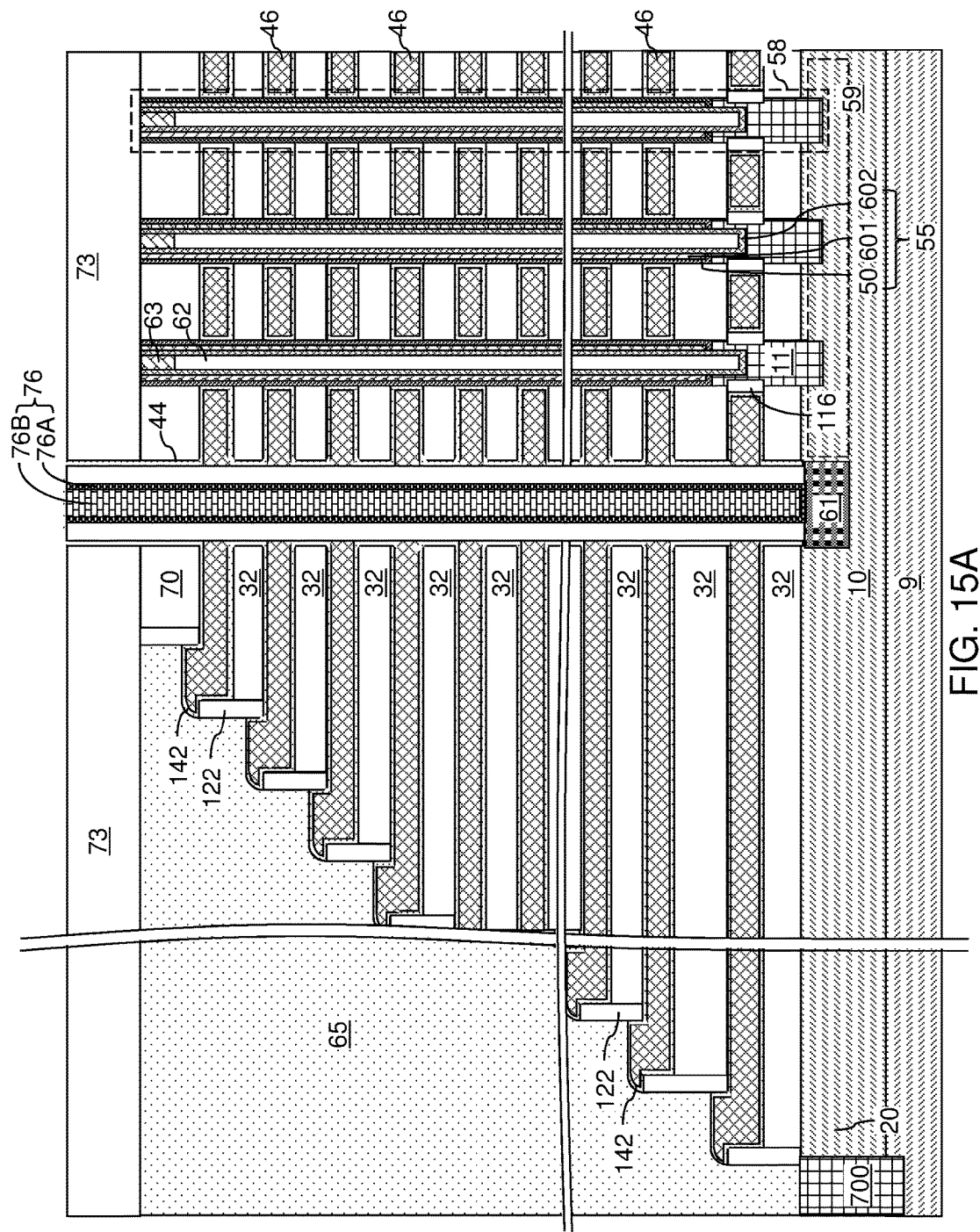
FIG. 15A is a schematic vertical cross-sectional view of the first exemplary structure after removal of a deposited conductive material from within the backside trenches and formation of an insulating spacer and a backside contact structure according to the first embodiment of the present disclosure.
Figure 15B:
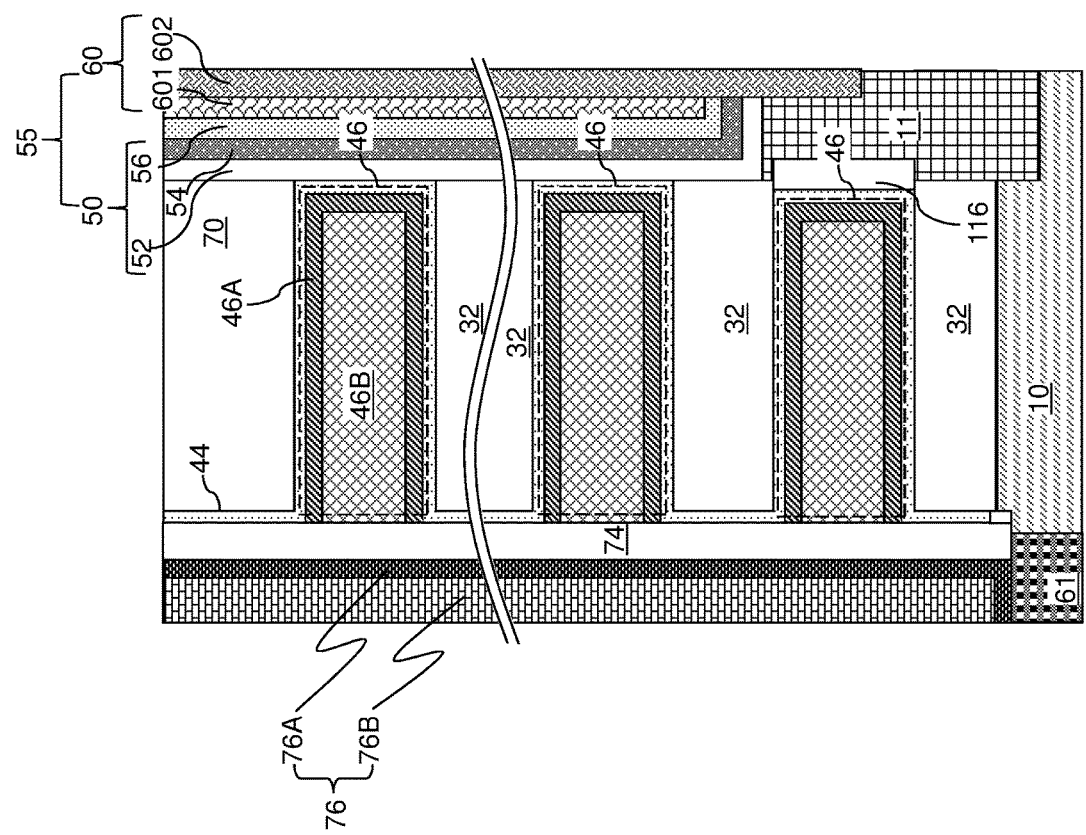
FIG. 15B is a magnified view of a region of the first exemplary structure of FIG. 15A.

Referring to FIGS. 15A and 15B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes a conductive material layer 46. Each conductive material layer 46 can be a conductive line structure. Thus, the sacrificial material layers 42 are replaced with the conductive material layers 46.

Each conductive material layer 46 can function as a combination of a plurality of control gate electrodes located at a same level and a word line electrically interconnecting, i.e., electrically shorting, the plurality of control gate electrodes located at the same level. The plurality of control gate electrodes within each conductive material layer 46 are the control gate electrodes for the vertical memory devices including the memory stack structures 55. In other words, each conductive material layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity is present within each backside trench 79.

An insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LP-CVD) or atomic layer deposition (ALD). The thickness of the insulating material layer can be in a range from 2 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the conductive material layers 46. If a backside blocking dielectric layer 44 is not employed, the insulating material layer can be formed directly on sidewalls of the insulating layers 32 and directly on sidewalls of the conductive material layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost conductive material layer 46 provided upon formation of the conductive material layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 16A:
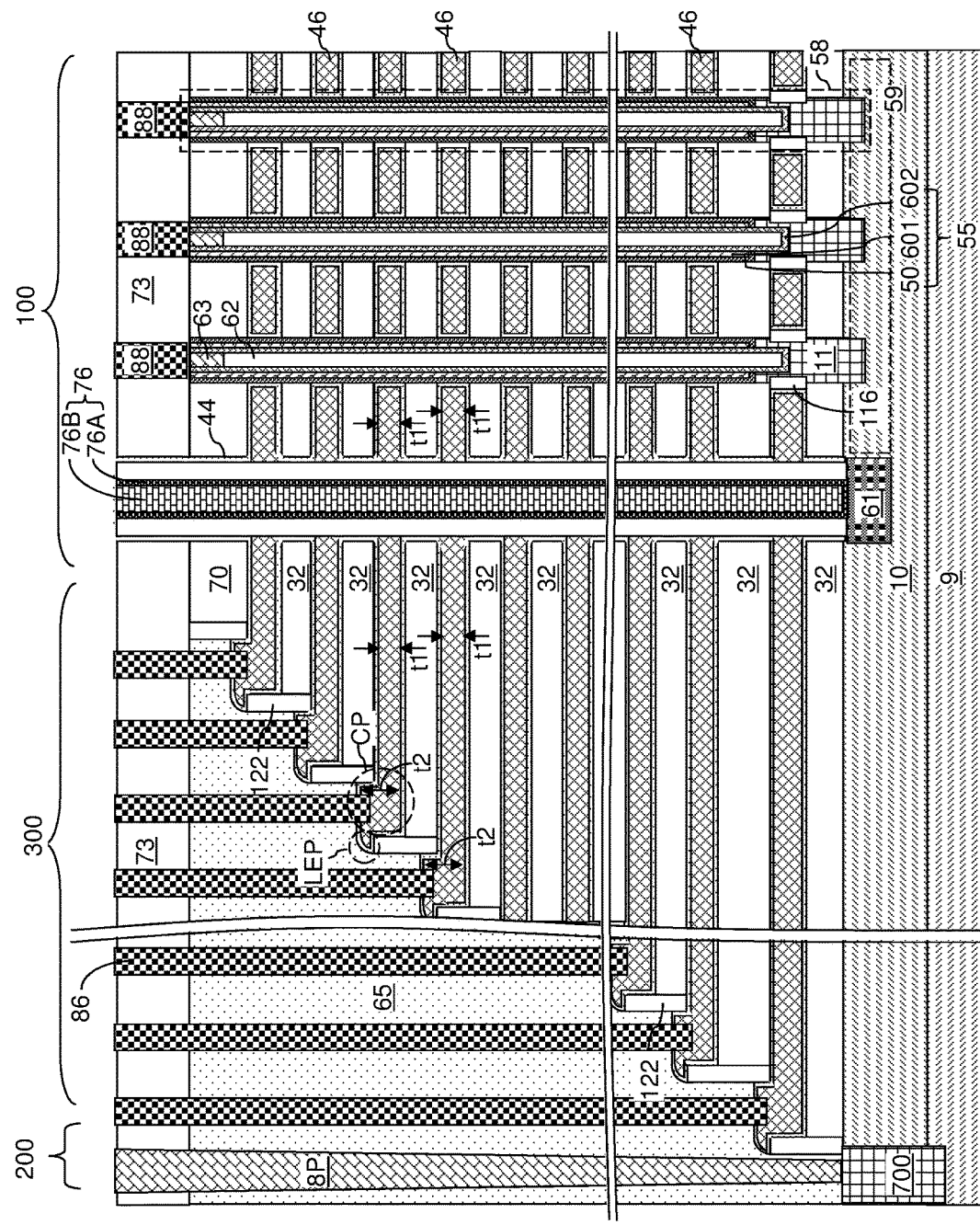
FIG. 16A is a schematic vertical cross-sectional view of the first exemplary structure after formation of additional contact via structures according to the first embodiment of the present disclosure.
Figure 16B:
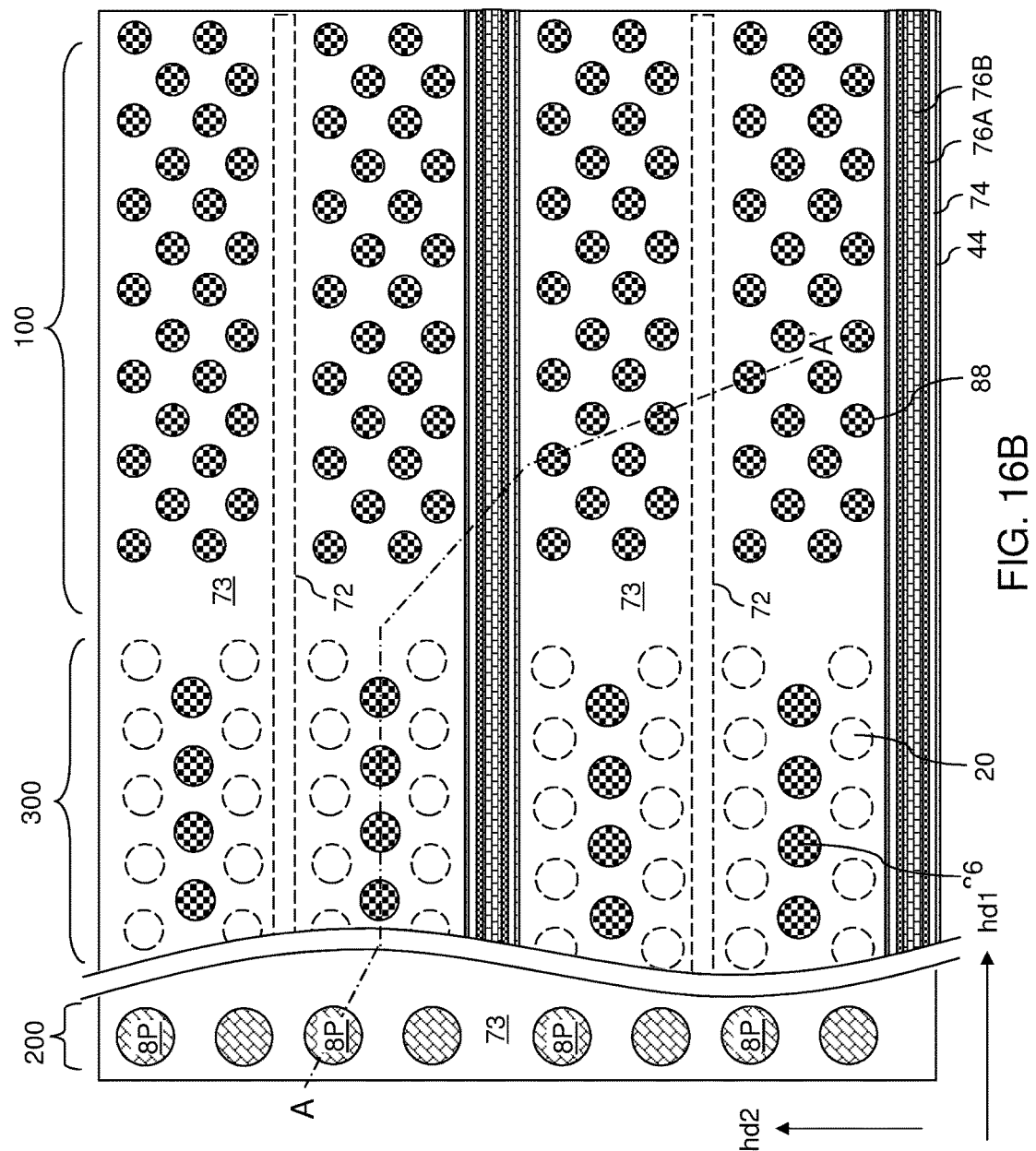
FIG. 16B is a top-down view of the first exemplary structure of FIG. 16A. The vertical plane A-A' is the plane of the schematic vertical cross-sectional view of FIG. 16A.

Referring to FIGS. 16A and 16B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Contact via cavities are formed in the terrace region, and filled with a conductive material to form word line contact via structures 86. The word line contact via structures 86 can be formed on the conductive material layers 46 through the contact level dielectric layer 73, and through the retro-stepped dielectric material portion 65. The word line contact via structures 86 are contact via structures that are electrically shorted to the respective one of the conductive material layers 46. Peripheral device contact via structures 8P can be formed through the retro-stepped dielectric material portion 65 directly on respective nodes of the peripheral devices.

Each conductive material layer 46 is an electrically conductive layer, and can function as a word line integrated with control gate electrodes for NAND arrays, a source select gate electrode, or a drain select gate electrode. Each of the conductive material layers 46 can have a respective first thickness t1 throughout the memory array region 100 and a respective segment of the contact region 300 and includes a contact portion CP having a respective second thickness t2 that is greater than the respective first thickness t1 within the terrace region. The contact portion CP is a distal end portion of each conductive material layer 46 that is distal from the memory array region 100. Each of the electrically conductive layers 46 can optionally also include a laterally extending portion LEP adjoined to the contact portion and having a lesser thickness than the respective first thickness t1 and overlying a respective one of the dielectric spacers 122.

The increased thickness of the contact portions CP with respect to the segments of the conductive material layers 46 located in the memory array region 100 decreases the likelihood that the conductive material layers 46 are etched through by the contact via cavities during the etch that forms the contact via cavities. Thus, the probability of electrically shorting multiple electrically conducive layers (e.g., word lines) by a word line contact via structure 86 that extends through an overlying electrically conducive layer 46, an insulating layer 32, and an underlying electrically conducive layer 46 decreases due to the presence of the contact portions CP having the respective second thickness t2.

Figure 17:
FIG. 17 is a schematic vertical cross-sectional view of a second exemplary structure after formation of self-aligned dielectric material portions according to a second embodiment of the present disclosure.

Referring to FIG. 17, a second exemplary structure according to a second embodiment of the present disclosure can be derived from the first exemplary structure of FIG. 3 by omitting the processing steps of FIGS. 4 and 5, and by performing the processing steps of FIG. 6. In other words, formation of the conformal dielectric layer 122L and the dielectric spacers 122 is omitted in the second embodiment.

A selective deposition process can be performed to grow self-aligned material portions 242 from physically exposed portions of the top surfaces and from the distal sidewalls of the sacrificial material layers 42 in the terrace region. The self-aligned material portions 242 can grow from a top surface and a sidewall surface of each of the sacrificial material portions 42. The selective deposition process can be the same as in the first embodiment. In the second embodiment, the sacrificial material layers 42 can comprise silicon nitride, the insulating layers 32 can comprise silicon oxide, and the selective deposition process deposits self-aligned silicon nitride portions from silicon nitride surfaces of the sacrificial material layers 42 as the self-aligned material portions 242 without growing silicon nitride from silicon oxide surfaces of the insulating layers 32. In this case, an incubation time difference for deposition of silicon nitride between the silicon nitride surfaces of the sacrificial material layers 42 and the silicon oxide surfaces of the insulating layers 32 can be employed to induce deposition of the self-aligned silicon nitride portions from silicon nitride surfaces of the sacrificial material layers 42 without growing silicon nitride from silicon oxide surfaces of the insulating layers 32. The self-aligned material portions 242 can cover all surfaces of the sacrificial material layers 42 in the terrace region and a lower portion of each sidewall of the insulating layers 32 other than the bottommost one of the insulating layers 32 in the terrace region, and optionally an upper portion of each sidewall of the insulating layers 32 in the terrace region.

The duration of the selective deposition process can be selected to be less than the incubation time for silicon nitride on the surfaces of the insulating layers 32, the insulating cap layer 70, and the physically exposed surfaces in the peripheral device region 700 (such as physically exposed surfaces of the planarization dielectric layer 770), thereby avoiding growth of silicon nitride from the surfaces of the insulating layers 32, the insulating cap layer 70, and the physically exposed surfaces in the peripheral device region 700. Optionally, a silicon nitride etch back process may be performed to remove any nucleation on the surfaces of the insulating layers 32, the insulating cap layer 70, and the physically exposed surfaces in the peripheral device region 700. Optionally, a deposition step and an etch back step may be repeated multiple times to deposit the self-aligned material portions 242. The thickness of the self-aligned material portions 242 may be in a range from 1 nm to 20 nm, such as from 2 nm to 15 nm and/or from 5 nm to 10 nm, although lesser and greater thicknesses can also be employed.

Figure 18:
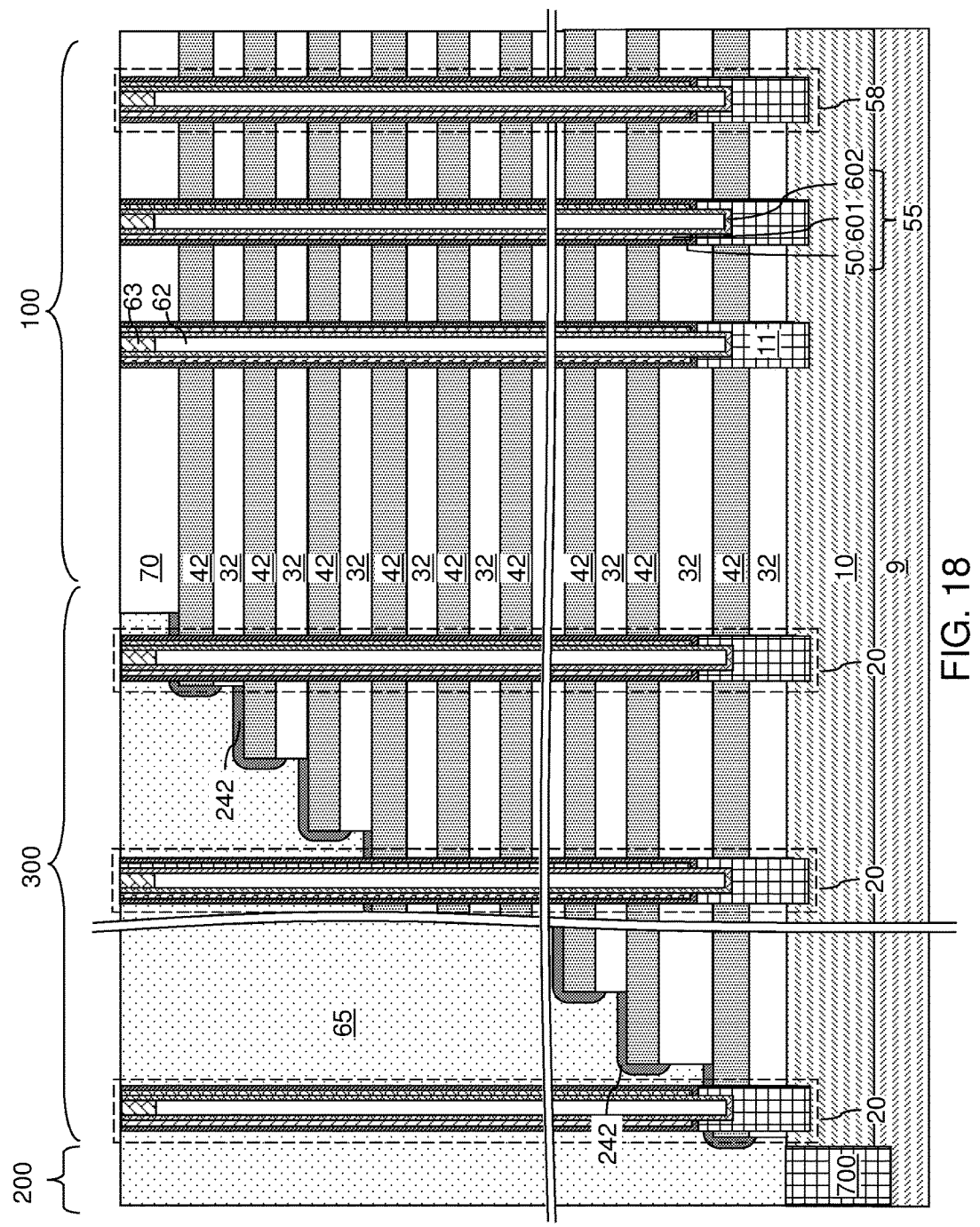
FIG. 18 is a schematic vertical cross-sectional view of the second exemplary structure after formation of memory stack structures and support pillar structures according to the second embodiment of the present disclosure.

Referring to FIG. 18, the processing steps of FIGS. 7, 8A, 8B, and 9A-9H can be performed to form a retro-stepped dielectric material portion 65, an array of memory opening fill structures 58, and support pillar structures 20. The retro-stepped dielectric material portion 65 can contact a portion of a distal sidewall of each insulating layer 32, and top surfaces and sidewall surfaces of the self-aligned material portions 242. In one embodiment, at least one of the support pillar structures 20 can vertically extend through only one of the self-aligned material portions 242. Alternatively or additionally, at least one of the support pillar structures can vertically extend through a respective pair of the self-aligned material portions 242.

Figure 19:
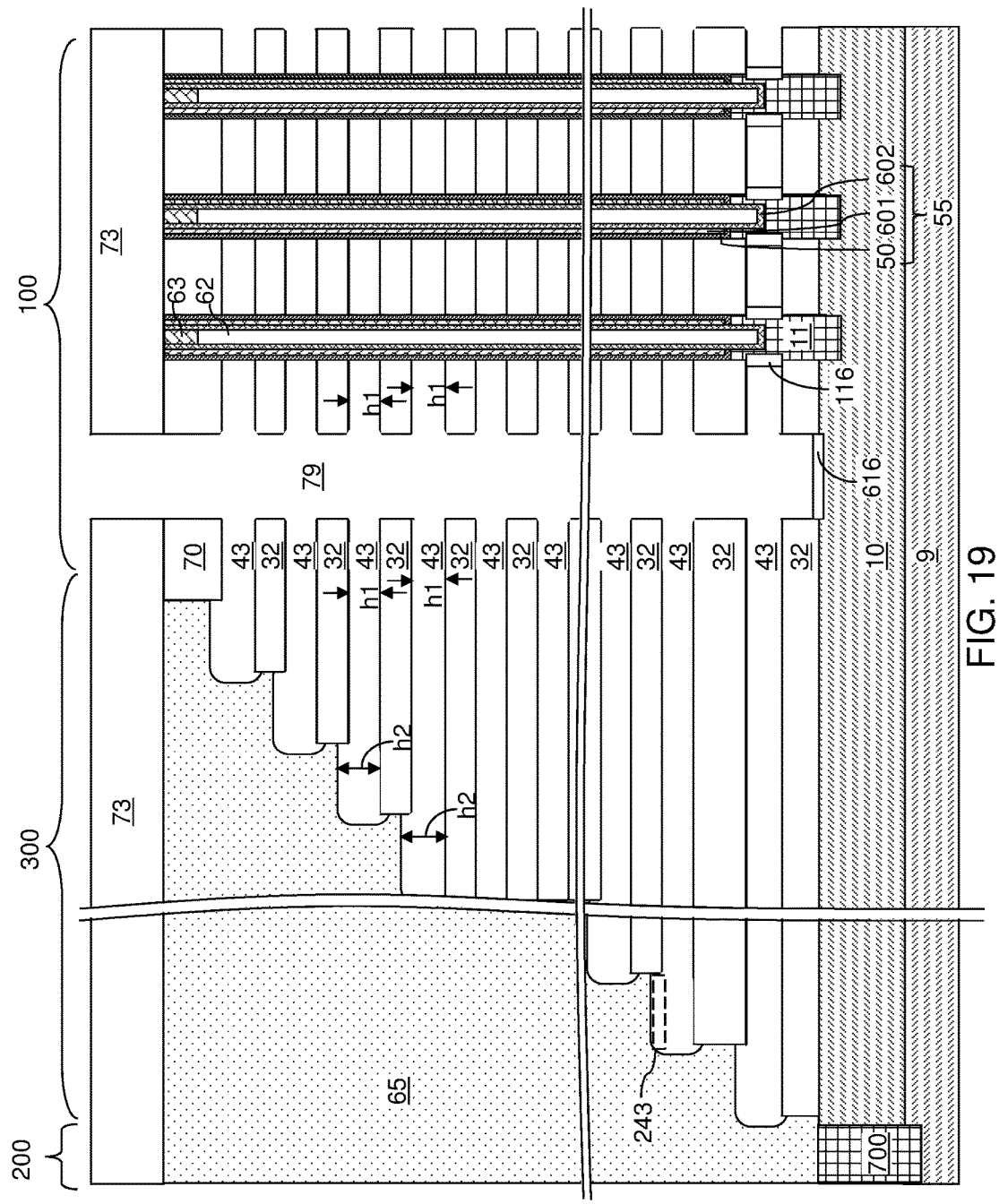
FIG. 19 is a schematic vertical cross-sectional view of the second exemplary structure after formation of backside recesses according to the second embodiment of the present disclosure.

Referring to FIG. 19, the processing steps of FIGS. 11A, 11B, and 12 can be performed to form backside trenches 79 and backside recesses 43. Each backside recess 43 can include a protruding cavity portion 243. The backside trenches 79 can have the same pattern as in the first embodiment. During formation of the backside recesses 43, an etchant that selectively etches the second material of the sacrificial material layers 42 and the self-aligned material portions 242 with respect to the first material of the insulating layers 32 can be introduced into the backside trenches 79, for example, employing a wet etch process. Backside recesses 43 are formed in volumes from which the sacrificial material layers 42 and the self-aligned material portions 242 are removed. The removal of the second material of the sacrificial material layers 42 and the self-aligned material portions 242 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 and the self-aligned material portions 242 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 and the self-aligned material portions 242 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42 and the self-aligned material portions 242.

Each backside recess 43 can be a laterally extending cavity having a lateral dimension that is greater than the vertical extent of the cavity. A plurality of backside recesses 43 can be formed in the volumes from which the second material of the sacrificial material layers 42 and the material of the self-aligned material portions 242 are removed. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. Each backside recess 43 can include a protruding cavity portion 243, which is a volume from which a self-aligned material portion 242 is removed. Each protruding cavity portion 243 includes a volume of a respective backside recess 43 that is above a horizontal plane including the interface between the backside recess 43 and the horizontal plane of an overlying one of the insulating layers 32. In one embodiment, each backside recess 43 can have a first portion having a first height h1 throughout, and a second portion having a second height h2. The first portion corresponds to the volume of each backside recess 43 that does not underlie the protruding cavity portion 243 of the backside recess 43. The second portion corresponds to the volume of each backside recess 43 that includes the protruding cavity portion 243 and the underlying segment of the backside recess 43. The second height h2 can be greater than the first height h1 by the thickness of the horizontal portion of a self-aligned material portion 242.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616 in the same manner as in the first embodiment.

Figure 20:
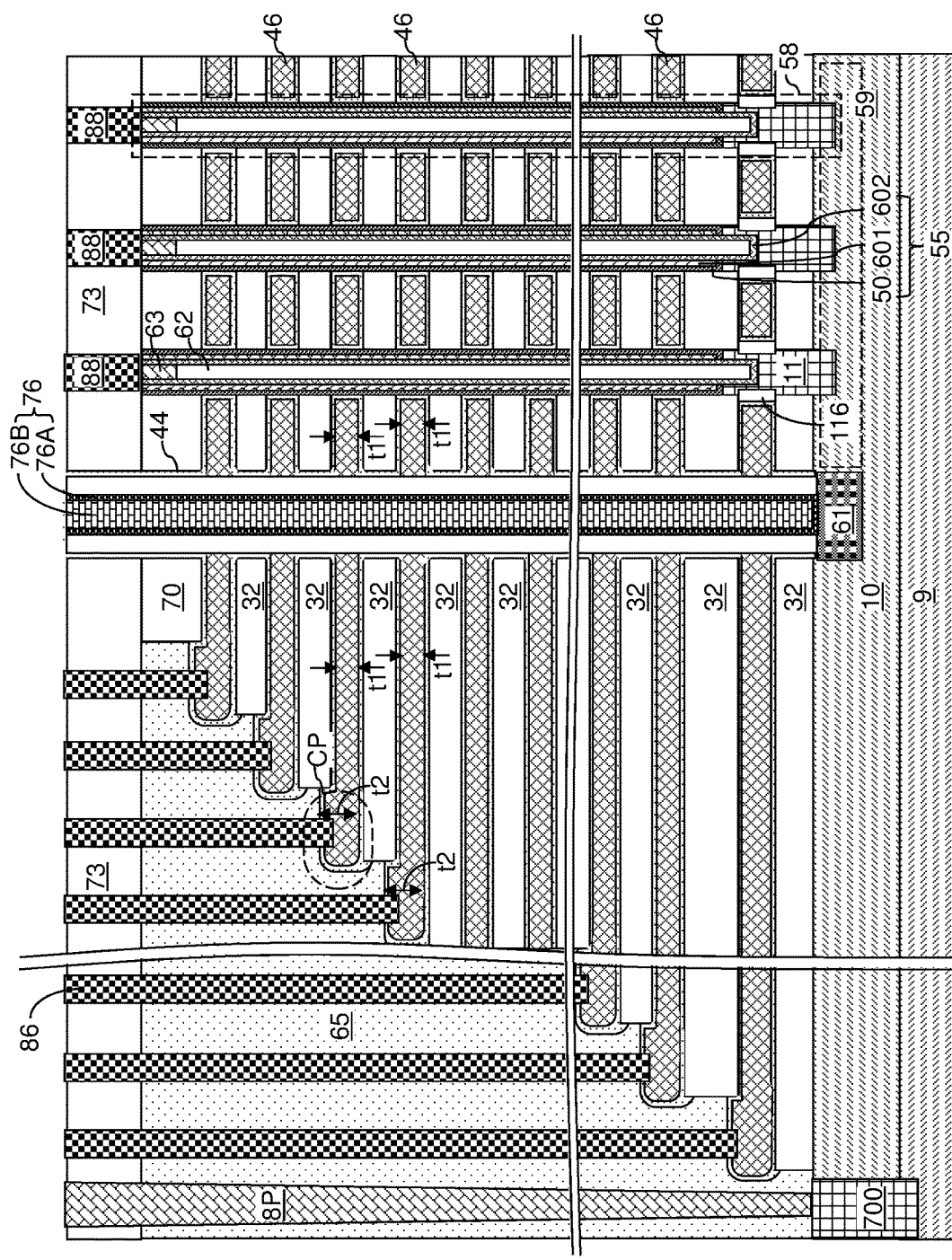
FIG. 20 is a schematic vertical cross-sectional view of the second exemplary structure after formation of electrically conductive layers, formation of an insulating spacer and a backside contact structure, and formation of additional contact via structures according to the second embodiment of the present disclosure.

Referring to FIG. 20, the processing steps of FIGS. 13B-13D, 14A, 14B, 15A, 15B, 16A, and 16B can be performed to form conductive material layers 46, insulating spacers 74, backside contact structures 76, drain contact via structures 88, word line contact via structures 86, and peripheral device contact via structures 8P. Each conductive material layer 46 is an electrically conductive layer, and can function as a word line integrated with control gate electrodes for NAND arrays, a source select gate electrode, or a drain select gate electrode.

The word line contact via structures 86 can be formed on the conductive material layers 46 through the contact level dielectric layer 73, and through the retro-stepped dielectric material portion 65. Each of the conductive material layers 46 can have a respective first thickness t1 throughout the memory array region 100 and a respective segment of the contact region 300 and includes a contact portion CP having a respective second thickness t2 that is greater than the respective first thickness t1 within the terrace region. The contact portion CP is a distal end portion of each conductive material layer 46 that is distal from the memory array region 100. The increased thickness of the contact portions CP with respect to the segments of the conductive material layers 46 located in the memory array region 100 decreases the likelihood that the conductive material layers 46 are etched through by the contact via cavities during the isotropic etch that forms the contact via cavities. Thus, the probability of electrically shorting multiple electrically conducive layers by a word line contact via structure 86 that extends through an overlying electrically conducive layer 46, an insulating layer 32, and an underlying electrically conducive layer 46 decreases due to the presence of the contact portions CP having the respective second thickness t2.

Figure 21:
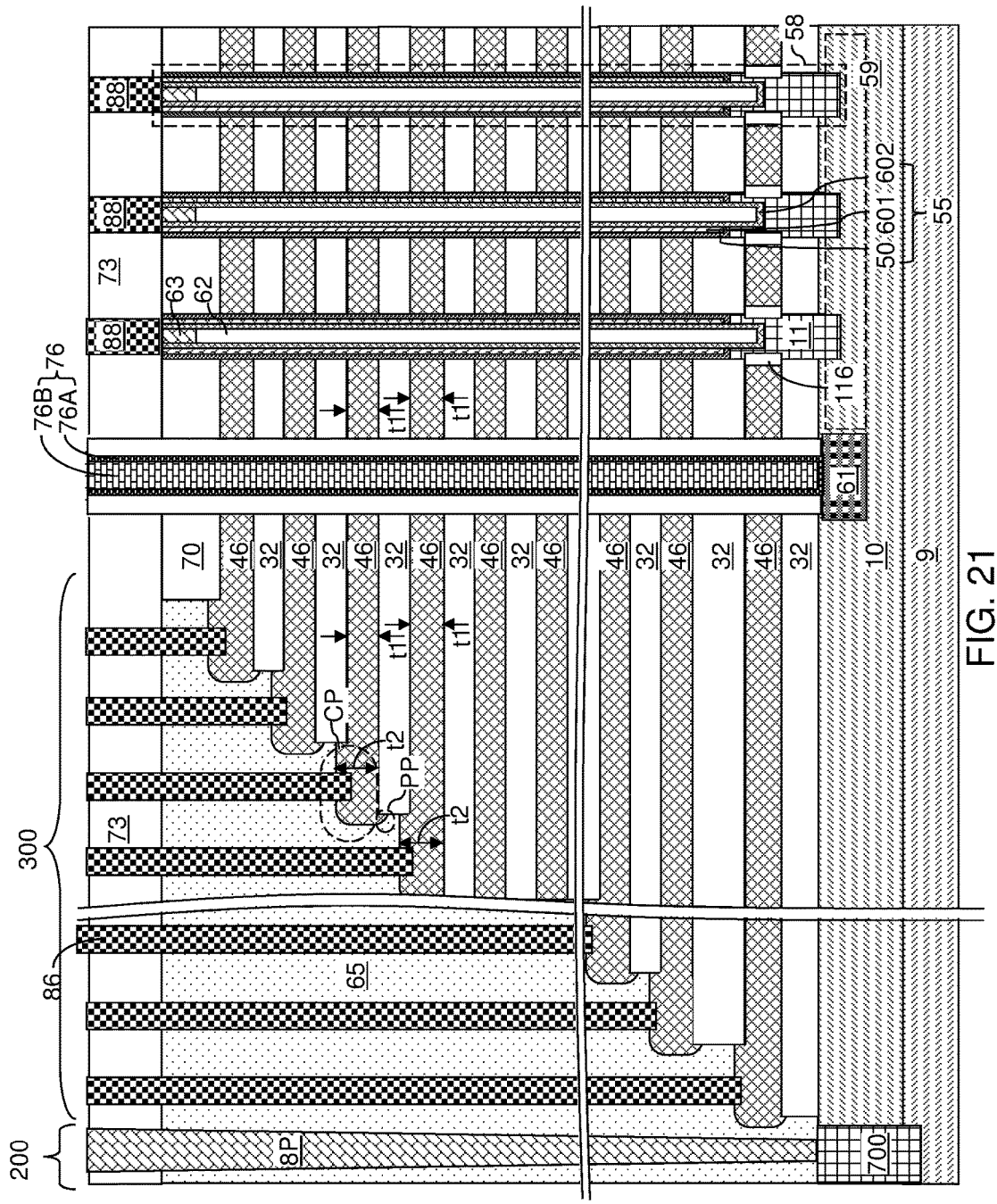
FIG. 21 is a schematic vertical cross-sectional view of an alternative embodiment of the second exemplary structure.

Referring to FIG. 21, an alternative embodiment of the second exemplary structure is illustrated, which is derived from the second exemplary structure by omitting formation of the backside blocking dielectric layer 44. In this case, the conductive material layers 46 can directly contact the bottom surfaces and sidewall surfaces of the retro-stepped dielectric material portion 65. The interface between the conductive material layers 46 and the retro-stepped dielectric material portion 65 can include horizontal surfaces and vertical surfaces, and can additionally include curved surfaces, tapered surfaces, or faceted surfaces. The electrically conducive layers can contact upper portions and lower portions of the distal sidewalls of the insulating layers 32, and the retro-stepped dielectric material portion 65 can contact middle portions of the distal sidewalls of the insulating layers 32. Each of the electrically conductive layers (46, 146) can optionally include a peripheral portion PP that contacts a sidewall of an underlying one of the insulating layers 32.

Figure 22:
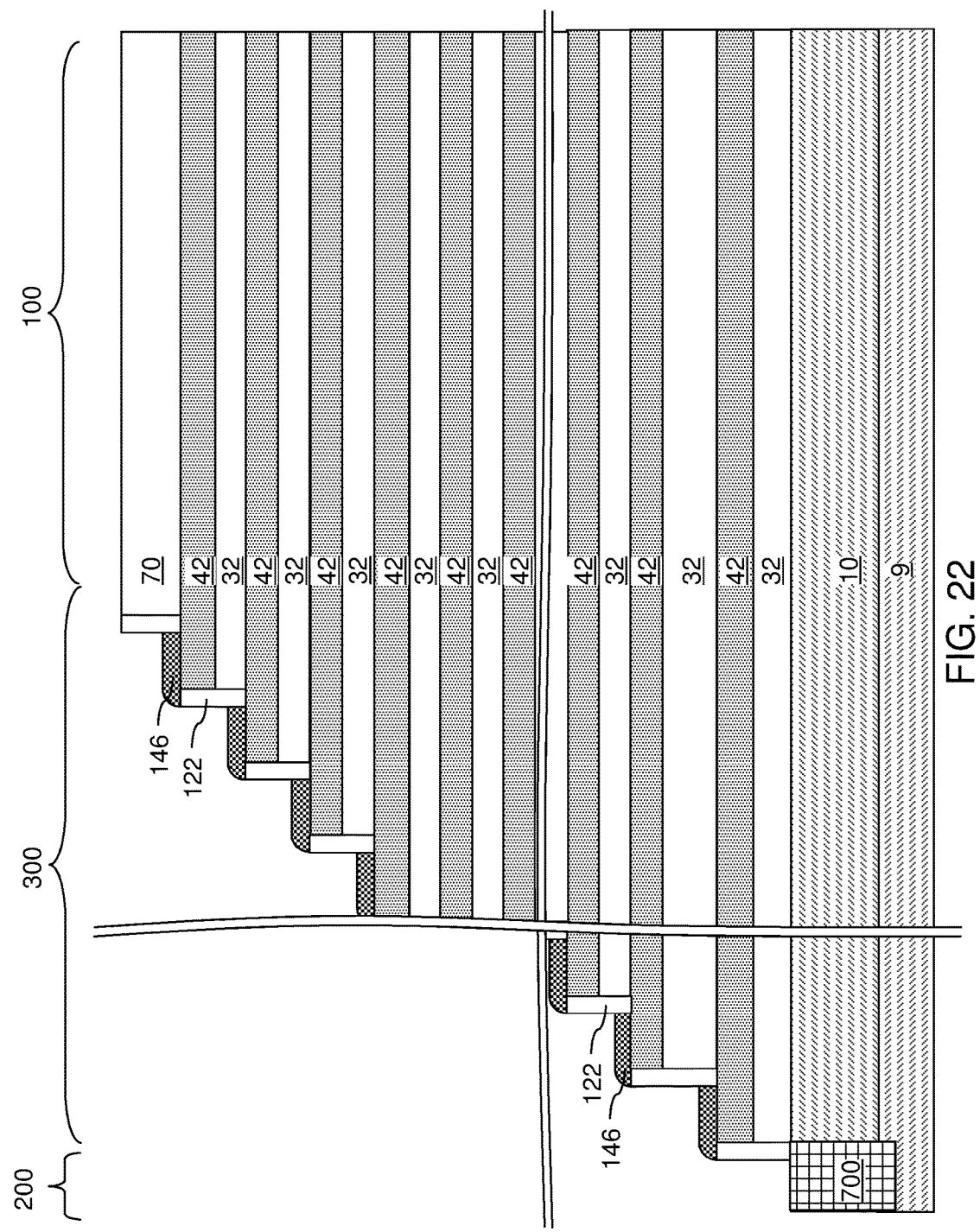
FIG. 22 is a schematic vertical cross-sectional view of a third exemplary structure after formation of dielectric spacers and self-aligned conductive material portions according to a third embodiment of the present disclosure.

Referring to FIG. 22, a third exemplary structure according to a third embodiment of the present disclosure can be derived from the first exemplary structure of FIG. 5 by selectively growing self-aligned conductive (e.g., metal) material portions 146 instead of the silicon nitride self-aligned material portions 142 of the first embodiment. Referring to FIG. 22, the self-aligned conductive material portions 146 are formed on physically exposed surfaces of the sacrificial material layers 42 in the terrace region employing a selective deposition process. Each self-aligned conductive material portion 146 is a self-aligned material portion comprising, and/or consisting essentially of, a conductive material. In the third embodiment, the sacrificial material layers 42 can comprise silicon nitride, the dielectric spacers 122 can comprise silicon oxide or a dielectric metal oxide, and the selective deposition process deposits the self-aligned conductive material portions 146 from silicon nitride surfaces of the sacrificial material layers 42 without growing any conductive material portion from the surfaces of the dielectric spacers 122. In this case, an incubation time difference for deposition of the conductive material between the silicon nitride surfaces of the sacrificial material layers 42 and the surfaces of the dielectric spacers 122 can be employed to induce deposition of the self-aligned conductive material portions 146 from silicon nitride surfaces of the sacrificial material layers 42 without growing the conductive material from surfaces of the dielectric spacers 122. The self-aligned conductive material portions 146 can be formed on top surfaces of the dielectric spacers 122 as the deposited conductive material laterally grows over the top surface of the dielectric spacers 122.

The conductive material deposited by the selective deposition process is selected such that the incubation time for nucleation of the conductive material on silicon nitride surfaces is less than the incubation time for nucleation of the conductive material on the surfaces of the dielectric spacers 122, which can have silicon oxide surfaces or dielectric metal oxide surfaces. In one embodiment, the conductive material can be a metal, i.e., the self-aligned conductive material portions 146 can include metallic material portions. For example, ruthenium can be deposited in a selective deposition process on silicon nitride surfaces without deposition on silicon oxide surfaces. The selective deposition process for depositing ruthenium can be an atomic layer deposition process employing $RuO_4$ as a ruthenium-containing precursor gas and a hydrogen-containing gas (such as $H_2$) as a reduction agent. In this case, the ruthenium-containing precursor gas and the hydrogen-containing gas can be flowed alternately to deposit metallic ruthenium. Other metals can be deposited as the self-aligned conductive material portions 146 provided that the deposition process provides an incubation time differential between the material of the sacrificial material layers 42 and the material of the dielectric spacers 122. The duration of the selective deposition process can be selected to be less than the incubation time for the conductive material on the surfaces of the dielectric spacers 122, thereby avoiding growth of the conductive material from the surfaces of the dielectric spacers 122. Optionally, an etch back process may be performed to remove any nucleation of the conductive material on the surfaces of the dielectric spacers 122. Optionally, a deposition step and an etch back step may be repeated multiple times to deposit the self-aligned conductive material portions 146. The thickness of the self-aligned conductive material portions 146 may be in a range from 1 nm to 20 nm, such as from 2 nm to 15 nm and/or from 5 nm to 10 nm, although lesser and greater thicknesses can also be employed.

Figure 23:
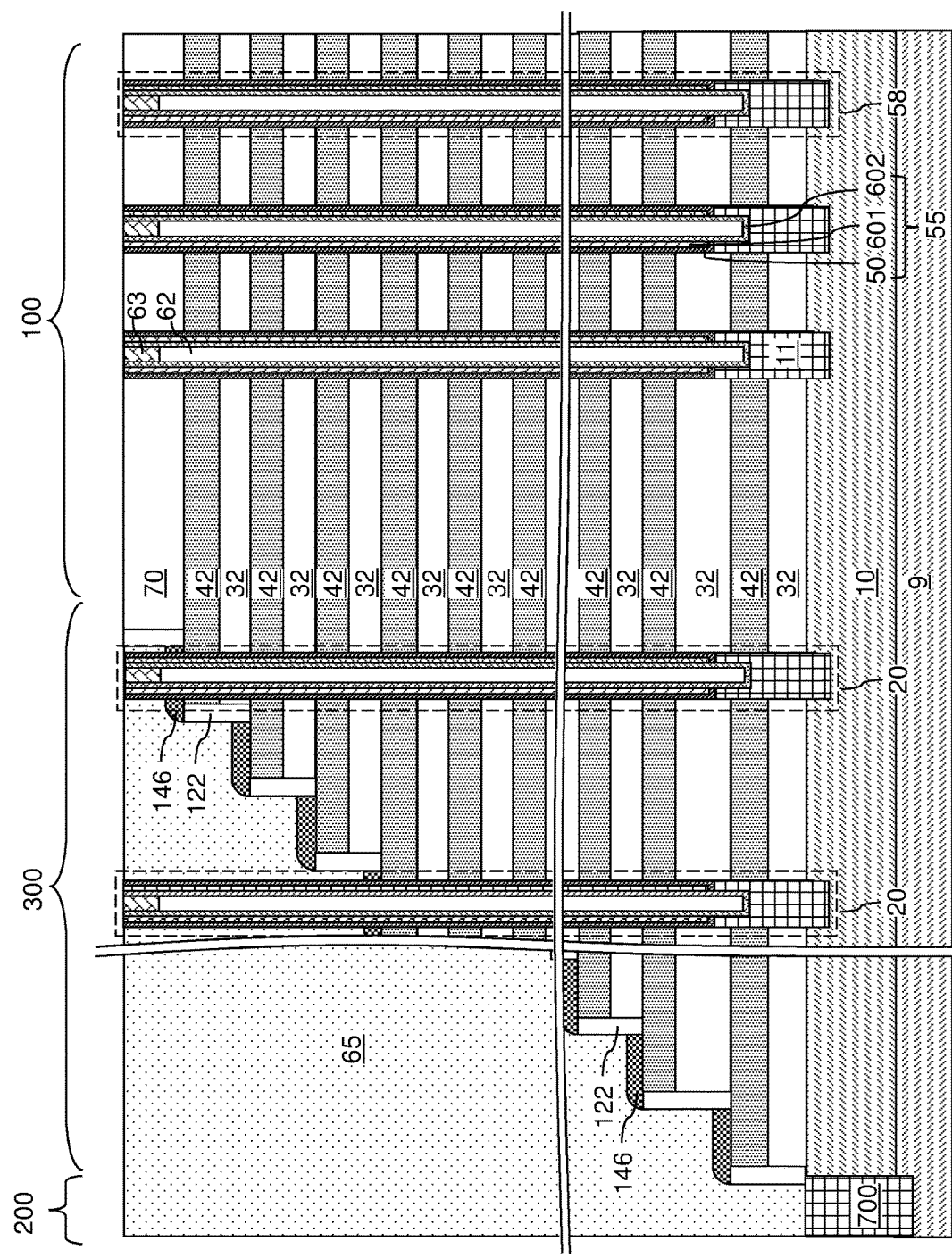
FIG. 23 is a schematic vertical cross-sectional view of the third exemplary structure after formation of memory stack structures and support pillar structures according to the third embodiment of the present disclosure.

Referring to FIG. 23, the processing steps of FIGS. 7, 8A, 8B, and 9A-9H can be performed to form a retro-stepped dielectric material portion 65, an array of memory opening fill structures 58, and support pillar structures 20. The retro-stepped dielectric material portion 65 can contact sidewalls of the dielectric spacers 122 and top surfaces of the self-aligned conductive material portions 146. In one embodiment, at least one of the support pillar structures 20 can vertically extend through only one of the self-aligned conductive material portions 146. Alternatively or additionally, at least one of the support pillar structures 20 can vertically extend through a respective pair of the self-aligned conductive material portions 146.

Figure 24:
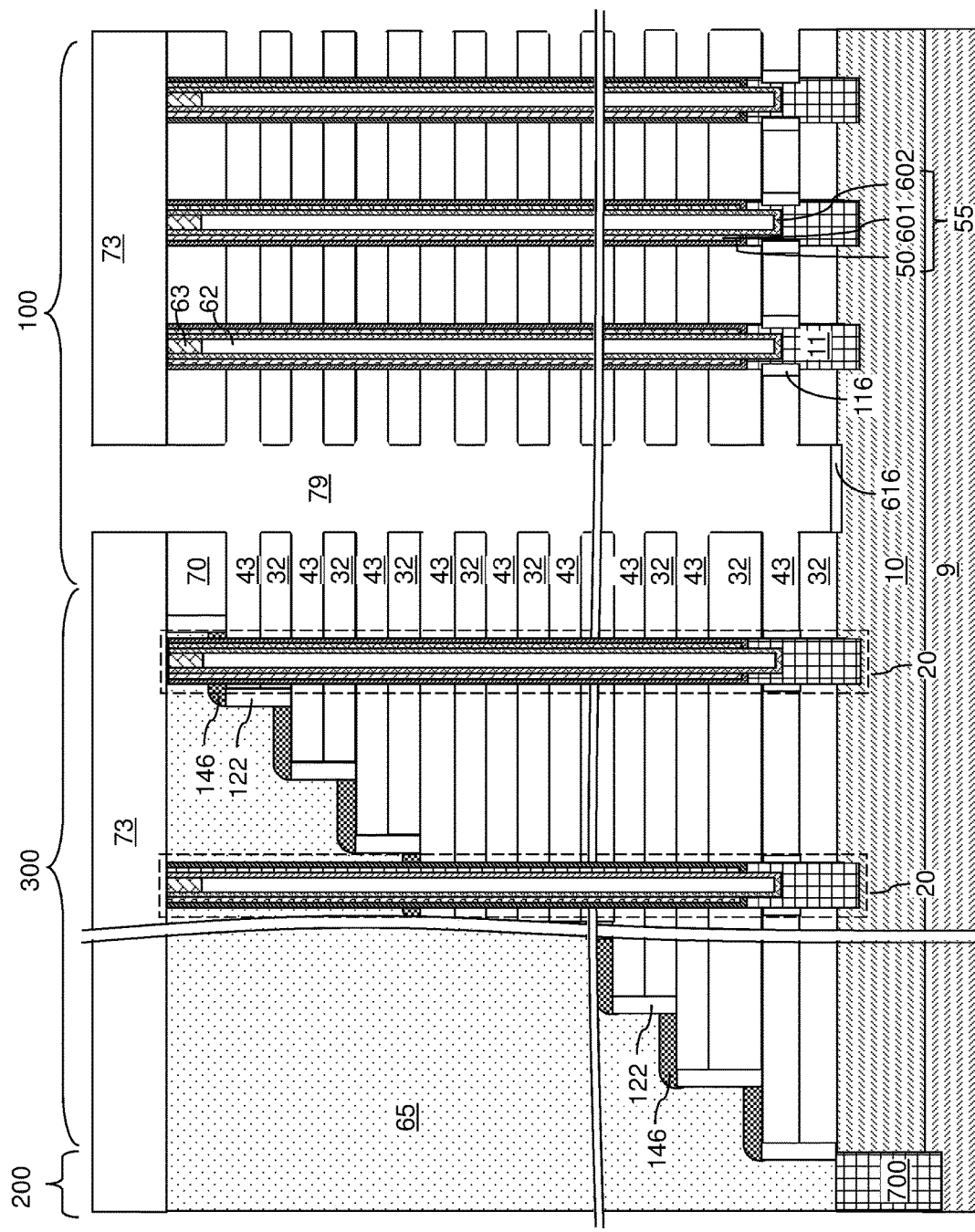
FIG. 24 is a schematic vertical cross-sectional view of the third exemplary structure after formation of backside recesses according to the third embodiment of the present disclosure.

Referring to FIG. 24, the processing steps of FIGS. 11A, 11B, and 12 can be performed to form backside trenches 79 and backside recesses 43. The backside trenches 79 can have the same pattern as in the first and second embodiments. During formation of the backside recesses 43, an etchant that selectively etches the second material of the sacrificial material layers 42 with respect to the first material of the insulating layers 32 and with respective to the conductive material of the self-aligned conductive material portions 146 can be introduced into the backside trenches 79, for example, employing a wet etch process. Backside recesses 43 are formed in volumes from which the sacrificial material layers 42 are removed. The removal of the second material of the sacrificial material layers 42 can be selective to the first material of the insulating layers 32, the material of the self-aligned conductive material portions 146, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, the self-aligned conductive material portions 146, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. A plurality of backside recesses 43 can be formed in the volumes from which the second material of the sacrificial material layers 42 is removed. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616 in the same manner as in the first embodiment.

Figure 25:
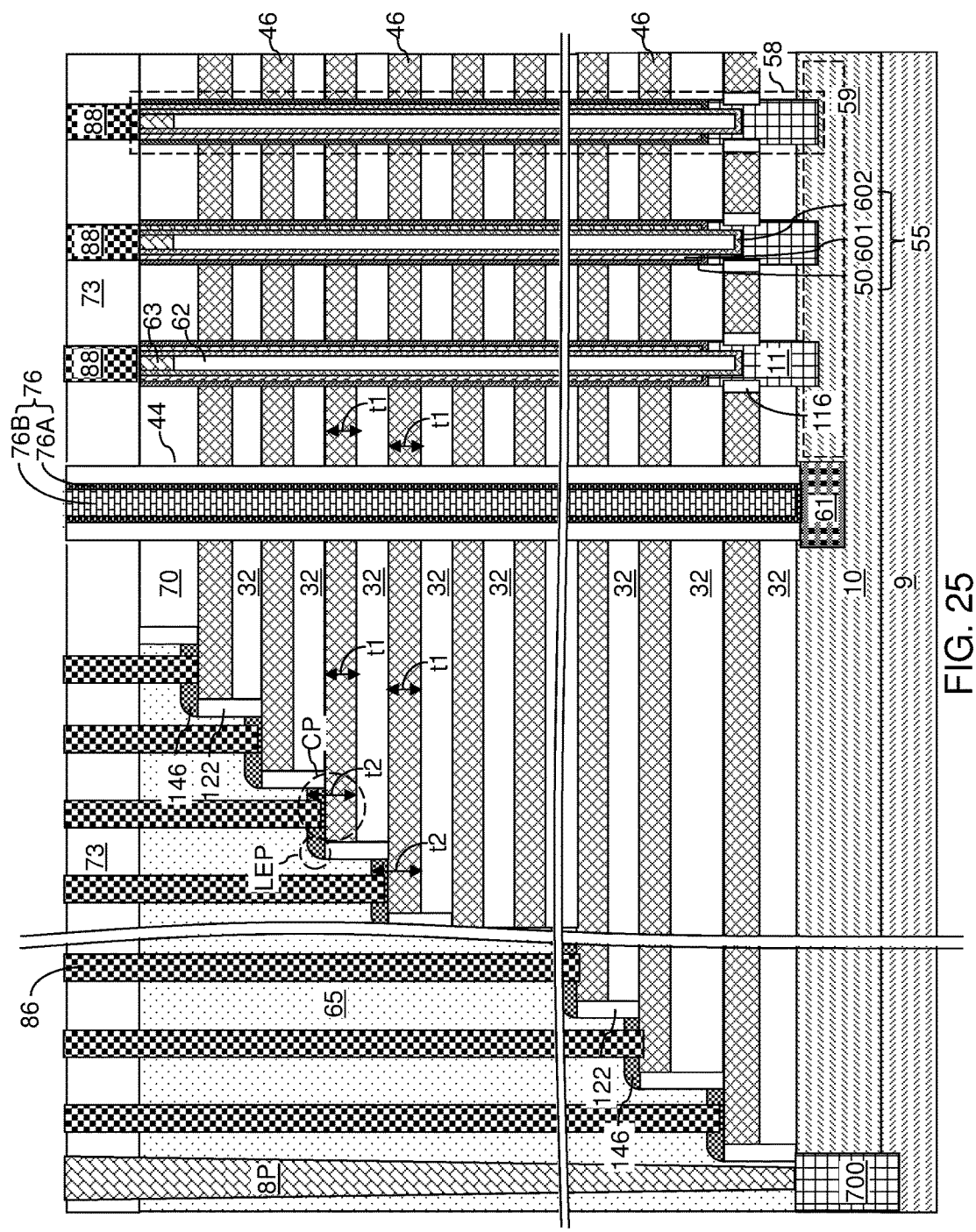
FIG. 25 is a schematic vertical cross-sectional view of the third exemplary structure after formation of conductive material layers, formation of an insulating spacer and a backside contact structure, and formation of additional contact via structures according to the third embodiment of the present disclosure.

Referring to FIG. 25, the processing steps of FIGS. 13C-13D, 14A, 14B, 15A, 15B, 16A, and 16B can be performed to form conductive material layers 46, insulating spacers 74, backside contact structures 76, drain contact via structures 88, word line contact via structures 86, and peripheral device contact via structures 8P. Formation of the backside blocking dielectric layer 44, which corresponds to the processing steps of FIG. 13B, can be omitted. In this case, the conductive material layers 46 can be formed directly on the inner (proximal) sidewalls of the dielectric spacers 122 and directly on bottom surfaces of the self-aligned conductive material portions 146. Each combination of a conductive material layer 46 and a self-aligned conductive material portion 146 adjoined thereto constitutes an electrically conductive layer (46, 146). Each electrically conductive layer (46, 146) can function as a word line integrated with control gate electrodes for NAND arrays, a source select gate electrode, or a drain select gate electrode.

The word line contact via structures 86 can be formed on electrically conductive layers (46, 146) through the contact level dielectric layer 73, and through the retro-stepped dielectric material portion 65. Each of the electrically conductive layers (46, 146) can have a respective first thickness t1 throughout the memory array region 100 and a respective segment of the contact region 300 and includes a contact portion CP having a respective second thickness t2 that is greater than the respective first thickness t1 within the terrace region. The contact portion CP is a distal end portion of each electrically conductive layer (46, 146) that is distal from the memory array region 100. Each of the electrically conductive layers (46, 146) includes a laterally extending portion LEP adjoined to the contact portion and having a lesser thickness than the respective first thickness t1 and overlying a respective one of the dielectric spacers 122.

The increased thickness of the contact portions CP with respect to the segments of the electrically conductive layers (46, 146) located in the memory array region 100 decreases the likelihood that the electrically conductive layers (46, 146) are etched through by the contact via cavities during the isotropic etch that forms the contact via cavities. Thus, the probability of electrically shorting multiple electrically conducive layers by a word line contact via structure 86 that extends through an overlying electrically conductive layer (46, 146), an insulating layer 32, and an underlying electrically conductive layer (46, 146) decreases due to the presence of the self-aligned conductive material portions 146 in the contact portions CP. The difference between the second thickness t2 and the first thickness t1 at each level of the electrically conductive layers (46, 146) can be the thickness of each self-aligned conductive material portion 146.

Figure 26:
FIG. 26 is a schematic vertical cross-sectional view of a fourth exemplary structure after formation of self-aligned conductive material portions according to a fourth embodiment of the present disclosure.

In a fourth embodiment of the present disclosure, the self-aligned conductive material portions may be selectively grown without forming the dielectric spacers 122. Referring to FIG. 26, a fourth exemplary structure according to a fourth embodiment of the present disclosure can be derived from the first exemplary structure of FIG. 3 by performing the processing steps of FIG. 22 without forming the dielectric spacers 122. Alternatively, the fourth exemplary structure can be derived from the third exemplary structure of FIG. 22 by omitting the processing steps for forming the dielectric spacers 122.

A selective deposition process can be performed to grow self-aligned conductive material portions 246 from physically exposed portions of the top surfaces and from the distal sidewalls of the sacrificial material layers 42 in the terrace region. The self-aligned conductive material portions 246 can grow from a top surface and a sidewall surface of each of the sacrificial material portions 42. The selective deposition process can be the same as in the third embodiment. In the fourth embodiment, the sacrificial material layers 42 can comprise silicon nitride, the insulating layers 32 can comprise silicon oxide, and the selective deposition process deposits self-aligned conductive material portions 246 from the silicon nitride surfaces of the sacrificial material layers 42 without growing conductive material (e.g., metal) from silicon oxide surfaces of the insulating layers 32. In this case, an incubation time difference for deposition of the conductive material between the silicon nitride surfaces of the sacrificial material layers 42 and the silicon oxide surfaces of the insulating layers 32 can be employed to induce growth of the self-aligned conductive material portions 246 from silicon nitride surfaces of the sacrificial material layers 42 without growing the conductive material from silicon oxide surfaces of the insulating layers 32. The self-aligned conductive material portions 246 can cover all surfaces of the sacrificial material layers 242 in the terrace region, and a lower portion of each sidewall of the insulating layers 32 other than the bottommost one of the insulating layers 32 in the terrace region, and optionally an upper portion of each sidewall of the insulating layers 32 in the terrace region. In one embodiment, the self-aligned conductive material portions 246 can comprise, and/or consist essentially of, ruthenium.

The duration of the selective deposition process can be selected to be less than the incubation time for the conductive material on the surfaces of the insulating layers 32, the insulating cap layer 70, and the physically exposed surfaces in the peripheral device region 700 (such as physically exposed surfaces of the planarization dielectric layer 770), thereby avoiding growth of conductive material (e.g., metal) from the surfaces of the insulating layers 32, the insulating cap layer 70, and the physically exposed surfaces in the peripheral device region 700. Optionally, an etch back process may be performed to remove any nucleation of the conductive material on the surfaces of the insulating layers 32, the insulating cap layer 70, and the physically exposed surfaces in the peripheral device region 700. Optionally, a deposition step and an etch back step may be repeated multiple times to deposit the self-aligned conductive material portions 246. The thickness of the self-aligned conductive material portions 246 may be in a range from 1 nm to 20 nm, such as from 2 nm to 15 nm and/or from 5 nm to 10 nm, although lesser and greater thicknesses can also be employed.

Figure 27:
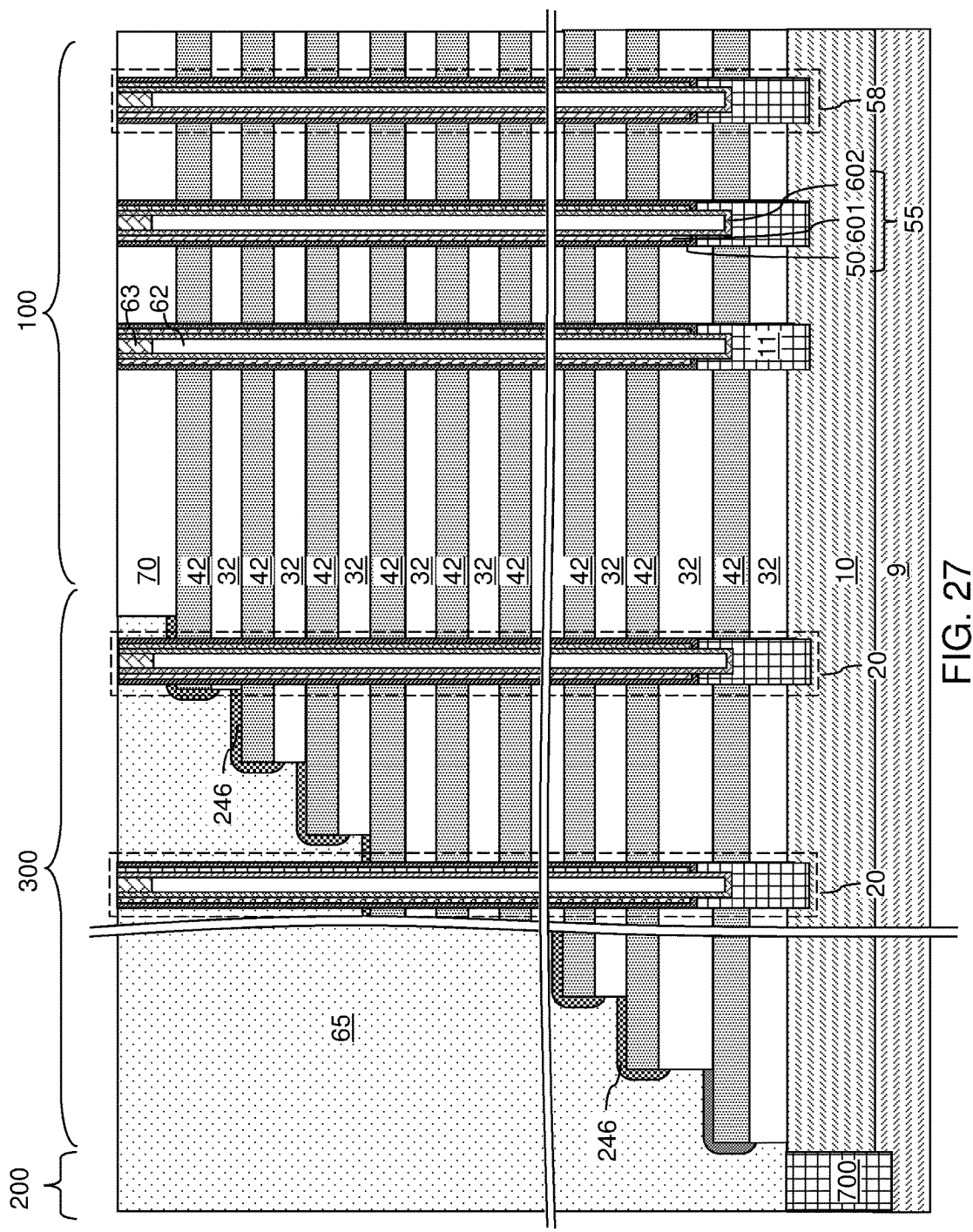
FIG. 27 is a schematic vertical cross-sectional view of the fourth exemplary structure after formation of memory stack structures and support pillar structures according to the fourth embodiment of the present disclosure.

Referring to FIG. 27, the processing steps of FIGS. 7, 8A, 8B, and 9A-9H can be performed to form a retro-stepped dielectric material portion 65, an array of memory opening fill structures 58, and support pillar structures 20. The retro-stepped dielectric material portion 65 can contact a portion of a distal sidewall of each insulating layer 32, and top surfaces and sidewall surfaces of the self-aligned conductive material portions 246. In one embodiment, at least one of the support pillar structures 20 can vertically extend through only one of the self-aligned conductive material portions 246. Alternatively or additionally, at least one of the support pillar structures 20 can vertically extend through a respective pair of the self-aligned conductive material portions 246.

Figure 28:
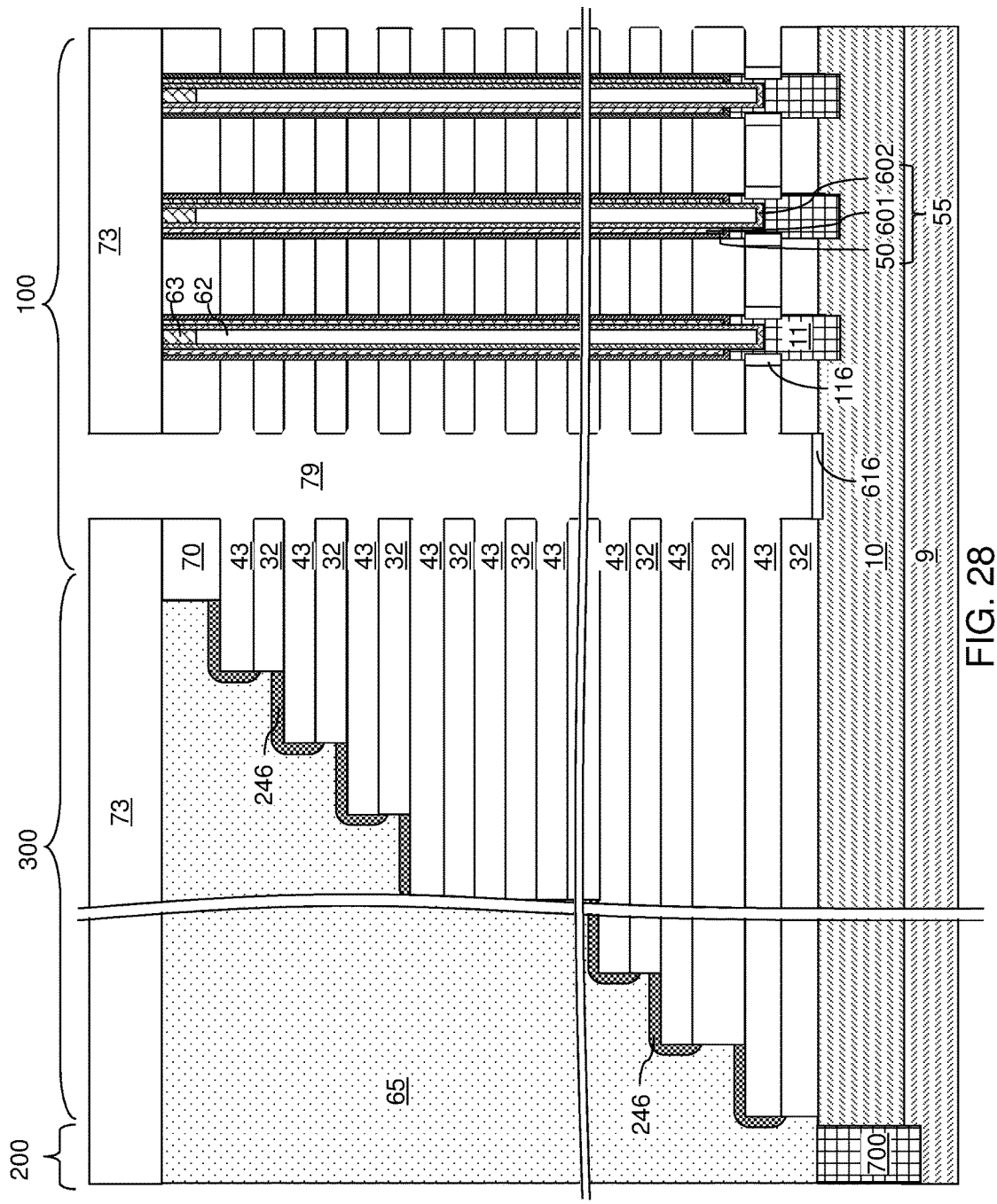
FIG. 28 is a schematic vertical cross-sectional view of the fourth exemplary structure after formation of backside recesses according to the fourth embodiment of the present disclosure.

Referring to FIG. 28, the processing steps of FIGS. 11A, 11B, and 12 can be performed to form backside trenches 79 and backside recesses 43. The backside trenches can have the same pattern as in the first through third embodiments. During formation of the backside recesses 43, an etchant that selectively etches the second material of the sacrificial material layers 42 with respect to the first material of the insulating layers 32 and with respective to the conductive material of the self-aligned conductive material portions 246 can be introduced into the backside trenches 79, for example, employing a wet etch process. Backside recesses 43 are formed in volumes from which the sacrificial material layers 42 are removed. The removal of the second material of the sacrificial material layers 42 can be selective to the first material of the insulating layers 32, the material of the self-aligned conductive material portions 246, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, the self-aligned conductive material portions 246, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. A plurality of backside recesses 43 can be formed in the volumes from which the second material of the sacrificial material layers 42 is removed. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616 in the same manner as in the first embodiment.

Figure 29:
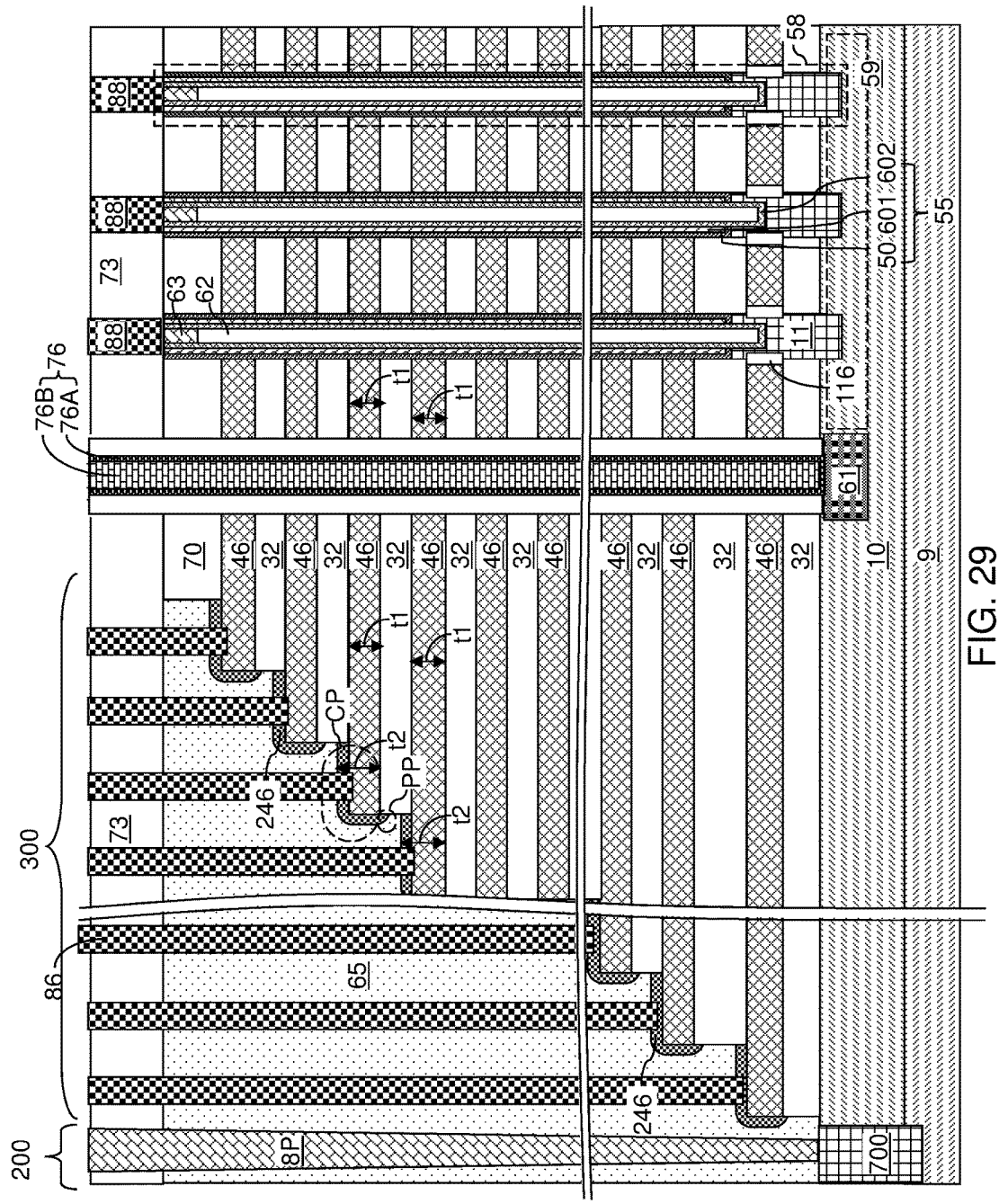
FIG. 29 is a schematic vertical cross-sectional view of the fourth exemplary structure after formation of conductive material layers, formation of an insulating spacer and a backside contact structure, and formation of additional contact via structures according to the fourth embodiment of the present disclosure.

Referring to FIG. 29, the processing steps of FIGS. 13C-13D, 14A, 14B, 15A, 15B, 16A, and 16B can be performed to form conductive material layers 46, insulating spacers 74, backside contact structures 76, drain contact via structures 88, word line contact via structures 86, and peripheral device contact via structures 8P. Formation of the backside blocking dielectric layer 44, which corresponds to the processing steps of FIG. 13B, can be omitted. In this case, the conductive material layers 46 can be formed directly on a sidewall and a bottom surface of each self-aligned conductive material portion 246. Each combination of a conductive material layer 46 and a self-aligned conductive material portion 246 adjoined thereto constitutes an electrically conductive layer (46, 246). Each electrically conductive layer (46, 246) can function as a word line integrated with control gate electrodes for NAND arrays, a source select gate electrode, or a drain select gate electrode.

The word line contact via structures 86 can be formed on electrically conductive layers (46, 246) through the contact level dielectric layer 73, and through the retro-stepped dielectric material portion 65. Each of the electrically conductive layers (46, 246) can have a respective first thickness t1 throughout the memory array region 100 and a respective segment of the contact region 300 and includes a contact portion CP having a respective second thickness t2 that is greater than the respective first thickness t1 within the terrace region. The contact portion CP is a distal end portion of each electrically conductive layer (46, 246) that is distal from the memory array region 100. Each of the electrically conductive layers (46, 246) can optionally include a peripheral portion PP that contacts a sidewall of an underlying one of the insulating layers 32.

The increased thickness of the contact portions CP with respect to the segments of the electrically conductive layers (46, 246) located in the memory array region 100 decreases the likelihood that the electrically conductive layers (46, 246) are etched through by the contact via cavities during the isotropic etch that forms the contact via cavities. Thus, the probability of electrically shorting multiple electrically conducive layers by a word line contact via structure 86 that extends through an overlying electrically conductive layer (46, 246), an insulating layer 32, and an underlying electrically conductive layer (46, 246) decreases due to the presence of the self-aligned conductive material portions 246 in the contact portions CP. The difference between the second thickness t2 and the first thickness t1 at each level of the electrically conductive layers (46, 246) can be the thickness of each self-aligned conductive material portion 246.

Figure 30:
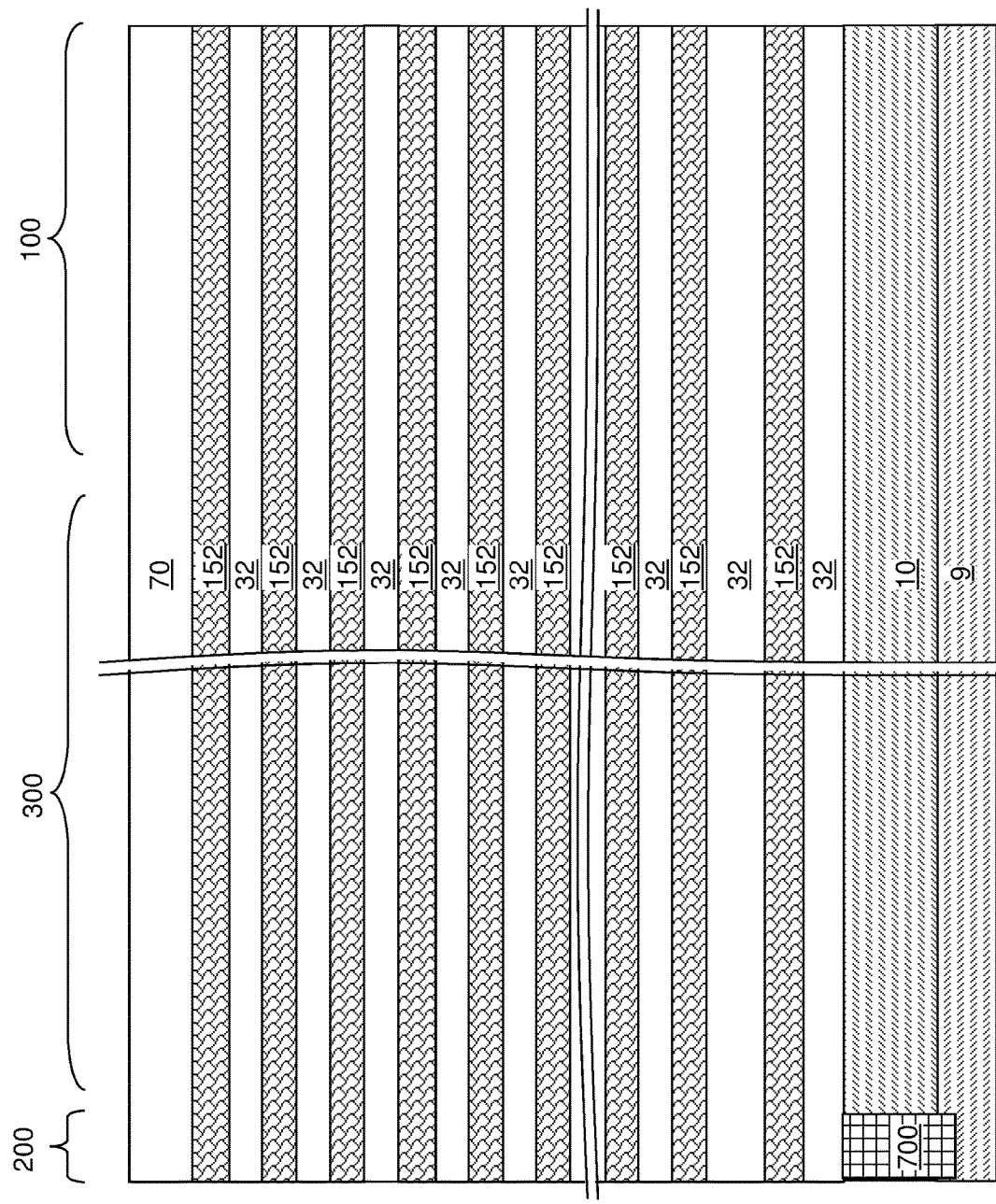
FIG. 30 is a schematic vertical cross-sectional view of a fifth exemplary structure after formation of an alternating stack of insulating layers and semiconductor material layers according to a fifth embodiment of the present disclosure.

Referring to FIG. 30, a fifth exemplary structure according to a fifth embodiment of the present disclosure can be derived from the first exemplary structure of FIG. 1 by forming an alternating stack of insulating layers 32 and semiconductor material layers 152 over the substrate (9, 10). The semiconductor material layers 152 are used instead of the sacrificial material layers 42 in the alternating stack (32, 42) of the first through fourth embodiments. An insulating cap layer 70 can be subsequently formed over the alternating stack of insulating layers 32 and semiconductor material layers 152.

The semiconductor material layers 152 includes a semiconductor material such as a Group IV elemental semiconductor material such as silicon or germanium, an alloy of at least two Group IV elemental semiconductor materials, or a compound semiconductor material such as a III-V compound semiconductor material. In one embodiment, the semiconductor material layers 152 can include silicon or a silicon-germanium alloy. The semiconductor material layers 152 can be amorphous or polycrystalline. The semiconductor material layers 152 may be intrinsic, p-doped, or n-doped.

The semiconductor material layers 152 can be formed by plasma enhanced chemical vapor deposition. The thicknesses of the insulating layers 32 and the semiconductor material layers 152 can be in a range from 20 nm to 50 nm, although lesser and greater thicknesses can be employed for each insulating layer 32 and for each semiconductor material layer 152. The number of repetitions of the pairs of an insulating layer 32 and a semiconductor material layer 152 can be in a range from 2 to 1,024, and typically from 8 to 256, although a greater number of repetitions can also be employed. In one embodiment, each semiconductor material layer 152 in the alternating stack (32, 152) can have a uniform thickness that is substantially invariant within each respective semiconductor material layer 152.

Figure 31:
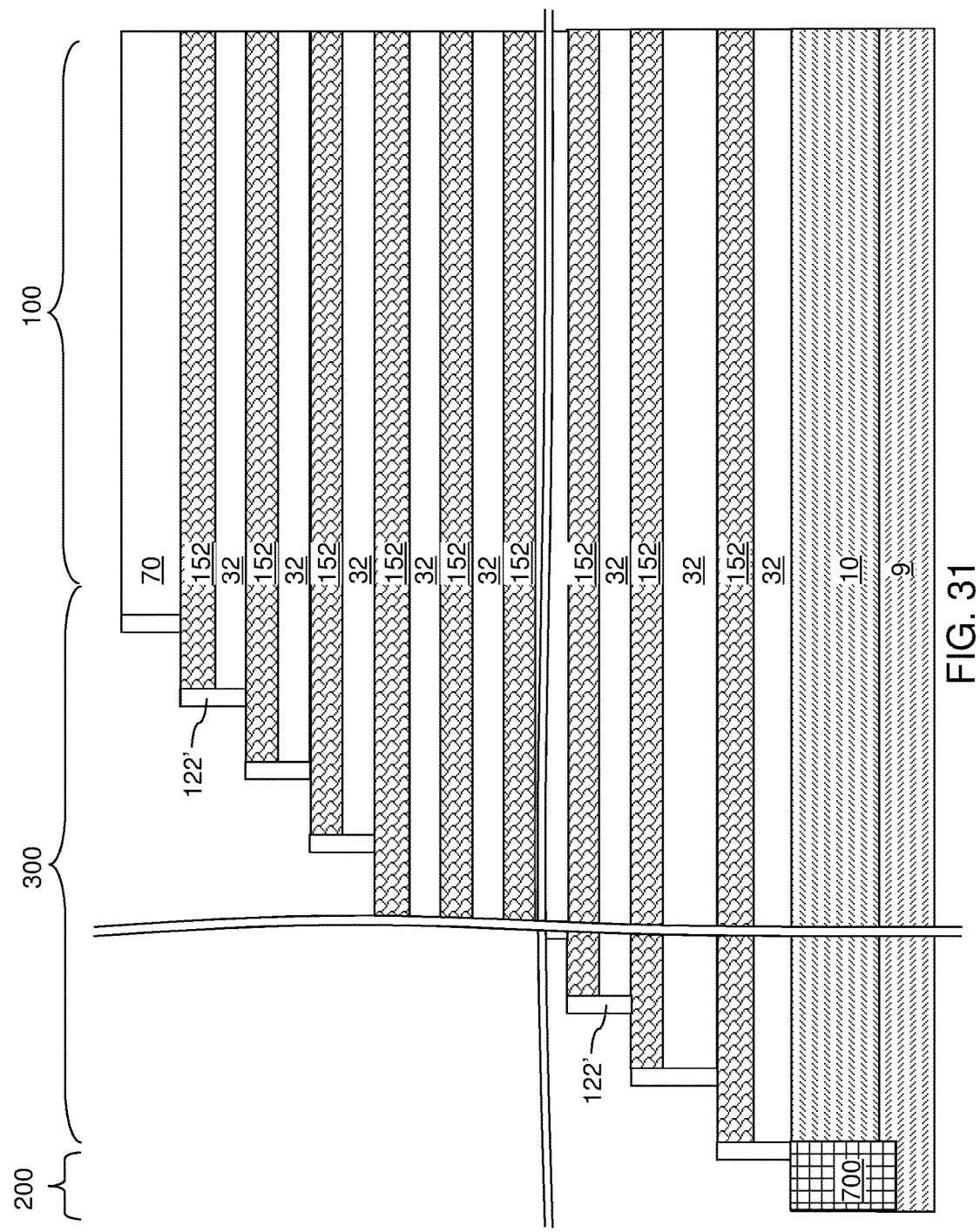
FIG. 31 is a schematic vertical cross-sectional view of the fifth exemplary structure after formation of dielectric spacers according to the fifth embodiment of the present disclosure.

Referring to FIG. 31, a stepped cavity can be formed within the contact region 300 which is located between the memory array region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. After formation of the stepped cavity, a peripheral portion of the alternating stack (32, 152) can have stepped surfaces after formation of the stepped cavity.

A terrace region is formed within the contact region 300 by formation of the stepped cavity. Each semiconductor material layer 152 other than a topmost semiconductor material layer 152 within the alternating stack (32, 152) laterally extends farther than any overlying semiconductor material layer 152 within the alternating stack (32, 152). The terrace region includes stepped surfaces of the alternating stack (32, 152) that continuously extend from a bottommost layer within the alternating stack (32, 152) to a topmost layer within the alternating stack (32, 152). The semiconductor material layers 152 have a respective lateral extent that decreases as a function of a vertical distance from the substrate (9, 10) in the terrace region.

A conformal dielectric layer is formed on the stepped surfaces of the alternating stack (32, 152) in the terrace region, over the insulating cap layer 70, and over physically exposed surfaces in the peripheral device region 200. The conformal dielectric layer includes a dielectric material that is different from the material of the semiconductor material layers 152. In the fifth embodiment, the conformal dielectric layer can include any dielectric material such as silicon oxide, silicon nitride, or a dielectric metal oxide. The conformal dielectric layer can be deposited by a conformal deposition process such as chemical vapor deposition or atomic layer deposition. The thickness of the conformal dielectric layer can have a thickness in a range from 3 nm to 30 nm, such as from 5 nm to 10 nm, although lesser and greater thicknesses can also be employed.

An anisotropic etch process can be performed to remove horizontal portions of the conformal dielectric layer. Horizontal surfaces of the semiconductor material layers 152 can be employed as stopping surfaces for the anisotropic etch process. Each remaining vertical portion of the conformal dielectric layer constitutes a dielectric spacer 122'. The dielectric spacers 122' are formed on sidewalls of vertically neighboring pairs of an insulating layer 32 and an overlying semiconductor material layer 152. As such, each dielectric spacer 122' contacts vertically coincident sidewalls of a neighboring pair of an underlying insulating layer 32 and an overlying semiconductor material layer 152. In one embodiment, more than 90% of the area of each sidewall of the semiconductor material layers in the terrace region may be contacted by a respective one of the dielectric spacers 122'. 100% of the area of each sidewall of the insulating layers 32 in the terrace region can be contacted by a respective one of the dielectric spacers 122'.

Figure 32:
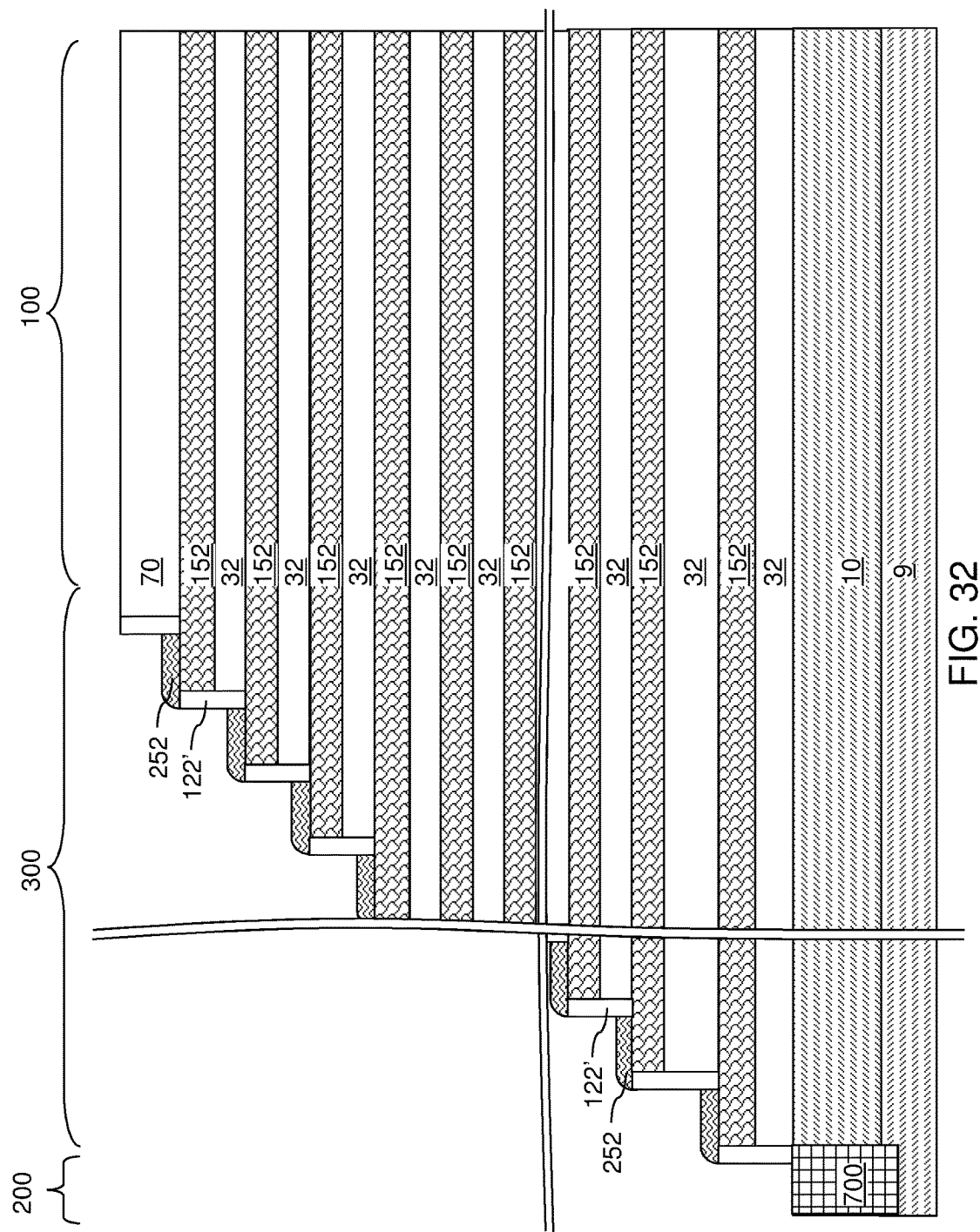
FIG. 32 is a schematic vertical cross-sectional view of the fifth exemplary structure after formation of self-aligned semiconductor material portions according to the fifth embodiment of the present disclosure.

Referring to FIG. 32, self-aligned semiconductor material portions 252 are formed on physically exposed surfaces of the semiconductor material layers 152 in the terrace region employing a selective deposition process. The semiconductor material grows from the physically exposed surfaces of the semiconductor material layers 152 and does not grow from surfaces of the insulating layers 32. Each self-aligned semiconductor material portion 252 is a self-aligned material portion comprising, and/or consisting essentially of, a semiconductor material. The semiconductor material of the self-aligned semiconductor material portions 252 may, or may not, have the same composition as the semiconductor material layers 152. Further, the crystalline structure of the semiconductor material of the self-aligned semiconductor material portions 252 may be the same as, or may be different from, the crystalline structure of the semiconductor material layers 152.

In one embodiment, the semiconductor material layers 152 can comprise amorphous silicon or polysilicon, the dielectric spacers 122' can comprise silicon oxide, silicon nitride, or a dielectric metal oxide, and the selective deposition process grows polysilicon or amorphous silicon from the surfaces of the semiconductor material layers 152 without growing any semiconductor material portion from the surfaces of the dielectric spacers 122'.

In this case, the selective deposition process can be a chemical vapor deposition process or an atomic layer deposition process in which a reactant including a semiconductor precursor for depositing a semiconductor material and an etchant for etching the semiconductor material are alternately or concurrently flowed into a process chamber. Exemplary semiconductor precursors include, but are not limited to, silane, dichlorosilane, trichlorosilane, silicon tetrachloride, disilane, and digermane. An exemplary etchant is hydrogen chloride. The process temperature may be in a range from 700 degrees Celsius to 1,050 degrees Celsius, although lower and higher temperatures may also be employed.

Generally, a semiconductor material has a higher deposition rate on surfaces of another semiconductor material than on surfaces of dielectric materials. In the selective deposition process, the etch rate can be selected between the deposition rate on semiconductor surfaces and the deposition rate on the dielectric surfaces. In this case, the deposition rate for the semiconductor material is higher than the etch rate on semiconductor surfaces and the deposition rate for the semiconductor material is lower than the etch rate on dielectric surfaces in the selective deposition process. Thus, the semiconductor material grows only from physically exposed semiconductor surfaces (such as the physically exposed surfaces of the semiconductor material layers 152) and does not grow from the dielectric surfaces (such as the surfaces of the dielectric spacers 122').

The self-aligned semiconductor material portions 252 can be formed on top surfaces of the dielectric spacers 122' as the deposited semiconductor material laterally grows over the top surface of the dielectric spacers 122'. In one embodiment, each of the self-aligned semiconductor material portions 252 can optionally be formed directly on a top surface of a respective first one of the dielectric spacers 122' (i.e., an underlying dielectric spacer 122') and a sidewall of a respective second one of the dielectric spacers 122' (i.e., a dielectric spacer 122' that contacts the underlying semiconductor material layer 152). The thickness of the self-aligned semiconductor material portions 252 may be in a range from 1 nm to 40 nm, such as from 2 nm to 20 nm and/or from 5 nm to 10 nm, although lesser and greater thicknesses can also be employed.

Figure 33:
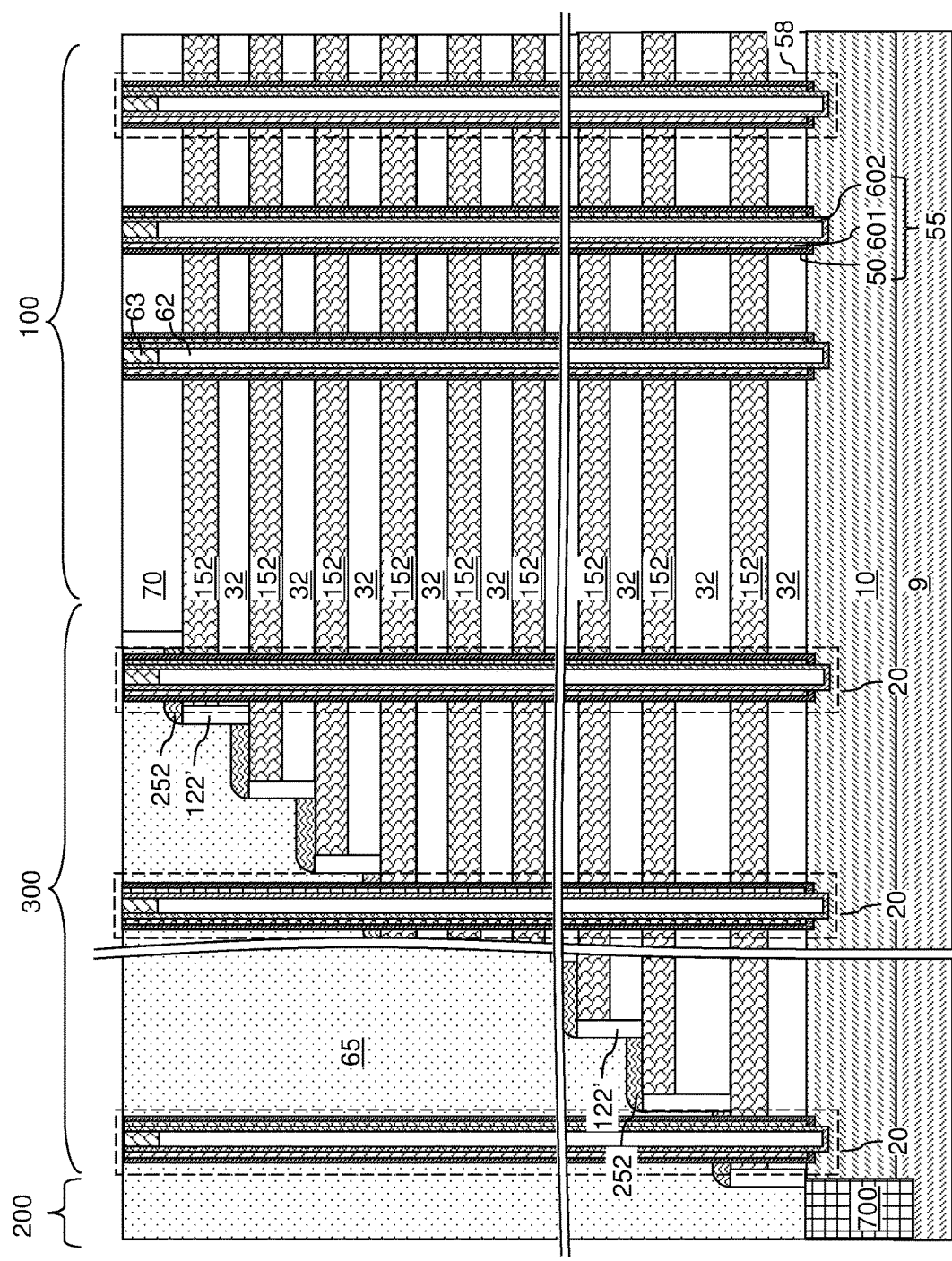
FIG. 33 is a schematic vertical cross-sectional view of the fifth exemplary structure after formation of memory stack structures and support pillar structures according to the fifth embodiment of the present disclosure.

Referring to FIG. 33, the processing steps of FIGS. 7, 8A, 8B, and 9A-9H can be performed to form a retro-stepped dielectric material portion 65, an array of memory opening fill structures 58, and support pillar structures 20. The retro-stepped dielectric material portion 65 can contact sidewalls of the dielectric spacers 122' and top surfaces of the self-aligned semiconductor material portions 252.

In one embodiment, the optional pedestal channel portions 11 may be omitted during formation of the memory opening fill structures 58 and the support pillar structures 20. In one embodiment, at least one of the support pillar structures 20 can vertically extend through only one of the self-aligned semiconductor material portions 252. Alternatively or additionally, at least one of the support pillar structures 20 can vertically extend through a respective pair of the self-aligned semiconductor material portions 252.

Figure 34A:
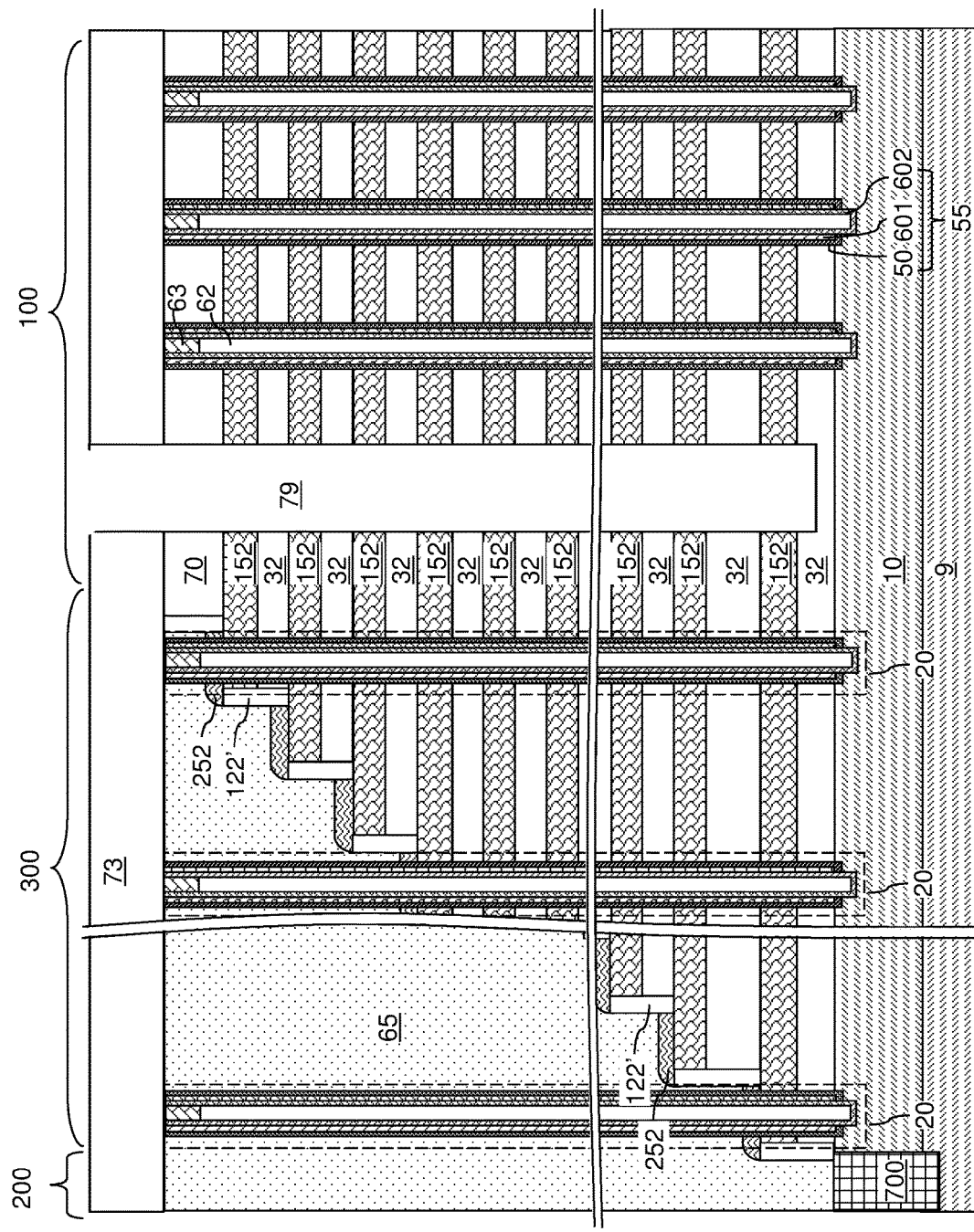
FIG. 34A is a schematic vertical cross-sectional view of the fifth exemplary structure after formation of backside trenches according to the fifth embodiment of the present disclosure.

Referring to FIGS. 34A and 34B, the processing steps of FIGS. 11A and 11B can be performed, with a modification in the etch chemistry to account for the replacement of the sacrificial material layers 42 with the semiconductor material layers 152, to form backside trenches 79 that extend through each layer of the alternating stack (32, 152) except the bottommost one of the insulating layers 32. The pattern of the backside trenches 79 in a plan view can be the same as in the first through fourth embodiments. Not etching through the bottommost one of the insulating layers 32 can protect the semiconductor material layer during a subsequent etch process that removes the semiconductor material layers 152 and the self-aligned semiconductor material portions 252. Alternatively, all layers of the alternating stack (32, 152) can be etched through by an anisotropic etch process to form backside trenches 79, and a dielectric material such as silicon oxide can be selectively anisotropically deposited on the semiconductor material layer 10 by thermal or plasma oxidation. The deposited dielectric material can have a greater thickness at horizontal portions than at vertical portions due to the anisotropic nature of the deposition process. The vertical portions of the deposited dielectric material can be removed, for example, by a recess etch, and a horizontal portion of the deposited dielectric material at the bottom of each backside trench 79 can protect the semiconductor material layer 10 in a subsequent etch process that removes the semiconductor material layers 152 and the self-aligned semiconductor material portions 252.

Figure 35A:
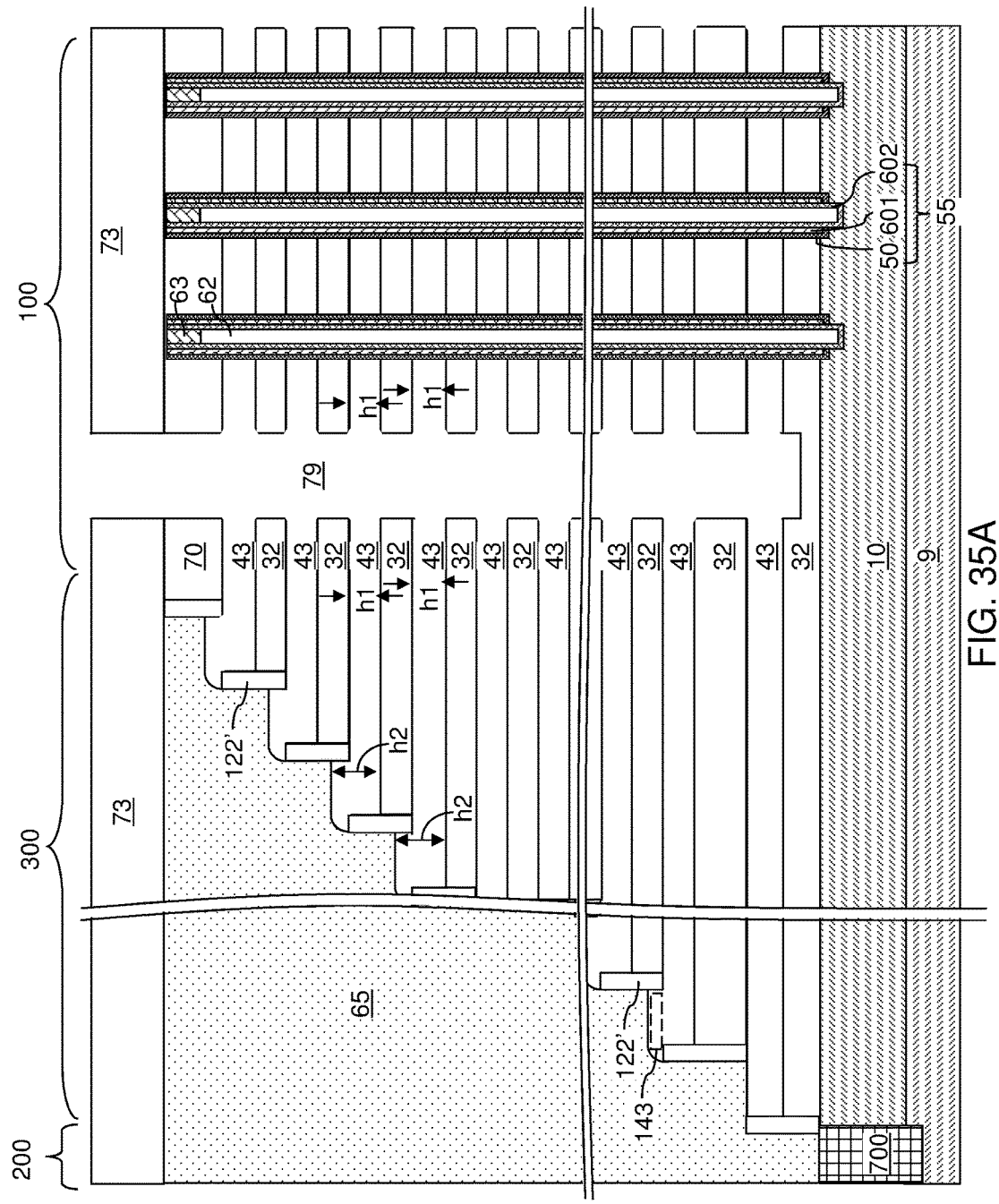
FIG. 35A is a schematic vertical cross-sectional view of the fifth exemplary structure after formation of backside recesses according to the fifth embodiment of the present disclosure.

Referring to FIGS. 35A and 35B, backside recesses 43 can be formed by introducing through the backside trenches 79 an etchant that selectively etches the second material of the semiconductor material layers 152 and the material of the self-aligned semiconductor material portions 252 with respect to the first material of the insulating layers 32, for example, employing a wet etch process. Each backside recess 43 can include a protruding cavity portion 143, which is a volume from which a self-aligned semiconductor material portion 252 is removed. Each protruding cavity portion 143 includes a volume of a respective backside recess 43 that is above a horizontal plane including the interface between the backside recess 43 and the horizontal plane of an overlying one of the insulating layers 32. In one embodiment, each backside recess 43 can have a first portion having a first height h1 throughout, and a second portion having a second height h2. The first portion corresponds to the volume of each backside recess 43 that does not underlie the protruding cavity portion 143 of the backside recess 43. The second portion corresponds to the volume of each backside recess 43 that includes the protruding cavity portion 143 and the underlying segment of the backside recess 43. The second height h2 can be greater than the first height h1 by the thickness of the horizontal portion of a self-aligned material portion 142, which is the height of the corresponding protruding cavity portion 143.

The etch process that removes the semiconductor materials of the semiconductor material layers 152 and the self-aligned semiconductor material portions 252 selective to the first material and the outermost layer of the memory films 50 can be a wet etch process employing a wet etch solution, or can be a gas phase (dry) etch process in which the etchant is introduced in a vapor phase into the backside trenches 79. For example, the etch process can be a wet etch process in which the exemplary structure is immersed within a wet etch tank including an alkali hydroxide solution (such as a KOH solution or an NaOH solution), ethylenediamine pyrocatechol (EDP), trimethyl-2-hydroxyethyl ammonium hydroxide (TMY), or tetramethyl ammonium hydroxide (TMAH). During the wet chemical etch, exposed silicon pattern, for example the portion of the semiconductor material layer 10 exposed at bottom of the backside trench 79, silicon wafer bevel area and backside of the silicon wafer can be protected by a boron implant into the exposed silicon portions or formation of a sacrificial silicon oxide cover layer which is removed after the wet etching step. The support pillar structure 20, the retro-stepped dielectric material portion 65, and the memory stack structures 55 provide structural support while the backside recesses 43 are present within volumes previously occupied by the semiconductor material layers 152 and the self-aligned semiconductor material portions 252.

Each backside recess 43 can be a laterally extending cavity having a lateral dimension that is greater than the vertical extent of the cavity. A plurality of backside recesses 43 can be formed in the volumes from which the second material of the semiconductor material layers 152 is removed. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616 in the same manner as in the first embodiment.

Figure 36A:
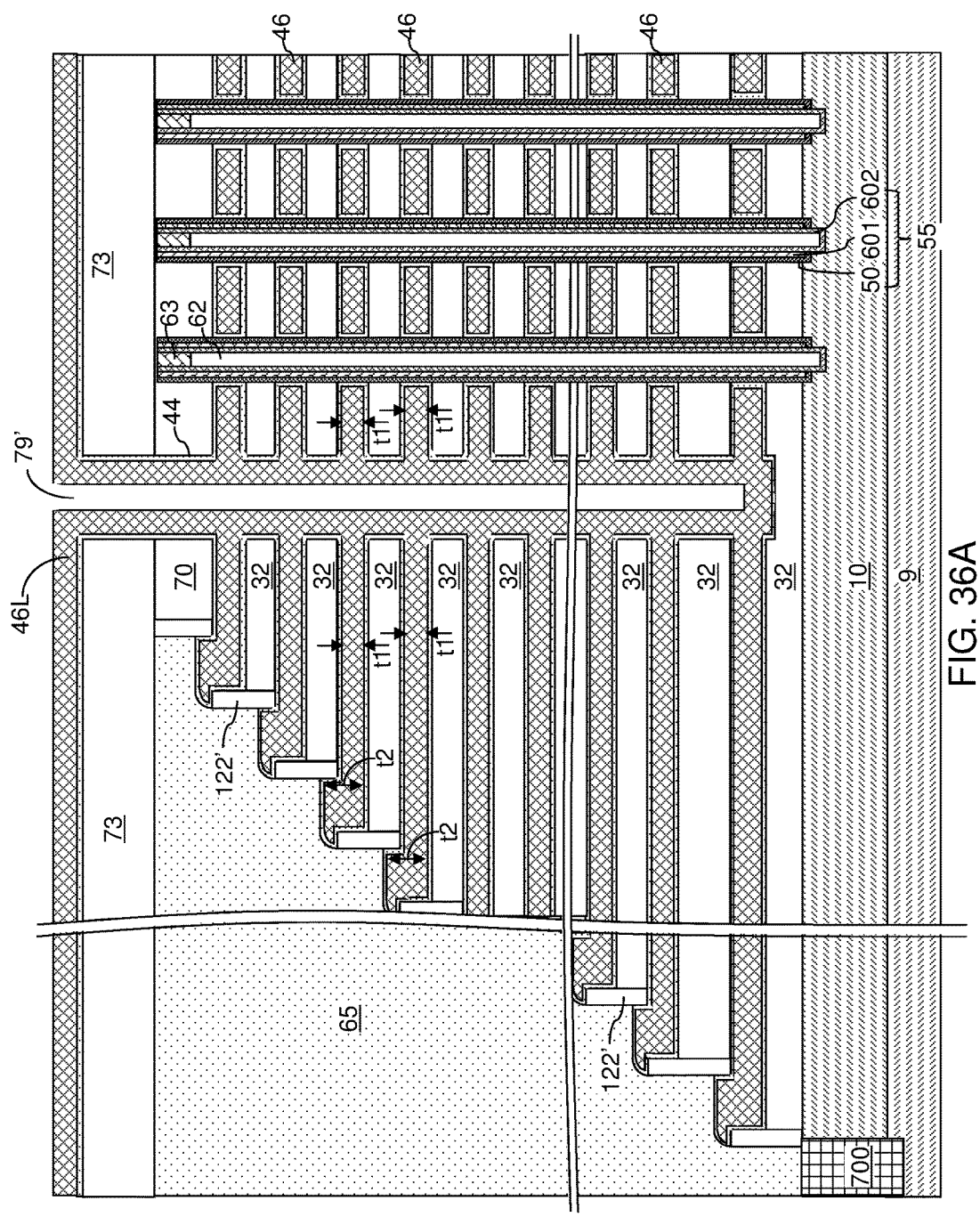
FIG. 36A is a schematic vertical cross-sectional view of the fifth exemplary structure after formation of electrically conductive layers according to the fifth embodiment of the present disclosure.
Figure 36B:
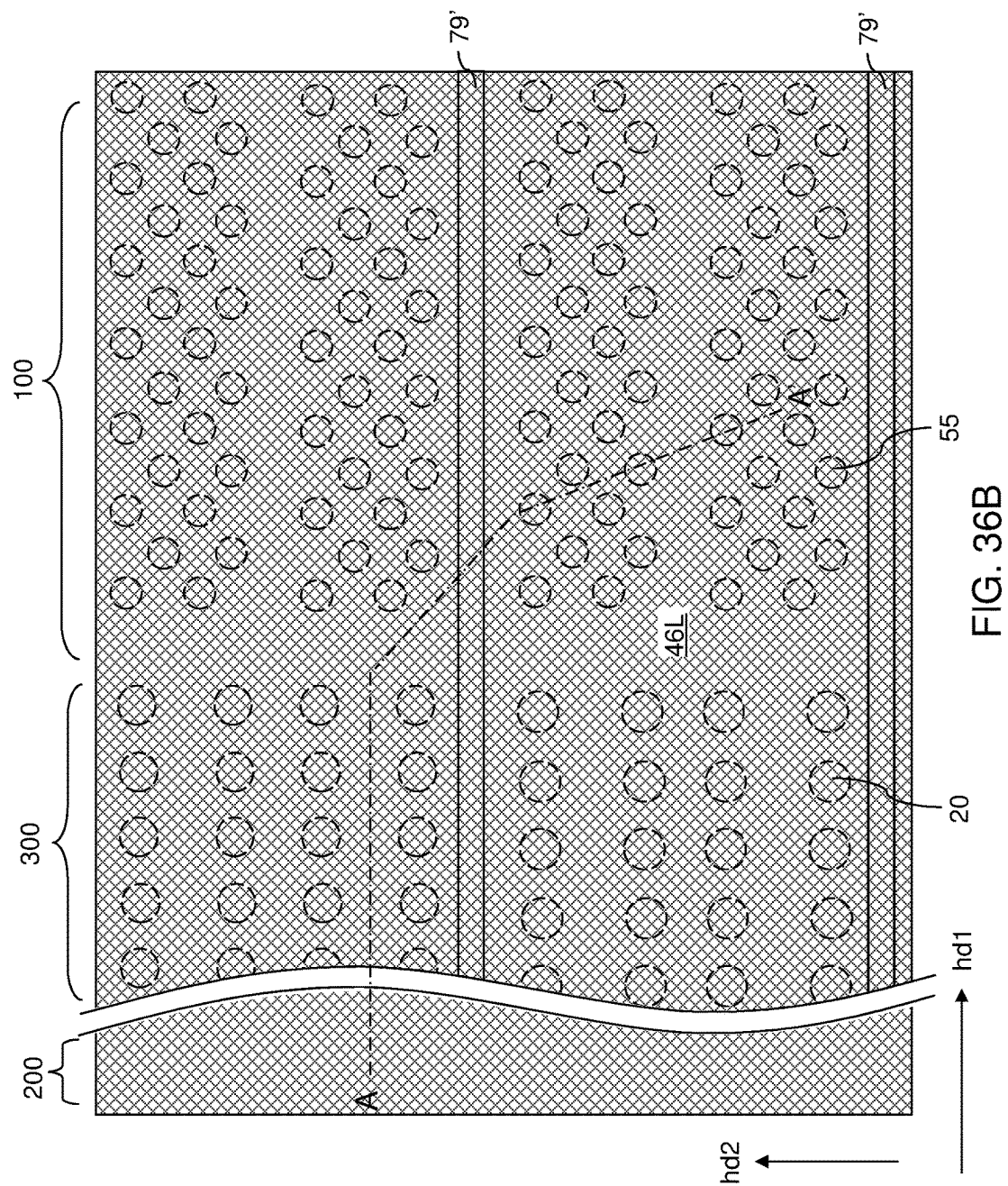
FIG. 36B is a top-down view of the fifth exemplary structure of FIG. 36A. The vertical plane A-A' is the plane of the schematic vertical cross-sectional view of FIG. 36A.

Referring to FIGS. 36A and 36B, the processing steps of FIGS. 13B-13D, 14A, and 14B can be performed to form a backside blocking dielectric layer 44 and the conductive material layers 46. In this case, the conductive material layers 46 can be formed directly on the inner (proximal) sidewalls of the dielectric spacers 122' and directly on bottom surfaces of the retro-stepped dielectric material portion 65.

Figure 37A:
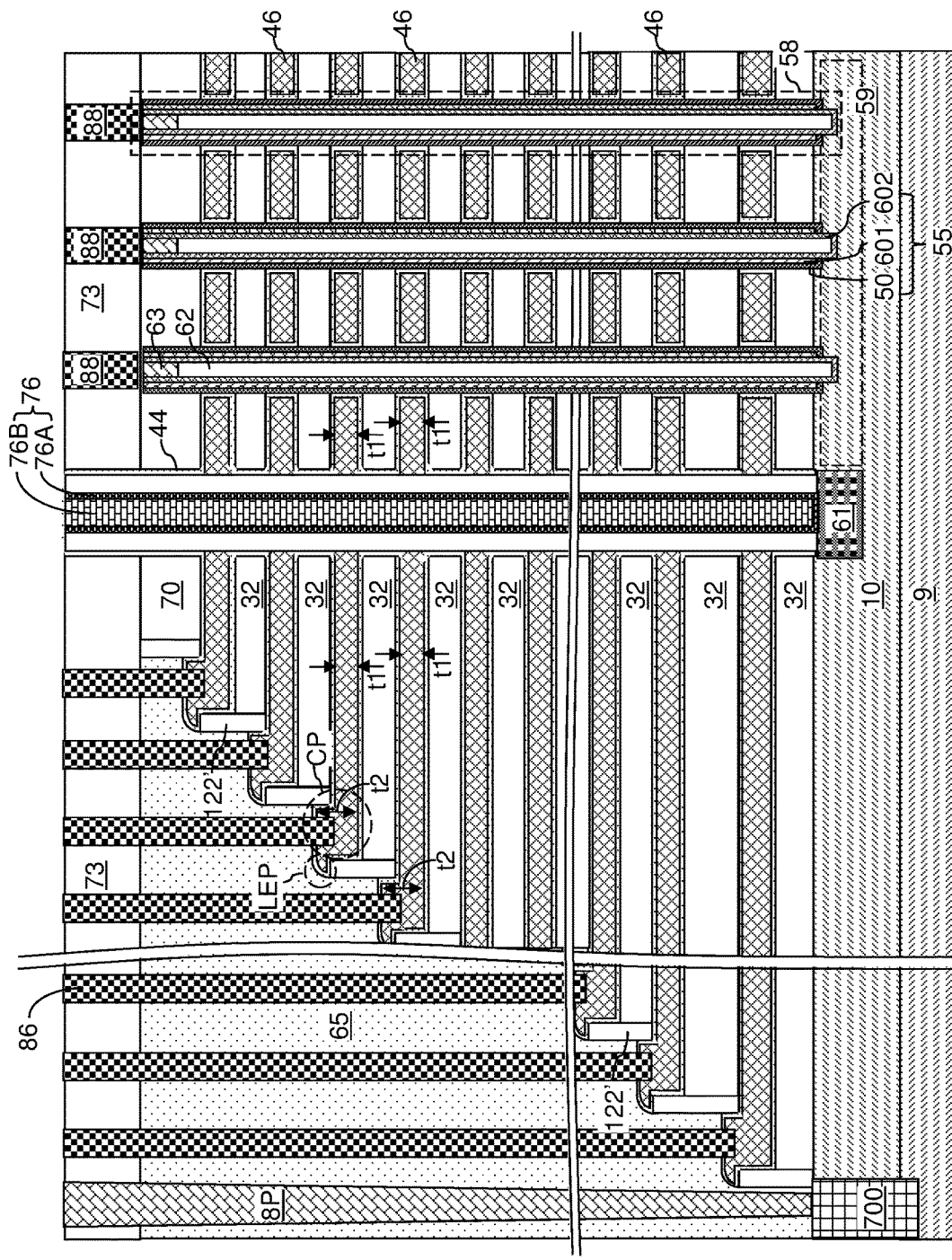
FIG. 37A is a schematic vertical cross-sectional view of the fifth exemplary structure after removal of a deposited conductive material from inside the backside trenches, formation of an insulating spacer and a backside contact structure, and formation of additional contact via structures according to the fifth embodiment of the present disclosure.
Figure 37B:
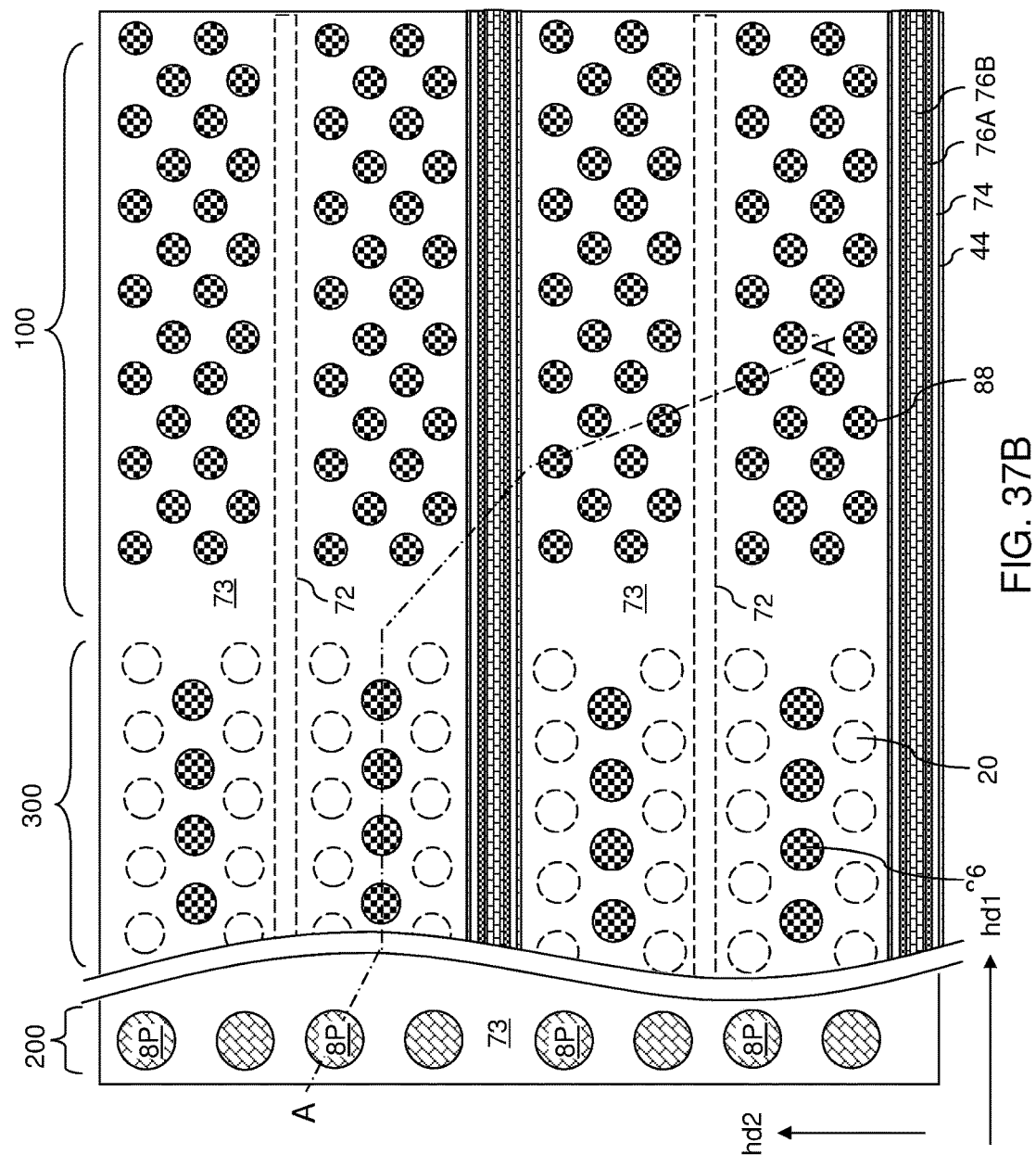
FIG. 37B is a top-down view of the fifth exemplary structure of FIG. 37A. The vertical plane A-A' is the plane of the schematic vertical cross-sectional view of FIG. 37A.

Referring to FIGS. 37A and 37B, the continuous metallic material layer 46L can be removed from inside each backside trench 79 and from above the contact level dielectric material layer 73 by an etch process, which can be an isotropic etch process or an anisotropic etch process. Portions of the bottommost insulating layer 32 underlying the backside trenches 79 can be etched through by an anisotropic etch process. Source regions 61, insulating spacers 74 and backside contact structures 76 can be formed in the backside trenches 79 in the same manner as in the processing steps of FIGS. 15A and 15B. Horizontal semiconductor channels 59 are provided in the upper portions of the semiconductor material layer 10. Each conductive material layer 46 constitutes an electrically conductive layer, which can function as a word line integrated with control gate electrodes for NAND arrays, a source select gate electrode, or a drain select gate electrode.

Word line contact via structures 86 can be formed on electrically conductive layers 46 through the contact level dielectric layer 73, and through the retro-stepped dielectric material portion 65. Each of the electrically conductive layers 46 can have a respective first thickness t1 throughout the memory array region 100 and a respective segment of the contact region 300 and includes a contact portion CP having a respective second thickness t2 that is greater than the respective first thickness t1 within the terrace region. The contact portion CP is a distal end portion of each electrically conductive layer 46 that is distal from the memory array region 100. Each of the electrically conductive layers 46 can also optionally include a laterally extending portion LEP adjoined to the contact portion and having a lesser thickness than the respective first thickness t1 and overlying a respective one of the dielectric spacers 122'.

The increased thickness of the contact portions CP with respect to the segments of the electrically conductive layers 46 located in the memory array region 100 decreases the likelihood that the electrically conductive layers 46 are etched through by the contact via cavities during the isotropic etch that forms the contact via cavities. Thus, the probability of electrically shorting multiple electrically conducive layers by a word line contact via structure 86 that extends through an overlying electrically conductive layer 46, an insulating layer 32, and an underlying electrically conductive layer 46 decreases due to the presence of the contact portions CP having a greater thickness of at least one metallic material. The difference between the second thickness t2 and the first thickness t1 at each level of the electrically conductive layers 46 can be the thickness of each self-aligned semiconductor material portion 252 as formed at the processing steps of FIG. 32.

Each of the first through fifth exemplary structures can include a three-dimensional memory device. The three-dimensional memory device can comprise an alternating stack {32, (46, 146, 246)} of insulating layers 32 and electrically conductive layers {32, (46, 146, 246)} located over a substrate (9, 10). Each of the electrically conductive layers has a respective first thickness t1 in a memory array region 100 and a respective second thickness t2 that is greater than the respective first thickness in a stepped terrace region 300. Memory stack structures 55 are located in the memory array region 100 and vertically extend through the alternating stack {32, (46, 146, 246)}. Each of the memory stack structures 55 comprises a memory film 50 and a vertical semiconductor channel 60. Contact via structures 86 are located in the terrace region 300 and contact a respective one of the electrically conductive layers (46, 146, 246).

In some embodiments, each of the electrically conductive layers (46, 146, 246) includes a contact portion CP located in the terrace region 300. Each of the contact via structures 86 contacts the contact portion CP of a respective one of the electrically conductive layers (46, 146, 246). In some embodiments, each of the electrically conductive layers (46, 146, 246) has the respective first thickness t1 in the terrace region 300 between the contact portion CP and the memory array region 100.

In one embodiment, each of the electrically conductive layers (46, 146, 246) other than the topmost one of the electrically conductive layers has the respective first thickness t1 in a portion of the terrace region 300 having an areal overlap with at least one overlying electrically conductive layer in a plan view. Each of the contact portions CP of the electrically conductive layers other than the topmost one of the electrically conductive layers does not have an areal overlap with any overlying electrically conductive layers in the plan view. As used herein, a "plan view" refers to a view along a direction that is perpendicular to a top surface of a substrate such as the substrate (9, 10) of the various embodiments of the present disclosure.

In the first, second, and fifth embodiments, each of the electrically conductive layers 46 consists essentially of the same one more metallic materials in the contact portion and in the memory array region. In some other embodiments, such as the third and fourth embodiments, each of the electrically conductive layers (46, 146, 246) comprises a first metallic material 46 having the respective first thickness in the contact portion CP and in the memory array region 100, and second metallic material (146, 246) located over the first metallic material 46 in each of the contact portions CP. The second metallic material (146, 246) is absent in the memory array region 100. The first metallic material can comprise tungsten and the second metallic material can comprise ruthenium.

In some embodiments in which the backside blocking dielectric layer 44 is omitted, the three-dimensional memory device comprises a retro-stepped dielectric material portion 65 located in the terrace region and overlying the alternating stack {32, (46, 146, 246)} and including a stepped bottom surface that contacts surfaces of the electrically conductive layers (46, 146, 246).

In some embodiments, such as the first, third, and fifth embodiments, dielectric spacers (122, 122') can be located on sidewalls of a respective one of the insulating layers 32.

The dielectric spacers (122, 122') extend upward to a level of one of the electrically conductive layers (46, 146, 246) that overlies the respective one of the insulating layers 32, and contact the retro-stepped dielectric material portion 65. The insulating layers 32 are laterally spaced from the retro-stepped dielectric material portion 65 by the dielectric spacers (122, 122'). In some embodiments such as the first, third, and fifth embodiments, each of the electrically conductive layers (46, 146) includes a laterally extending portion LEP adjoined to the contact portion and having a lesser thickness than the respective first thickness t1 and overlying a respective one of the dielectric spacers (122, 122').

In some embodiments such as the alternate embodiment of the second exemplary structure and the fourth exemplary structure, each of the electrically conductive layers (46, 146, 246) includes a peripheral portion PP that contacts a sidewall of an underlying one of the insulating layers 32. In some embodiments such as the third and fourth embodiments, each of the electrically conductive layers (46, 146, 246) includes: a first metallic material portion having the respective first thickness t1 (and embodied as a conductive material layer 46); and a second metallic material portion located inside the contact portion CP (and embodied as a self-aligned conducive material portion (146, 246)), wherein a thickness of a horizontal portion of the second metallic material portion is a difference between the respective second thickness t2 and the respective first thickness t1 for each of the electrically conductive layers (46, 146, 246).

In one embodiment, the three-dimensional memory device comprises a monolithic three-dimensional NAND memory device, the contact via structures 88 comprise word line contact via structures, the electrically conductive layers (46, 146, 246) comprise word lines of the three dimensional memory device, and the contact via structures 88 electrically connect each word line to a respective peripheral device 700 of a driver circuit located below the alternating stack.

Figure 38:
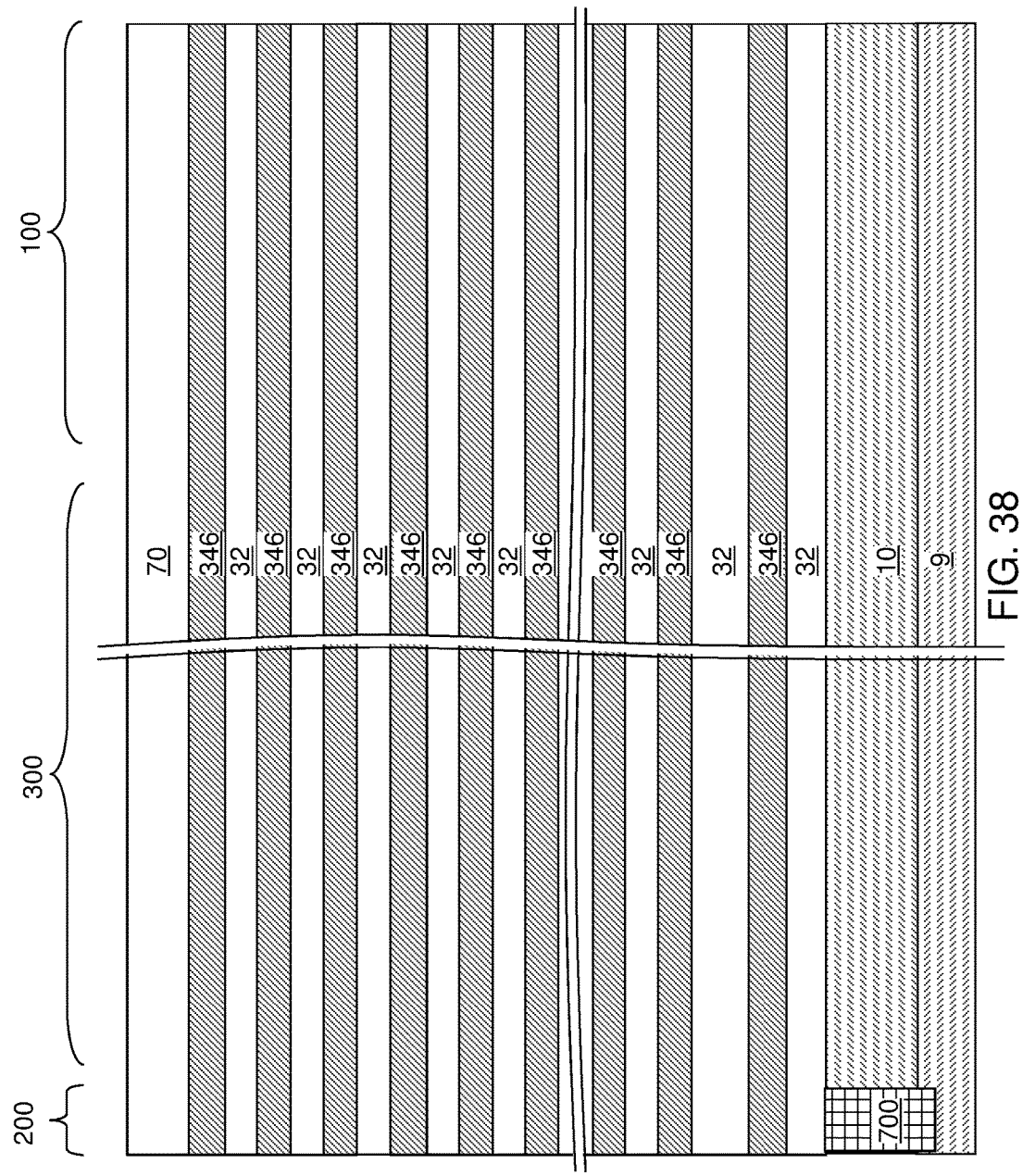
FIG. 38 is a schematic vertical cross-sectional view of a sixth exemplary structure after formation of an alternating stack of insulating layers and semiconductor material layers according to a sixth embodiment of the present disclosure.

In the sixth embodiment, the semiconductor material layers of the original alternating stack are sufficiently doped to function as word lines in the final memory device and are not replaced with electrically conductive layers. Referring to FIG. 38, a sixth exemplary structure according to a sixth embodiment of the present disclosure can be derived from the fifth exemplary structure of FIG. 30 by forming semiconductor material layers 346 including a first doped semiconductor material in lieu of the semiconductor material layers 152. The semiconductor material layers 346 include a heavily doped semiconductor material. As such, the semiconductor material layers 346 may be formed as a crystalline doped semiconductor material having electrical conductivity greater than $1.0 \times 10^5$ S/cm, or as amorphous or nanocrystalline doped semiconductor material including electrical dopants at a high enough atomic concentration to be converted into a crystalline doped semiconductor material having electrical conductivity greater than $1.0 \times 10^5$ S/cm upon a suitable anneal at an elevated temperature. The first doped semiconductor material can include p-doped semiconductor material or an n-doped semiconductor material, and may be polycrystalline silicon (e.g., heavily doped polysilicon) or amorphous silicon. An insulating cap layer 70 can be subsequently formed over the alternating stack of insulating layers 32 and semiconductor material layers 346.

The semiconductor material layers 346 can be formed by plasma enhanced chemical vapor deposition. The thicknesses of the insulating layers 32 and the semiconductor material layers 346 can be in a range from 20 nm to 50 nm, although lesser and greater thicknesses can be employed for each insulating layer 32 and for each conductive material layer 346. The number of repetitions of the pairs of an insulating layer 32 and a semiconductor material layer 346 can be in a range from 2 to 1,024, and typically from 8 to 256, although a greater number of repetitions can also be employed. In one embodiment, each semiconductor material layer 346 in the alternating stack (32, 346) can have a uniform thickness that is substantially invariant within each respective semiconductor material layer 346.

Figure 39:
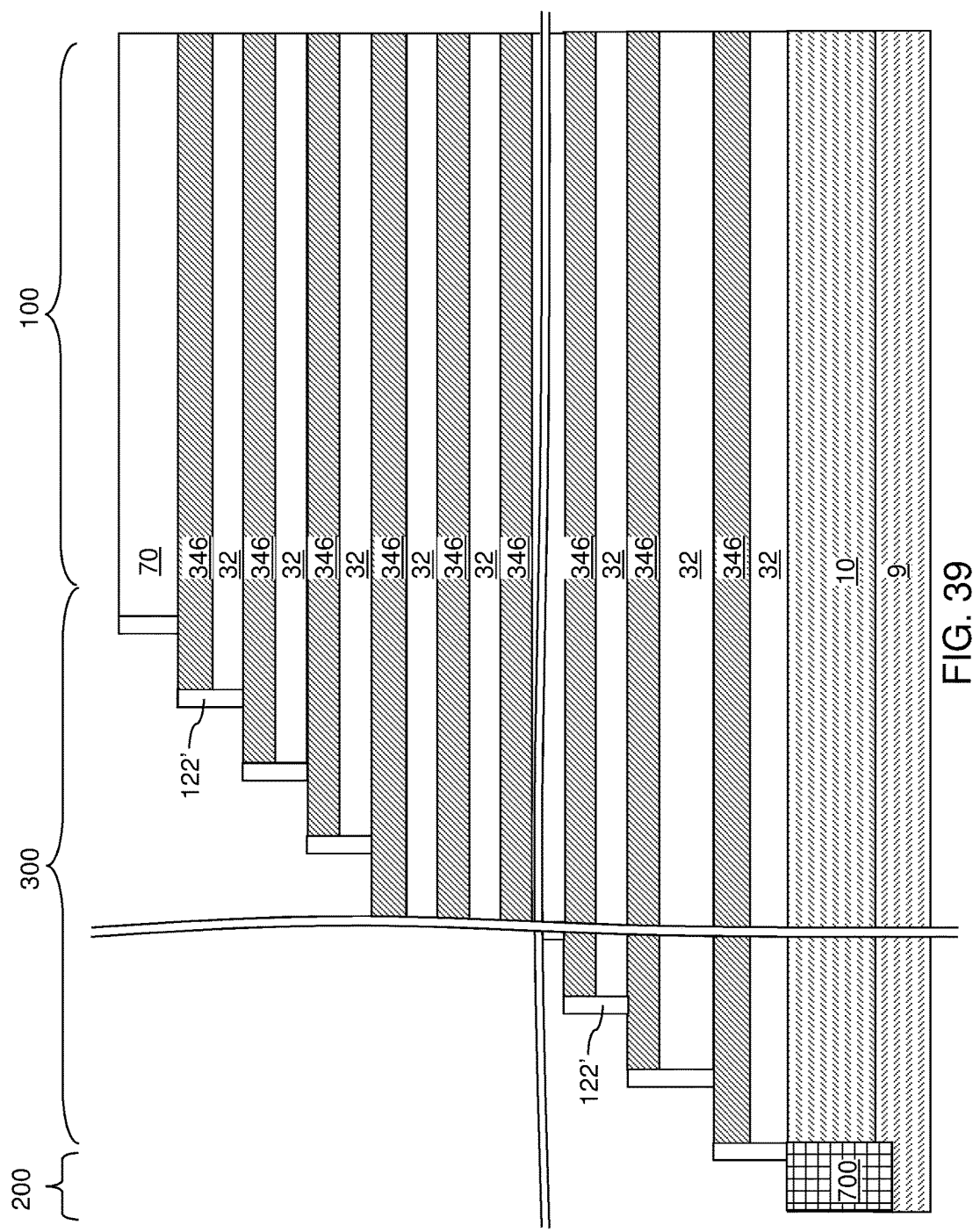
FIG. 39 is a schematic vertical cross-sectional view of the sixth exemplary structure after formation of dielectric spacers according to the sixth embodiment of the present disclosure.

Referring to FIG. 39, a stepped cavity can be formed within the contact region 300 which is located between the memory array region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. After formation of the stepped cavity, a peripheral portion of the alternating stack (32, 346) can have stepped surfaces after formation of the stepped cavity.

A terrace region is formed within the contact region 300 by formation of the stepped cavity. Each semiconductor material layer 346 other than a topmost semiconductor material layer 346 within the alternating stack (32, 346) laterally extends farther than any overlying semiconductor material layer 346 within the alternating stack (32, 346). The terrace region includes stepped surfaces of the alternating stack (32, 346) that continuously extend from a bottommost layer within the alternating stack (32, 346) to a topmost layer within the alternating stack (32, 346). The semiconductor material layers 346 have a respective lateral extent that decreases as a function of a vertical distance from the substrate (9, 10) in the terrace region.

A conformal dielectric layer is formed on the stepped surfaces of the alternating stack (32, 346) in the terrace region, over the insulating cap layer 70, and over physically exposed surfaces in the peripheral device region 200. The conformal dielectric layer includes a dielectric material that is different from the material of the semiconductor material layers 346. In the sixth embodiment, the conformal dielectric layer can include any dielectric material such as silicon oxide, silicon nitride, or a dielectric metal oxide. The conformal dielectric layer can be deposited by a conformal deposition process such as chemical vapor deposition or atomic layer deposition. The thickness of the conformal dielectric layer can have a thickness in a range from 3 nm to 30 nm, such as from 5 nm to 10 nm, although lesser and greater thicknesses can also be employed.

An anisotropic etch process can be performed to remove horizontal portions of the conformal dielectric layer. Horizontal surfaces of the semiconductor material layers 346 can be employed as stopping surfaces for the anisotropic etch process. Each remaining vertical portion of the conformal dielectric layer constitutes a dielectric spacer 122'. The dielectric spacers 122' are formed on sidewalls of vertically neighboring pairs of an insulating layer 32 and an overlying semiconductor material layer 346. As such, each dielectric spacer 122' contacts vertically coincident sidewalls of a neighboring pair of an underlying insulating layer 32 and an overlying semiconductor material layer 346. In one embodiment, more than 90% of the area of each sidewall of the semiconductor material layers in the terrace region may be contacted by a respective one of the dielectric spacers 122'. 100% of the area of each sidewall of the insulating layers 32 in the terrace region can be contacted by a respective one of the dielectric spacers 122'.

Figure 40:
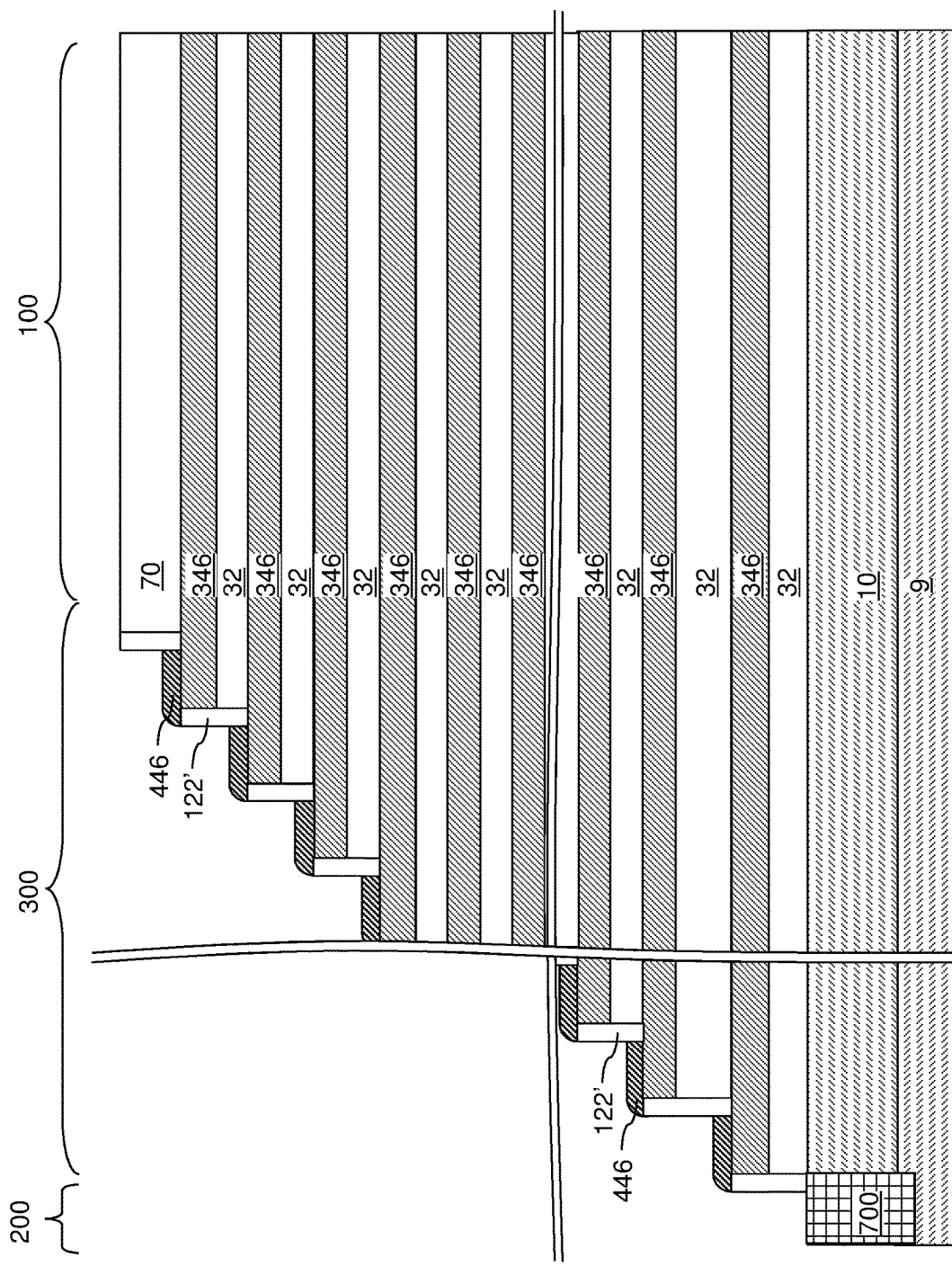
FIG. 40 is a schematic vertical cross-sectional view of the sixth exemplary structure after formation of self-aligned semiconductor material portions according to the sixth embodiment of the present disclosure.

Referring to FIG. 40, self-aligned semiconductor material portions 446 are formed on physically exposed surfaces of the semiconductor material layers 346 in the terrace region employing a selective deposition process. The semiconductor material grows from the physically exposed surfaces of the semiconductor material layers 346 and does not grow from surfaces of the insulating layers 32. Each self-aligned semiconductor material portion 446 is a self-aligned material portion comprising, and/or consisting essentially of, a second doped semiconductor material that has a doping of the same conductivity type as the first doped semiconductor material. The second doped semiconductor material can be heavily doped. The semiconductor material of the self-aligned semiconductor material portions 446 may, or may not, have the same composition as the semiconductor material layers 346. Further, the crystalline structure of the semiconductor material of the self-aligned semiconductor material portions 446 may be the same as, or may be different from, the crystalline structure of the semiconductor material layers 346.

In one embodiment, the semiconductor material layers 346 can comprise heavily doped amorphous silicon or heavily doped polysilicon, the dielectric spacers 122' can comprise silicon oxide, silicon nitride, or a dielectric metal oxide, and the selective deposition process grows polysilicon or amorphous silicon from the surfaces of the semiconductor material layers 346 without growing any semiconductor material portion from the surfaces of the dielectric spacers 122'. In this case, the selective deposition process can be a chemical vapor deposition process or an atomic layer deposition process in which a reactant including a semiconductor precursor for depositing a semiconductor material and an etchant for etching the semiconductor material are alternately or concurrently flowed into a process chamber. Exemplary semiconductor precursors include, but are not limited to, silane, dichlorosilane, trichlorosilane, silicon tetrachloride, disilane, and digermane. An exemplary etchant is hydrogen chloride. The process temperature may be in a range from 700 degrees Celsius to 1,050 degrees Celsius, although lower and higher temperatures may also be employed.

The semiconductor material grows only from physically exposed semiconductor surfaces (such as the physically exposed surfaces of the semiconductor material layers 346) and does not grow from the dielectric surfaces (such as the surfaces of the dielectric spacers 122'). The doping of the self-aligned semiconductor material portions 446 can be provided by in-situ doping or ex-situ doping. In the case of in-situ doping, a dopant gas can be flowed into the process chamber concurrently with the flow of the semiconductor precursor. In the case of the ex-situ doping, dopants can be implanted into the self-aligned semiconductor material portions 446 by ion implantation or plasma doping.

The self-aligned semiconductor material portions 446 can be formed on top surfaces of the dielectric spacers 122' as the deposited semiconductor material laterally grows over the top surface of the dielectric spacers 122'. In one embodiment, each of the self-aligned semiconductor material portions 446 is optionally formed directly on a top surface of a respective first one of the dielectric spacers 122' (i.e., an underlying dielectric spacer 122') and a sidewall of a respective second one of the dielectric spacers 122' (i.e., a dielectric spacer 122' that contacts the underlying semiconductor material layer 346). The thickness of the self-aligned semiconductor material portions 446 may be in a range from 1 nm to 40 nm, such as from 2 nm to 30 nm and/or from 5 nm to 10 nm, although lesser and greater thicknesses can also be employed.

Figure 41:
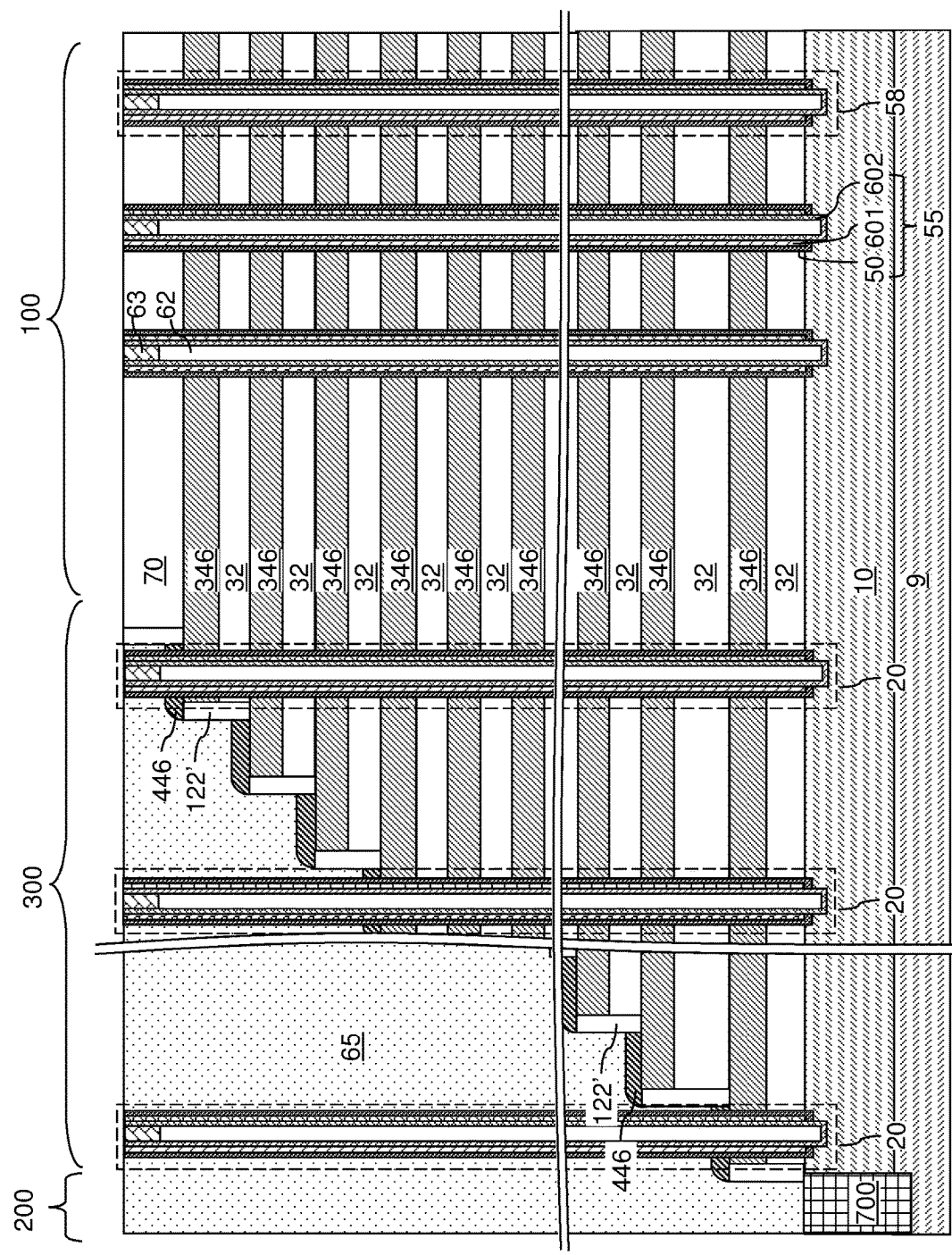
FIG. 41 is a schematic vertical cross-sectional view of the sixth exemplary structure after formation of memory stack structures and support pillar structures according to the sixth embodiment of the present disclosure.

Referring to FIG. 41, the processing steps of FIGS. 7, 8A, 8B, and 9A-9H can be performed to form a retro-stepped dielectric material portion 65, an array of memory opening fill structures 58, and support pillar structures 20. The retro-stepped dielectric material portion 65 can contact sidewalls of the dielectric spacers 122' and top surfaces of the self-aligned semiconductor material portions 446.

In one embodiment, the optional pedestal channel portions 11 may be omitted during formation of the memory opening fill structures 58 and the support pillar structures 20. In one embodiment, at least one of the support pillar structures 20 can vertically extend through only one of the self-aligned semiconductor material portions 446. Alternatively or additionally, at least one of the support pillar structures 20 can vertically extend through a respective pair of the self-aligned semiconductor material portions 446.

Figure 42A:
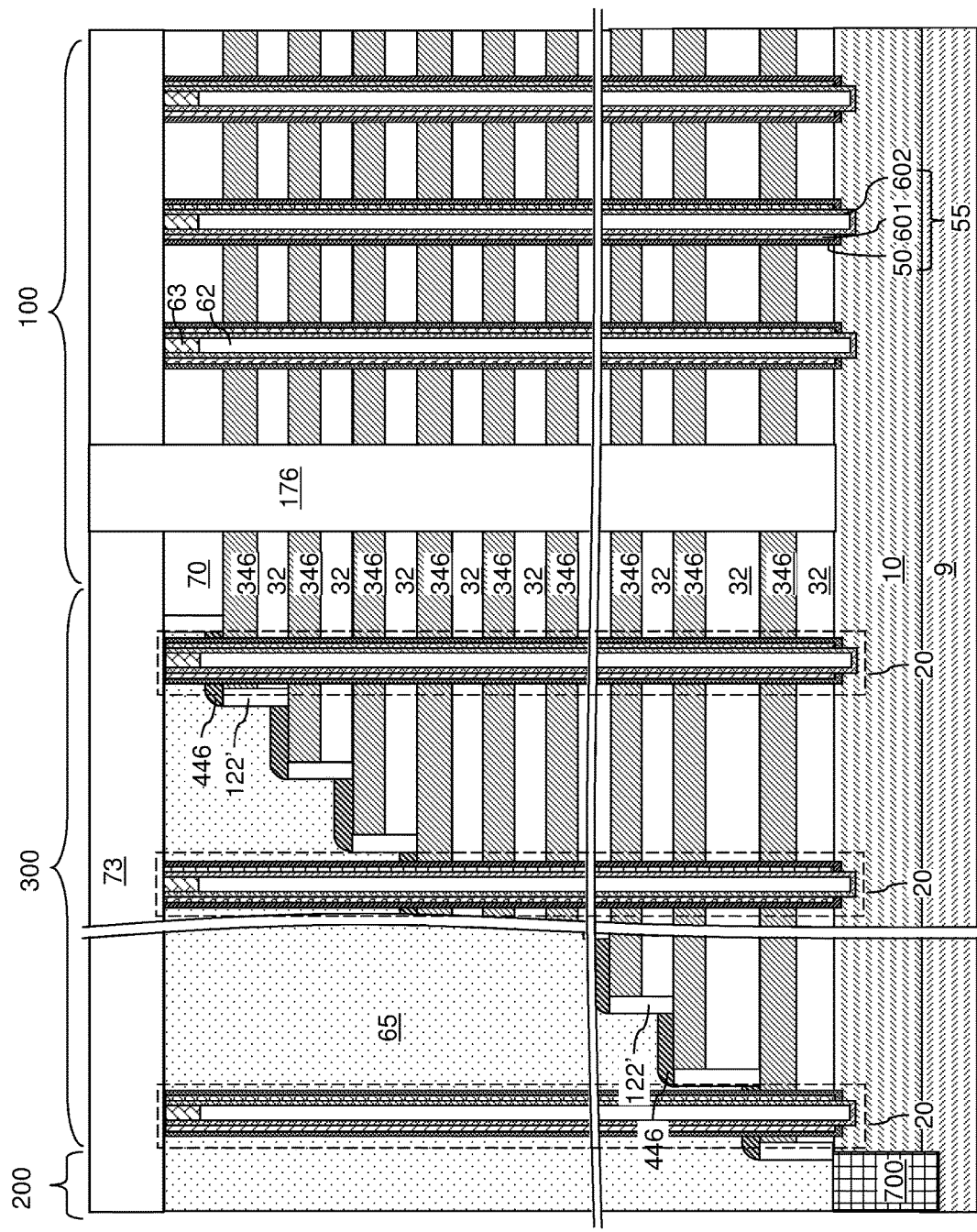
FIG. 42A is a schematic vertical cross-sectional view of the sixth exemplary structure after formation of backside trenches and dielectric wall structures according to the sixth embodiment of the present disclosure.
Figure 42C:
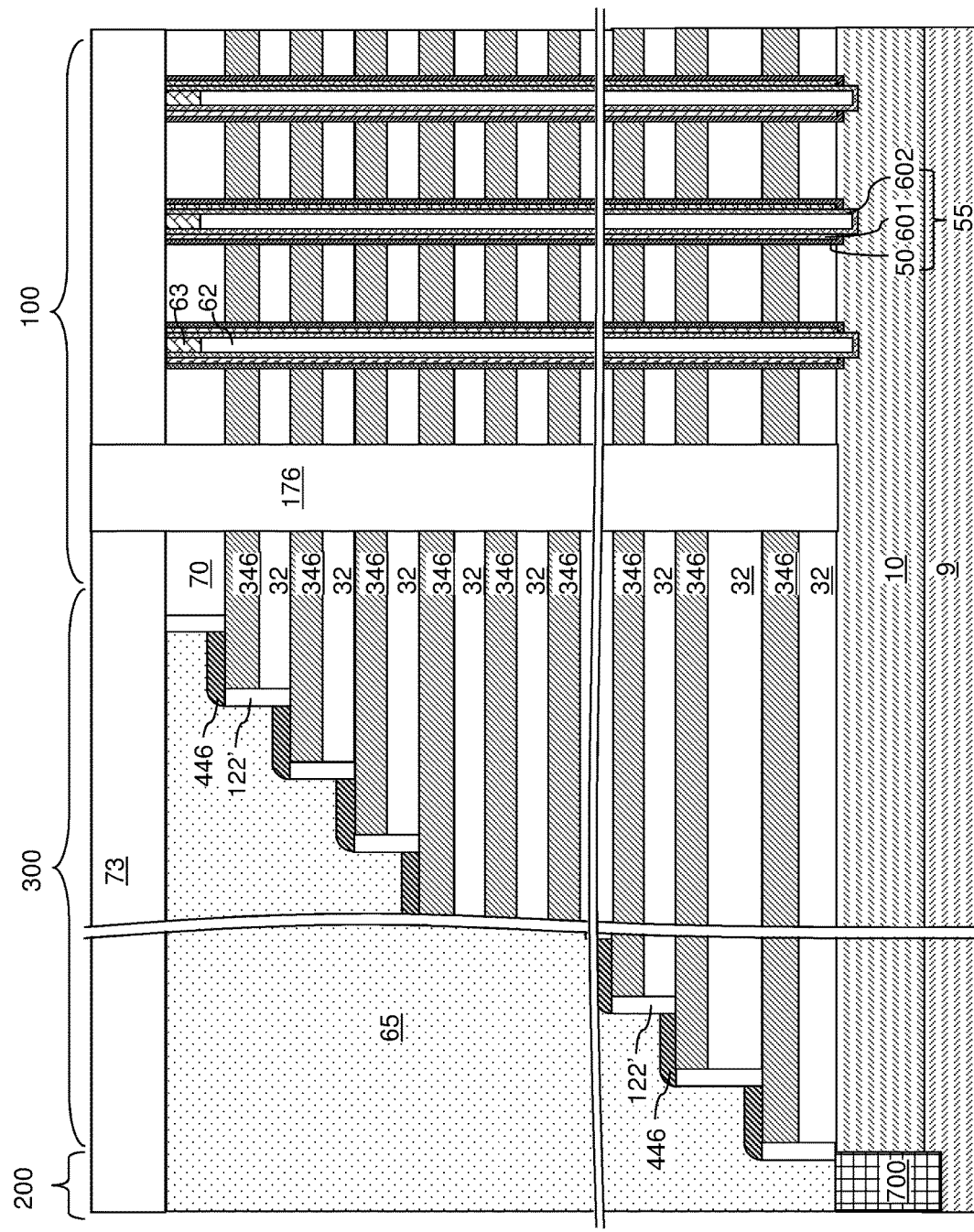
FIG. 42C is a schematic vertical cross-sectional view of the sixth exemplary structure along the vertical plane C-C' of FIG. 42B.

Referring to FIGS. 42A-42C, backside trenches 79 that extend through the alternating stack (32, 346) can be formed through the alternating stack (32, 346) by an anisotropic etch process. The pattern of the backside trenches 79 in a plan view can be the same as in the first through fifth embodiment.

Figure 43A:
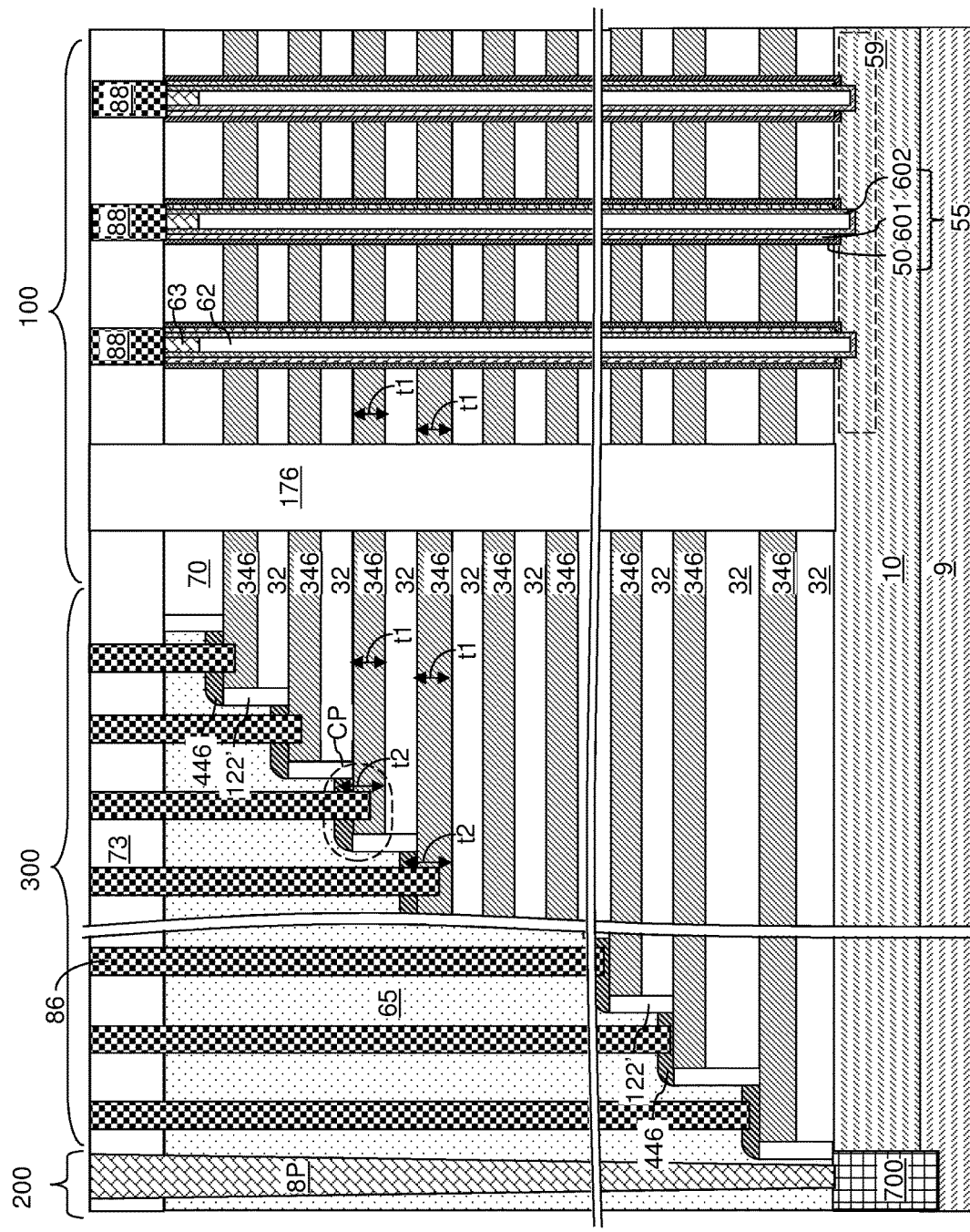
FIG. 43A is a schematic vertical cross-sectional view of the sixth exemplary structure after removal of a deposited conductive material from inside the backside trenches, formation of an insulating spacer and a backside contact structure, and formation of additional contact via structures according to the sixth embodiment of the present disclosure.
Figure 43B:
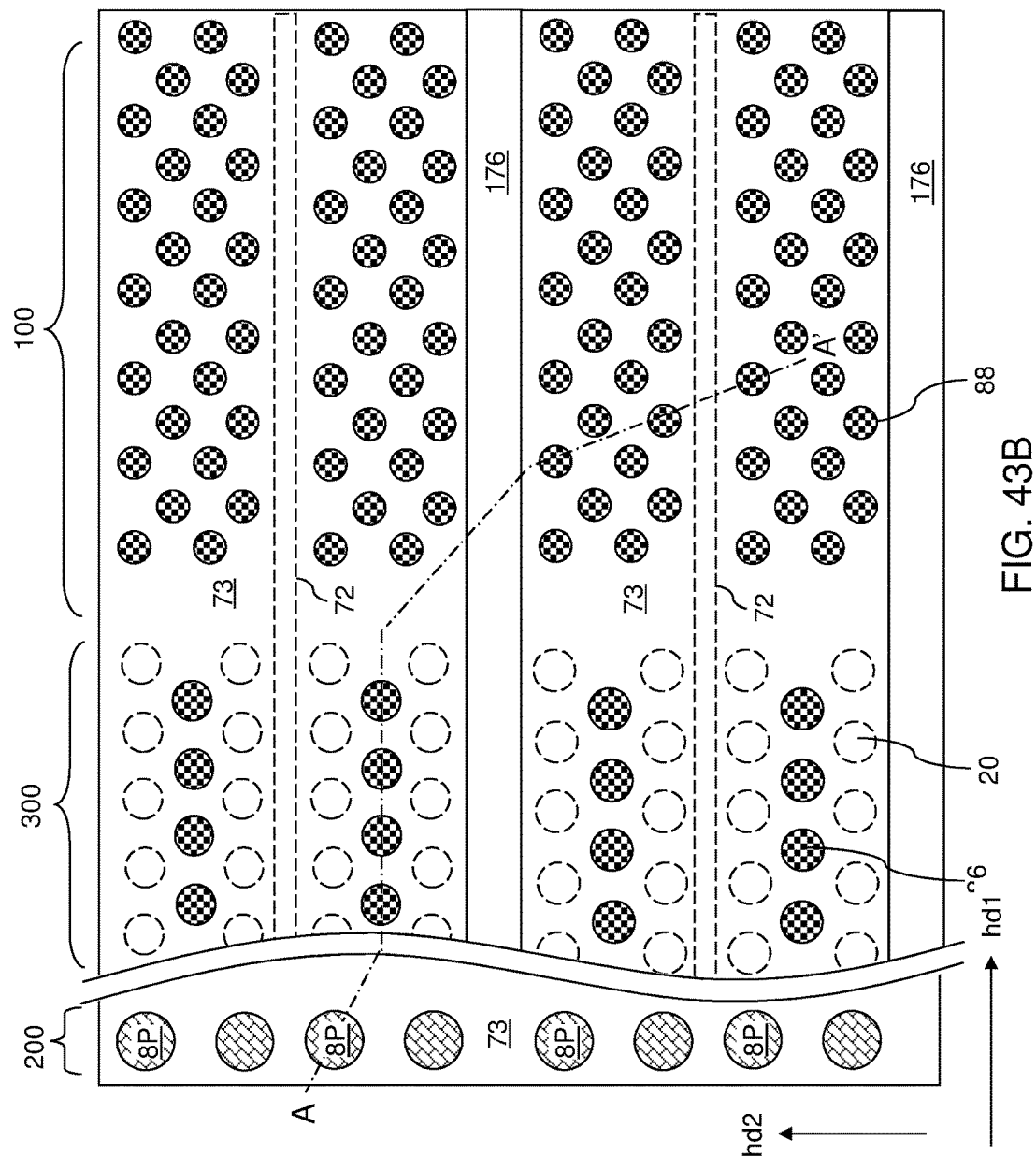
FIG. 43B is a top-down view of the sixth exemplary structure of FIG. 43A. The vertical plane A-A' is the plane of the schematic vertical cross-sectional view of FIG. 43A.

Referring to FIGS. 43A and 43B, a dielectric material is deposited in the backside trenches 79 to form dielectric wall structures 176. The dielectric wall structures 176 are dielectric material portions that vertical extend through each layer in the alternating stack (32, 346) and laterally extend along the first lengthwise direction hd1 to divide the alternating stack (32, 346) into alternating stacks including strips of the insulating layers 32 and strips of the semiconductor material layers 346. A source region (not shown) can be formed in a surface portion of the semiconductor material layer 10 outside the memory array region 100 by formation of a via cavity extending through the retro-stepped dielectric material portion and implantation of dopants. Horizontal semiconductor channels 59 are provided in the upper portions of the semiconductor material layer 10 between the source regions and the memory stack structures 55. The via cavity can be filled with an insulated conductive material to form source contact via structures (not shown).

In an alternative embodiment, source regions 61, insulating spacers 74, and backside contact structures 76 can be formed in the backside trenches 79 as in the first through fifth embodiments.

Each combination of a semiconductor material layer 346 and a self-aligned semiconductor material portion 446 adjoined thereto constitutes an electrically conductive layer (346, 446), which can function as a word line integrated with control gate electrodes for NAND arrays, a source select gate electrode, or a drain select gate electrode.

Word line contact via structures 86 can be formed on electrically conductive layers (346, 446) through the contact level dielectric layer 73, and through the retro-stepped dielectric material portion 65. Each of the electrically conductive layers (346, 446) can have a respective first thickness t1 throughout the memory array region 100 and a respective segment of the contact region 300 and includes a contact portion CP having a respective second thickness t2 that is greater than the respective first thickness t1 within the terrace region. The contact portion CP is a distal end portion of each electrically conductive layer (346, 446) that is distal from the memory array region 100. In one embodiment, the word line contact via structures 86 formed directly on the self-aligned semiconductor material portions 446.

The increased thickness of the contact portions CP with respect to the segments of the electrically conductive layers (346, 446) located in the memory array region 100 decreases the likelihood that the electrically conductive layers (346, 446) are etched through by the contact via cavities during the isotropic etch that forms the contact via cavities. Thus, the probability of electrically shorting multiple electrically conducive layers by a word line contact via structure 86 that extends through an overlying electrically conductive layer (346, 446), an insulating layer 32, and an underlying electrically conductive layer (346, 446) decreases due to the presence of the contact portions CP having a greater thickness of at least one metallic material. The difference between the second thickness t2 and the first thickness t1 at each level of the electrically conductive layers (346, 446) can be the thickness of each self-aligned semiconductor material portion 446 as formed at the processing steps of FIG. 40.

The sixth exemplary structure can include a three-dimensional memory device. The three-dimensional memory device can comprise: an alternating stack {32, (346, 446)} of insulating layers 32 and electrically conductive layers (346, 446) comprising a doped semiconductor material located over a substrate (9, 10), wherein the alternating stack {32, (346, 446)} includes a memory array region 100 in which each of the electrically conductive layers (346, 446) is present and a terrace region in which the electrically conductive layers (346, 446) have a respective lateral extent that decreases as a function of a vertical distance from the substrate (9, 10); memory stack structures 55 located in the memory array region 100 and vertically extending through the alternating stack {32, (346, 446)}, wherein each of the memory stack structures 55 comprises a memory film 50 and a vertical semiconductor channel 60 located inside the memory film 50; and contact via structures 86 located in the terrace region and contacting a respective one of the electrically conductive layers (346, 446), wherein each of the electrically conductive layers (346, 446) has a respective first thickness t1 throughout the memory array region 100 and includes a contact portion CP having a respective second thickness t2 that is greater than the respective first thickness t1 within the terrace region.

In one embodiment, each of the contact via structures 86 contacts the contact portion CP of a respective one of the electrically conductive layers (346, 446). In one embodiment, each of the electrically conductive layers (346, 446) other than a topmost one of the electrically conductive layers (346, 446) has the respective first thickness t1 throughout the memory array region 100 and within a respective portion of the terrace region having an areal overlap with any overlying one of the electrically conductive layers (346, 446) in a plan view. In one embodiment, for each of the electrically conductive layers (346, 446) other than a topmost one of the electrically conductive layers (346, 446), the portion having the respective second thickness t2 does not have an areal overlap with any overlying one of the electrically conductive layers (346, 446) in the plan view.

In one embodiment, each of the electrically conductive layers (346, 446) comprises: a first doped polycrystalline semiconductor material portion (i.e., a semiconductor material layer 346) having a respective first thickness t1 throughout; and a second doped polycrystalline semiconductor material portion (i.e., a self-aligned semiconductor material portion 446) contacting a top surface of the first doped polycrystalline semiconductor material portion 336 and a respective one of the contact via structures 86. In one embodiment, the first doped polycrystalline semiconductor material portion 336 and the second doped polycrystalline semiconductor material portion 446 differ in composition. In one embodiment, the second doped polycrystalline semiconductor material portion 446 has a thickness that is a difference between the respective second thickness t2 and the respective first thickness t1.

In one embodiment, the three-dimensional memory device further comprises a retro-stepped dielectric material portion 65 located in the terrace region and overlying the alternating stack {32, (346, 446)} and including a stepped bottom surface that contacts surfaces of the electrically conductive layers (346, 446). In one embodiment, the three-dimensional memory device comprises dielectric spacers 122' located on sidewalls of a respective one of the insulating layers 32, and on a sidewall of one of the electrically conductive layers (346, 446) that overlies the respective one of the insulating layers 32, and contacting the retro-stepped dielectric material portion 65, wherein the insulating layers 32 are laterally spaced from the retro-stepped dielectric material portion 65 by the dielectric spacers 122'. In one embodiment, each of the electrically conductive layers (346, 446) contacts a top surface of a respective first one of the dielectric spacers 122' and contacts a sidewall of a respective second one of the dielectric spacers 122'.

Each of the exemplary structures of the present disclosure can include a three-dimensional memory device. In one embodiment, the three-dimensional memory device comprises a monolithic three-dimensional NAND memory device. The conductive material layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of a conductive material layer {46, (46, 146), (46, 246), or (346, 446)} in a first device level of the array of monolithic three-dimensional NAND strings can be located over another memory cell (as embodied as another portion of the charge storage layer 54 at a level of another conductive material layer {46, (46, 146), (46, 246), or (346, 446)}) in a second device level of the array of monolithic three-dimensional NAND strings. The silicon substrate can contain an integrated circuit comprising a driver circuit (as embodied as a subset of the least one semiconductor device 700) for the memory device located thereon. The conductive material layers {46, (46, 146), (46, 246), or (346, 446)} can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate, wherein each of the electrically conductive layers has a respective first thickness in a memory array region and a respective second thickness that is greater than the respective first thickness in a stepped terrace region;
   memory stack structures located in the memory array region and vertically extending through the alternating stack, wherein each of the memory stack structures comprises a memory film and a vertical semiconductor channel; and
   contact via structures located in the terrace region and contacting a respective one of the electrically conductive layers.

2. The three-dimensional memory device of claim 1, wherein:
   each of the electrically conductive layers includes a contact portion located in the terrace region; and
   each of the contact via structures contacts the contact portion of a respective one of the electrically conductive layers.

3. The three-dimensional memory device of claim 2, wherein:
   each of the electrically conductive layers has the respective first thickness in the terrace region between the contact portion and the memory array region; and
   each of the electrically conductive layers has the respective second thickness in the contact portion.

4. The three-dimensional memory device of claim 3, wherein:
   each of the electrically conductive layers other than the topmost one of the electrically conductive layers has the respective first thickness in a portion of the terrace region having an areal overlap with at least one overlying electrically conductive layer in a plan view; and
   each of the contact portions of the electrically conductive layers other than the topmost one of the electrically conductive layers does not have an areal overlap with any overlying electrically conductive layers in the plan view.

5. The three-dimensional memory device of claim 2, wherein each of the electrically conductive layers consists essentially of the same one or more metallic materials in the contact portion and in the memory array region.

6. The three-dimensional memory device of claim 2, wherein each of the electrically conductive layers comprises a first metallic material having the respective first thickness in the contact portion and in the memory array region.

7. The three-dimensional memory device of claim 6, wherein each of the electrically conductive layers further comprises a second metallic material located over the first metallic material in each of the contact portions, and wherein the second metallic material is absent in the memory array region.

8. The three-dimensional memory device of claim 7, wherein the first metallic material comprises tungsten and the second metallic material comprises ruthenium.

9. The three-dimensional memory device of claim 1, further comprising:
   a retro-stepped dielectric material portion located in the terrace region and overlying the alternating stack and including a stepped bottom surface that contacts surfaces of the electrically conductive layers; and
   dielectric spacers located on sidewalls of a respective one of the insulating layers, extending upward to a level of one of the electrically conductive layers that overlies the respective one of the insulating layers, and contacting the retro-stepped dielectric material portion, wherein the insulating layers are laterally spaced from the retro-stepped dielectric material portion by the dielectric spacers.

10. The three-dimensional memory device of claim 9, wherein each of the electrically conductive layers includes a laterally extending portion adjoined to the contact portion and having a lesser thickness than the respective first thickness and overlying a respective one of the dielectric spacers.

11. The three-dimensional memory device of claim 1, wherein each of the electrically conductive layers includes a peripheral portion that contacts a sidewall of an underlying one of the insulating layers.

12. The three-dimensional memory device of claim 1, wherein each of the electrically conductive layers comprises:
   a first metallic material portion having the respective first thickness; and
   a second metallic material portion located inside the contact portion, wherein a difference between the respective second thickness and the respective first thickness for each of the electrically conductive layers equals to a thickness of a horizontal portion of the second metallic material portion.

13. The three-dimensional memory device of claim 1, wherein:
   the three-dimensional memory device comprises a monolithic three-dimensional NAND memory device;
   the contact via structures comprise word line contact via structures;
   the electrically conductive layers comprise word lines of the three dimensional memory device; and
   the contact via structures electrically connect each word line to a respective peripheral device of a driver circuit located below the alternating stack.

14. A method of forming a three-dimensional memory device, comprising:
   forming an alternating stack of insulating layers and sacrificial material layers over a substrate, wherein the alternating stack includes a memory array region in which each of the sacrificial material layers is present and a terrace region in which the sacrificial material layers have a respective lateral extent that decreases as a function of a vertical distance from the substrate;

forming self-aligned material portions on physically exposed surfaces of the sacrificial material layers in the terrace region employing a selective deposition process in which a material selectively grows from the physically exposed surfaces of the sacrificial material layers;

forming memory stack structures through the alternating stack in the memory array region, wherein each of the memory stack structures comprises a memory film and a vertical semiconductor channel;

replacing at least the sacrificial material layers with conductive material layers; and forming contact via structures that contact a respective one of the conductive material layers.

15. The method of claim 14, wherein:
the self-aligned material portions comprise sacrificial material portions; and
the method further comprises replacing the sacrificial material portions with portions of the conductive material layers.

16. The method of claim 15, wherein:
the sacrificial material layers comprise silicon nitride;
the insulating layers comprise silicon oxide; and
the selective deposition process deposits self-aligned silicon nitride portions from silicon nitride surfaces of the sacrificial material layers without growing silicon nitride from silicon oxide surfaces of the insulating layers employing an incubation time difference for silicon nitride between the silicon nitride surfaces and the silicon oxide surfaces.

17. The method of claim 14, wherein:
the self-aligned material portions comprise metallic material portions; and
the conductive material layers are formed on surfaces of the metallic material portions.

18. The method of claim 17, wherein the metallic material portions comprise ruthenium.

19. The method of claim 14, further comprising:
forming dielectric spacers on sidewalls of vertically neighboring pairs of an insulating layer and an overlying sacrificial material layer in the terrace region prior to forming the self-aligned material portions; and
forming a retro-stepped dielectric material portion over the alternating stack and the dielectric spacers in the terrace region after forming the self-aligned material portions.

20. The method of claim 19, wherein:
the self-aligned material portions are selectively deposited on exposed portions of top surfaces of the sacrificial material layers in the terrace region and are not deposited on sidewalls of the dielectric spacers;
the retro-stepped dielectric material portion is formed on sidewalls of the dielectric spacers; and
each of the insulating layers and the sacrificial material layers is laterally spaced from the retro-stepped dielectric material portion by a respective one of the dielectric spacers.

21. The method of claim 14, wherein the self-aligned material portions grow from a top surface and a sidewall surface of each of the sacrificial material portions.

* * * * *